US011163101B2

(12) United States Patent  
Robinson et al.

(10) Patent No.: US 11,163,101 B2  
(45) Date of Patent: Nov. 2, 2021

(54) SWITCHABLE ILLUMINATION APPARATUS AND PRIVACY DISPLAY

(71) Applicant: RealD Spark, LLC, Beverly Hills, CA (US)

(72) Inventors: Michael G. Robinson, Boulder, CO (US); Graham J. Woodgate, Henley-on-Thames (GB); Jonathan Harrold, Upper Heyford (GB)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 17/018,717

(22) Filed: Sep. 11, 2020

(65) Prior Publication Data

US 2021/0072451 A1    Mar. 11, 2021

Related U.S. Application Data

(60) Provisional application No. 62/898,721, filed on Sep. 11, 2019, provisional application No. 63/006,341, filed on Apr. 7, 2020.

(51) Int. Cl.
*F21V 8/00*    (2006.01)  
*H01L 27/15*   (2006.01)  
*H01L 33/50*   (2010.01)

(52) U.S. Cl.  
CPC ......... *G02B 6/0036* (2013.01); *G02B 6/0045* (2013.01); *G02B 6/0055* (2013.01); *G02B 6/0068* (2013.01); *G02B 6/0073* (2013.01); *G02B 6/0078* (2013.01);

(Continued)

(58) Field of Classification Search  
None  
See application file for complete search history.

(56) References Cited

U.S. PATENT DOCUMENTS

| 5,184,114 A | 2/1993 | Brown |
| 5,812,105 A | 9/1998 | Ven |
| 6,547,423 B2 | 4/2003 | Marshall et al. |

(Continued)

FOREIGN PATENT DOCUMENTS

| CN | 102859268 A | 1/2013 |
| CN | 103117348 A | 5/2013 |

(Continued)

OTHER PUBLICATIONS

EP18200530.6—European Search Report of the European Patent Office dated May 23, 2019.

(Continued)

*Primary Examiner* — Britt D Hanley  
(74) *Attorney, Agent, or Firm* — Penny L. Lowry

(57) ABSTRACT

A directional illumination apparatus comprises a waveguide with a reflective surface comprising reflective light input facets, reflective light extraction facets and an output transmissive surface. An array of sub-arrays of micro-LEDs is arranged to illuminate the reflective surface in a rearwards direction. The reflective light extraction facets cooperate to provide a uniform output illumination across the output aperture of the waveguide with collimated light that is controllable by control of the sub-arrays of micro-LEDs. A thin and efficient illumination apparatus may be used for switching high dynamic range display backlighting, privacy display or environmental illumination applications.

45 Claims, 46 Drawing Sheets

(52) U.S. Cl.
CPC .......... *H01L 27/156* (2013.01); *H01L 33/505* (2013.01); *H01L 2933/0091* (2013.01)

(56) References Cited

U.S. PATENT DOCUMENTS

| | | |
|---|---|---|
| 6,570,324 B1 | 5/2003 | Tutt et al. |
| 7,014,964 B1 | 3/2006 | Hsu et al. |
| 7,171,874 B1 | 2/2007 | Huang |
| 7,863,614 B2 | 1/2011 | Toyama et al. |
| 7,994,531 B2 | 8/2011 | Lin et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 2004/0080938 A1 | 4/2004 | Holman et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0263061 A1 | 12/2004 | Ishikawa et al. |
| 2005/0111100 A1 | 5/2005 | Mather et al. |
| 2005/0219693 A1 | 10/2005 | Hartkop et al. |
| 2006/0152931 A1 | 7/2006 | Holman |
| 2006/0256255 A1 | 11/2006 | Minami |
| 2006/0002902 A1 | 12/2006 | Cok et al. |
| 2007/0007237 A1 | 1/2007 | Wu et al. |
| 2007/0019131 A1 | 1/2007 | Choi et al. |
| 2007/0047254 A1 | 3/2007 | Schardt et al. |
| 2007/0116424 A1 | 5/2007 | Ting et al. |
| 2007/0165394 A1 | 7/2007 | Chang |
| 2007/0176195 A1 | 8/2007 | Kuiseko et al. |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0089093 A1 | 4/2008 | Miller et al. |
| 2008/0123350 A1 | 5/2008 | Choe et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0315755 A1 | 12/2008 | Han |
| 2009/0001869 A1 | 1/2009 | Tanimoto et al. |
| 2009/0086508 A1 | 4/2009 | Bierhuizen |
| 2009/0109656 A1 | 4/2009 | Chang |
| 2009/0128735 A1 | 5/2009 | Larson et al. |
| 2009/0242929 A1 | 10/2009 | Lin |
| 2009/0268428 A1 | 10/2009 | Tsukada |
| 2009/0296389 A1 | 12/2009 | Hsu |
| 2010/0061096 A1 | 3/2010 | Sato |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0195330 A1 | 8/2010 | Schaefer et al. |
| 2010/0258543 A1 | 10/2010 | Mizuno et al. |
| 2010/0295762 A1 | 11/2010 | Yeom et al. |
| 2010/0317132 A1 | 12/2010 | Rogers et al. |
| 2011/0003410 A1 | 1/2011 | Tsay et al. |
| 2011/0018860 A1 | 1/2011 | Parry-Jones et al. |
| 2011/0038150 A1 | 2/2011 | Woodgate et al. |
| 2011/0090672 A1 | 4/2011 | Zhu et al. |
| 2011/0151602 A1 | 6/2011 | Speier |
| 2011/0194034 A1 | 8/2011 | Shimizu |
| 2011/0255303 A1 | 10/2011 | Nichol et al. |
| 2012/0086875 A1 | 4/2012 | Yokota |
| 2012/0119237 A1 | 5/2012 | Leatherdale et al. |
| 2012/0140462 A1 | 6/2012 | Pickard |
| 2012/0258963 A1 | 10/2012 | Berger et al. |
| 2012/0320627 A1 | 12/2012 | Araki et al. |
| 2013/0039062 A1 | 2/2013 | Vinther et al. |
| 2013/0107525 A1 | 5/2013 | Woodgate et al. |
| 2013/0121000 A1 | 5/2013 | Lee et al. |
| 2013/0258663 A1 | 10/2013 | Woodgate et al. |
| 2013/0293793 A1 | 11/2013 | Lu |
| 2014/0022619 A1 | 1/2014 | Woodgate et al. |
| 2014/0098418 A1 | 4/2014 | Lin |
| 2014/0140654 A1 | 5/2014 | Brown et al. |
| 2014/0186979 A1 | 7/2014 | Tu et al. |
| 2014/0211462 A1 | 7/2014 | Keller et al. |
| 2014/0211503 A1 | 7/2014 | Tarsa |
| 2014/0240828 A1 | 8/2014 | Robinson et al. |
| 2014/0240839 A1 | 8/2014 | Yang et al. |
| 2014/0316742 A1 | 10/2014 | Sun et al. |
| 2015/0054011 A1 | 2/2015 | Koizumi et al. |
| 2015/0062490 A1 | 3/2015 | Kwon |
| 2015/0160396 A1 | 6/2015 | Wilcox et al. |
| 2015/0268479 A1 | 9/2015 | Woodgate et al. |
| 2015/0268513 A1 | 9/2015 | Chang et al. |
| 2015/0295154 A1 | 10/2015 | Tu et al. |
| 2015/0308635 A1 | 10/2015 | Li et al. |
| 2016/0018077 A1 | 1/2016 | Mallory et al. |
| 2016/0211413 A1 | 7/2016 | Park et al. |
| 2016/0299281 A1 | 10/2016 | Robinson et al. |
| 2017/0031085 A1 | 2/2017 | Lim et al. |
| 2017/0045666 A1 | 2/2017 | Vasylyev |
| 2017/0059127 A1 | 3/2017 | Jansma et al. |
| 2017/0102127 A1 | 4/2017 | Woodgate et al. |
| 2017/0139114 A1 | 5/2017 | Woodgate et al. |
| 2017/0154919 A1 | 6/2017 | Chen et al. |
| 2017/0161179 A1 | 6/2017 | Maple et al. |
| 2017/0205959 A1 | 7/2017 | Seong |
| 2017/0248289 A1 | 8/2017 | Vasylyev |
| 2017/0261179 A1 | 9/2017 | Wu et al. |
| 2018/0014007 A1 | 1/2018 | Brown |
| 2018/0226384 A1 | 8/2018 | Park et al. |
| 2018/0321553 A1 | 11/2018 | Robinson et al. |
| 2019/0086706 A1 | 3/2019 | Robinson et al. |
| 2019/0139243 A1 | 5/2019 | You et al. |
| 2019/0220121 A1 | 7/2019 | Kim et al. |
| 2019/0250458 A1 | 8/2019 | Robinson et al. |
| 2019/0265478 A1 | 8/2019 | Cok et al. |
| 2019/0278135 A1 | 9/2019 | Woodgate et al. |
| 2019/0294004 A1 | 9/2019 | Hashimoto |
| 2019/0377067 A1 | 12/2019 | Han et al. |
| 2020/0049876 A1 | 2/2020 | Watanabe et al. |
| 2020/0159055 A1 | 5/2020 | Robinson et al. |
| 2020/0166783 A1 | 5/2020 | Roy et al. |
| 2020/0259307 A1 | 8/2020 | Sharma et al. |
| 2020/0321553 A1 | 10/2020 | Kwon et al. |
| 2020/0355896 A1 | 11/2020 | Woodgate et al. |

FOREIGN PATENT DOCUMENTS

| | | |
|---|---|---|
| DE | 102010031945 A1 | 1/2012 |
| EP | 1387412 A1 | 2/2004 |
| EP | 1835550 A2 | 9/2007 |
| EP | 1890343 A1 | 2/2008 |
| EP | 1986023 A1 | 10/2008 |
| EP | 2182783 A2 | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2009295309 A | 12/2009 |
| JP | 2010238846 A | 10/2010 |
| JP | 2013219397 A | 10/2013 |
| WO | 2006115313 A1 | 11/2006 |
| WO | 2007074932 A1 | 7/2007 |
| WO | 2010038025 A2 | 4/2010 |
| WO | 2010038025 A3 | 6/2010 |
| WO | 2011131200 A1 | 10/2011 |
| WO | 2012052722 A2 | 4/2012 |
| WO | 2012052723 A1 | 4/2012 |
| WO | 2013064801 A1 | 5/2013 |
| WO | 2013112435 A1 | 8/2013 |
| WO | 2014043384 A1 | 3/2014 |
| WO | 2015089517 A1 | 6/2015 |
| WO | 2017007770 A2 | 1/2017 |
| WO | 2018185475 A1 | 10/2018 |
| WO | 2018185476 A1 | 10/2018 |
| WO | 2018208618 A1 | 11/2018 |

(56) References Cited

FOREIGN PATENT DOCUMENTS

WO    2019067846 A1    4/2019
WO    2019107826 A1    6/2019

OTHER PUBLICATIONS

International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching author ily for PCT application PCT/US2019/021570 dated May 24, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2020/050527 dated Feb. 3, 2021.
International search report and written opinion of international searching authority for PCT application PCT/US2020/053825 dated Dec. 30, 2020.
International search report and written opinion of international searching authority for PCT application PCT/US2021/018544 dated Apr. 29, 2021.
CN201880036805.8 Notification of the First Office Action dated Jul. 23, 2021.
CN201880036842.9 Notification of the First Office Action dated Jul. 23, 2021.

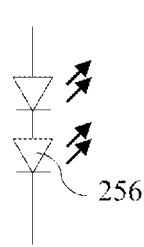
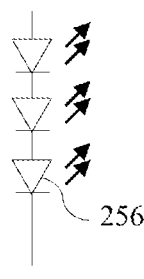
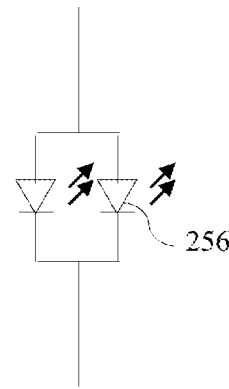
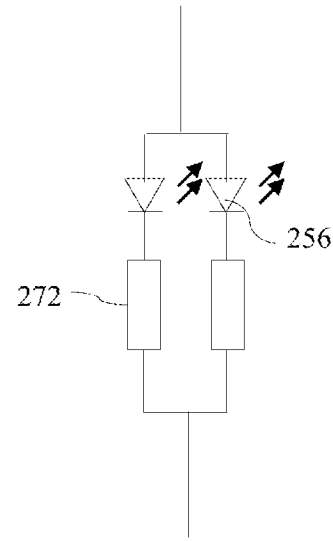
*FIG. 15A*   *FIG. 15B*   *FIG. 15C*   *FIG. 15D*
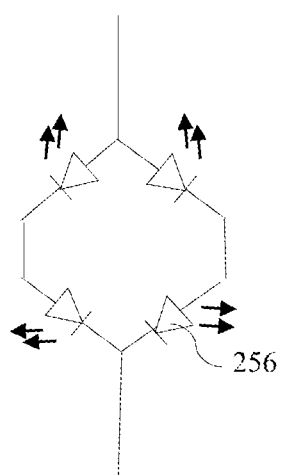
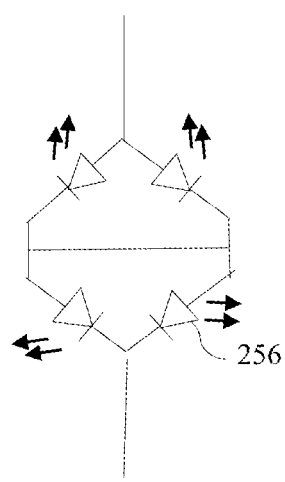
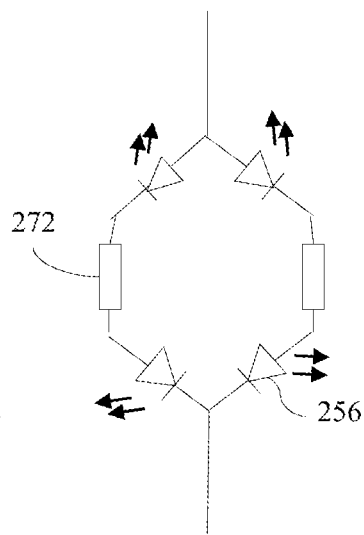
*FIG. 15E*   *FIG. 15F*   *FIG. 15G*

SWITCHABLE ILLUMINATION APPARATUS AND PRIVACY DISPLAY

TECHNICAL FIELD

This disclosure generally relates to illumination from light modulation devices, and more specifically relates to optical stacks for providing switchable angle illumination for use in display including privacy display, high dynamic range display and for use in environmental illumination.

BACKGROUND

Privacy displays provide image visibility to a primary user that is typically in an on-axis position and reduced visibility of image content to a snooper, that is typically in an off-axis position. A privacy function may be provided by micro-louvre optical films that transmit a high luminance from a display in an on-axis direction with low luminance in off-axis positions, however such films are not switchable, and thus the display is limited to privacy only function.

Switchable privacy displays may be provided by control of the off-axis optical output from a spatial light modulator. Control may be provided by means of off-axis luminance reduction, for example by means of switchable polarisation control layers between display polarisers and additional polarisers.

Backlights with reduced off-axis luminance can be used to provide or enhance the privacy function. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in U.S. Pat. No. 9,519,153, which is herein incorporated by reference in its entirety.

Backlights formed from arrays of individually controllable light sources arranged in series with a liquid crystal spatial light modulator can provide high dynamic range by reducing output luminous flux of the light sources in alignment with low luminance regions of the image displayed on the spatial light modulator. High dynamic range LCDs (HDR-LCD) can achieve dynamic ranges that are superior to that which can be provided by an LCD optical mode alone. An array of light sources such as LEDs (light emitting diodes) that is addressed with lower resolution image data is provided in a local dimming LCD backlight, such that dark areas of an image are illuminated by the backlight with low luminance, and bright areas are illuminated with high luminance.

Thin substrate and polymer substrate LCD panels can provide mechanical characteristics such as flexibility that is similar to organic LED (OLED) displays. Such thin substrate LCDs desirably use backlights with similar mechanical characteristics.

One type of LCD backlight comprises a light guide plate, and array of input light sources such as LEDs at one end of the light guide plate. Light that propagates by total internal reflection within the waveguide is output by means of surface features that adjust the propagation angle of light within the waveguide and allow extraction at angles close to grazing the outside of the waveguide. Such light is directed in a normal direction to the LCD by means of a turning film and/or rear reflectors. Such optical stacks may have high efficiency, but have multiple optical components with total backlight thickness typically 1 mm or greater. Such an edge illuminated light guide plate is not typically appropriate for two-dimensional local dimming for HDR-LCD illumination, or free-form shaped LCD.

Other known backlights incorporate an array of light emitting diodes (LEDs) in a matrix behind the LCD such as described in U.S. Patent Publ. No. 2017-0261179 comprises a plurality of spatially separated packaged LEDs and a multiple "batwing" optical elements, each batwing optical element arranged to direct light from the packaged LED in a lateral direction. Such light is strongly diffused to provide output illumination. Such backlights require expensive pick-and-place LED and individual optics alignment and have a high thickness and reduced efficiency in comparison to edge illuminated backlights.

Illumination systems for environmental lighting such as automobile headlights, architectural, commercial or domestic lighting may provide a narrow directional light output distribution, for example by means of focusing optics to provide spotlighting effects, or can achieve a wide directional light output distribution for example by means of diffusing optics.

In this specification LED refers to an unpackaged LED die chip extracted directly from a monolithic wafer, i.e. a semiconductor element. This is different from packaged LEDs which have been attached to a lead frame in order to provide electrodes and may be assembled into a plastic package to facilitate subsequent assembly. Packaged LEDs are typically of dimension greater than 1 mm, and more typically of dimension greater than 3 mm and are assembled by conventional Printed Circuit Board assembly techniques including pick and place methods. The accuracy of components placed by such assembly machines may typically be about plus or minus 30 micrometres. Such sizes and tolerances prevent application to very high resolution displays.

Micro-LEDs may be formed by array extraction methods in which multiple LEDs are removed from a monolithic wafer in parallel and may be arranged with positional tolerances that are less than 5 micrometres.

White LED lighting sources can be comprised of separate spectral bands such as red, green, blue and yellow, each created by a separate LED element. Such sources enable users to resolve the separate colours, and as a result of the separation of the sources in the lamp, can create coloured illumination patches.

Catadioptric elements combine refractive surfaces (dioptrics) and reflective surfaces (catoptrics), which may provide total internal reflection or reflection from metallised surfaces. Backlights employing catadioptric optical elements with small output luminous intensity solid angles are described in WIPO International Publ. No. WO/2010/038025, which is herein incorporated by reference in its entirety.

BRIEF SUMMARY

According to a first aspect of the present disclosure there is provided an illumination apparatus for providing illumination over a predetermined area, the illumination apparatus comprising: an array of sub-arrays of light emitting diodes arrayed across the predetermined area, the light emitting diodes of each sub-array being formed on a respective monolithic layer of semiconductor material and arranged to output light rearwardly; and an array of optical elements arrayed across the predetermined area, rearwardly of the light emitting diodes, each optical element being aligned with a respective sub-array of light emitting diodes, and each optical element comprising a waveguide having a transmissive surface and a reflective surface that is arranged rearwardly of the transmissive surface to receive light from the respective sub-array of light emitting diodes through the transmissive surface, the reflective surface of each optical element comprising: a reflective light input structure arranged to reflect light received from the respective sub-array of light emitting diodes in directions in which the light reflected thereby is guided within the waveguide by total internal reflection at the transmissive surface; and reflective light extraction facets arranged to reflect light that is guided within the waveguide in directions in which the light reflected thereby is output from the waveguide through the transmissive surface.

Advantageously a thin switchable directional illumination apparatus may be provided. Widely spaced sub-arrays may be provided over a large area while achieving high image uniformity. Cost and complexity of manufacture may be reduced. High brightness may be achieved.

The light emitting diodes output light in respective first light output distributions, and the optical elements output light from the waveguide originating from each light emitting diode of the respective sub-array in a respective second light output distribution that has a luminous intensity half maximum solid angle that is smaller than the luminous intensity half maximum solid angle of the respective first light output distribution of the light emitting diode from which the light originates. The ratio of luminous intensity half maximum solid angle of the second light output distribution to the luminous intensity half maximum solid angle of a Lambertian light distribution may be less than 1, preferably less than 0.5, more preferably less than 0.25 and most preferably less than 0.1. Advantageously a collimated output may be achieved. High efficiency may be provided in desirable output directions.

Each sub-array of light emitting diodes may comprise electrodes arranged to provide independent addressing of at least two of the light emitting diodes of the sub-array. Advantageously a switchable directional profile may be provided.

Each optical element may have mirror symmetry about an optical axis in at least one cross-sectional plane. Advantageously high uniformity may be provided over a large area with high efficiency. The spacing of sub-arrays may be increased, reducing cost and complexity of manufacture.

Each optical element may have mirror symmetry about an optical axis in all cross-sectional planes around the optical axis. Advantageously a symmetric angular optical output may be achieved with very high efficiency. An illumination apparatus suitable for landscape and portrait privacy operation may be provided.

The light emitting diodes of each sub-array may include a first light emitting diode on the optical axis of the optical element that is aligned thereto and at least one further light emitting diode offset from the optical axis of the optical element that is aligned thereto. Advantageously a light cone of controllable angular size may be provided.

In said at least one cross-sectional plane the reflective light input structure may comprise first and second inclined reflective surfaces facing outwardly of the optical axis. The first and second inclined reflective surfaces may be curved. Advantageously light from the sub-arrays may be efficiently coupled into the waveguide. The visibility of hot spots may be minimised.

In the at least one cross-sectional plane the reflective light extraction facets may comprise plural pairs of inclined facets facing the optical axis. Advantageously light from an LED may be extracted by more than one optical element of the array. Uniformity may be increased.

The reflective surface may comprise reflective planar regions between the reflective light extraction facets. Advantageously light may be distributed over a large area by means of guiding. LED cost may be reduced and uniformity increased.

The reflective planar regions and the reflective light extraction facets may have a stepped structure. Advantageously leakage between adjacent optical elements may be reduced. Dynamic range of a backlight may be increased.

In the at least one cross-sectional plane the reflective light extraction facets may have a separation that decreases with distance from the optical axis of the optical element. The reflective light extraction facets may have lengths that increase with distance from the optical axis of the respective optical element. The reflective light extraction facets may have total areas that increase with the distance from the optical axis of the respective optical element. The reflective light extraction facet may have total areas that increase in proportion with the distance from the optical axis of the respective optical element. Advantageously uniformity of output may be increased.

Some of the reflective light extraction facets may be arranged to direct light that has not guided within the optical element. Advantageously some light may be extracted near the LEDs. The visibility of hotspots or dim spots near the LEDs may be reduced.

The transmissive surface of each optical element may be planar. Advantageously cost and complexity of the surface is reduced. Light guiding is provided so that light is distributed over a wide area and cost of the illumination apparatus is reduced.

The transmissive surface of each optical element may further comprise a refractive light input structure formed in the transmissive surface of the waveguide and aligned with the respective sub-array of light emitting diodes so that the light emitted thereby passes through the refractive light input structure. Each optical element may have mirror symmetry about an optical axis in at least one cross-sectional plane. In the at least one cross-sectional plane the refractive light input structure may comprise a plurality of pairs of oppositely inclined refractive input facets. The transmissive surface of the input substrate may comprise planar regions between the refractive light input structures. Advantageously the efficiency of input into the waveguide may be increased.

The illumination apparatus may further comprise a transmissive support substrate, the light emitting diodes being supported by the transmissive support substrate on the rear side thereof. Advantageously the manufacturing cost of the LED support substrate may be reduced.

A transmissive material with a lower refractive index than a material of the waveguide may be arranged between the transmissive support substrate and the transmissive surfaces of the optical elements. The transmissive material may be air. Light may guide within the optical elements advantageously reducing LED cost and increasing uniformity over the predetermined area.

Each optical element may further comprise a refractive light output structure formed in a front surface of the transmissive support substrate in front of the respective sub-array of light emitting diodes. Some of the reflective light extraction facets of each optical element may be arranged to direct light to the refractive light output structure of the optical element. Each optical element may have mirror symmetry about an optical axis in at least one cross-sectional plane. In the at least one cross-sectional plane the refractive light output structure may comprise a concave refractive surface arranged to provide negative optical power. In the at least one cross-sectional plane the refractive light output structure may comprise a plurality of pairs of oppositely inclined transmissive light deflecting facets. The illumination apparatus may further comprise diffuser structures arranged on at least one surface of the transmissive support substrate. The angular light output distribution of light passing through the refractive light output structure may be substantially the same as the angular light output distribution of light passing through regions of the transmissive support substrate that do not comprise a refractive light output structure. Advantageously collimated light may be provided from the region of the waveguide that is obscured by the region of the LED. Uniformity may be increased. The illumination apparatus may further comprise diffuser structures arranged on at least one surface of the transmissive support substrate. Advantageously uniformity may be increased. Output illumination solid angle may be increased to provide desirable angular output characteristics.

The illumination apparatus may further comprise mask regions provided between each sub-array of light emitting diodes and the transmissive support substrate. Advantageously the visibility of hot spots from the region near the LED is reduced.

Each mask region may comprise electrodes connected to the light emitting diodes of the sub-array. Advantageously electrical connections to the LEDs may be conveniently provided.

The reflective surface of the optical element may have a reflective layer formed thereon. Advantageously light rays may be provided to the waveguide that would otherwise not be directed to guiding rays. The reflective layer may comprise a metal material. Advantageously high efficiency may be conveniently provided.

The waveguides of each optical element may be formed as an integrated body. Advantageously manufacturing cost may be reduced. Light may be guided between adjacent elements increasing uniformity.

The light emitting diodes may have a maximum width of at most 300 micrometers, preferably at most 200 micrometers and more preferably at most 100 micrometres. Advantageously low cost LEDs may be provided and device thickness may be reduced.

In the at least one cross-sectional plane the distance between the transmissive output surface and reflective surface may be less than 1000 micrometres, preferably less than 500 micrometres and more preferably less than 250 micrometres. Advantageously a low cost illumination apparatus may be provided. The illumination apparatus may be flexible.

The semiconductor material of the monolithic layers of the sub-arrays of light emitting diodes may be n-type. Each sub-array may further comprise a patterned layer of semiconductor material of opposite type from the monolithic layer. Each sub-array may further comprise patterned electrodes formed on the patterned layer. The number of steps to provide the sub-arrays may be reduced. Advantageously cost and complexity may be reduced. Desirable alignment of light output cones may be achieved. Uniform switching of output angle may be provided across the predetermined area.

The illumination apparatus may further comprise a control system arranged to control the output of light from the light emitting diodes. Advantageously the angular output of the illumination apparatus may be controlled.

According to a second aspect of the present disclosure there is provided a display apparatus comprising: an illumination apparatus according to the first aspect; and a transmissive spatial light modulator illuminated by the illumination apparatus. Advantageously a high dynamic range (HDR) display apparatus may be provided. Further a display with reduced moving picture response time (MPRT) may be provided, increasing the sharpness of fast moving objects. The display may further be provided with switchable illumination angle to provide a switchable privacy display, high efficiency display and low stray light display.

According to a third aspect of the present disclosure there is provided an illumination apparatus for providing illumination over a predetermined area, the illumination apparatus comprising: a transmissive support substrate; an array of sub-arrays of light emitting diodes supported by the transmissive support substrate on the rear side thereof and arrayed across the predetermined area, the light emitting diodes of each sub-array being formed on a respective monolithic layer of semiconductor material and arranged to output light rearwardly; an array of optical elements arrayed across the predetermined area, rearwardly of the light emitting diodes, each optical element being aligned with a respective sub-array of light emitting diodes, and each optical element comprising a rear layer having a transmissive surface and a reflective surface that is arranged rearwardly of the transmissive surface to receive light from the respective sub-array of light emitting diodes through the transmissive surface; and a transmissive material arranged between the transmissive support substrate and the transmissive surfaces of the optical elements, wherein the rear layers, the transmissive material and the transmissive support substrate have matched refractive indices, and the reflective surface of each optical element comprises: a reflective light input structure arranged to reflect light received from the respective sub-array of light emitting diodes in directions in which the light reflected thereby is guided within a waveguide formed by the rear layer, the transmissive material and the transmissive support substrate by total internal reflection at the front surface of the transmissive support substrate; and reflective light extraction facets arranged to reflect light that is guided within the waveguide in directions in which the light reflected thereby is output from the waveguide through the transmissive surface. Advantageously the illumination apparatus may be provided with increased stability of alignment between the reflective surface and the LEDs of the array of LEDs.

The light emitting diodes output light in respective first light output distributions, and the optical elements output light from the waveguide originating from each light emitting diode of the respective sub-array in a respective second light output distribution that has a luminous intensity half maximum solid angle that is smaller than the luminous intensity half maximum solid angle of the respective first light output distribution of the light emitting diode from which the light originates.

The ratio of luminous intensity half maximum solid angle of the second light output distribution to the luminous intensity half maximum solid angle of a Lambertian light distribution may be less than 1, preferably less than 0.5, more preferably less than 0.25 and most preferably less than 0.1.

Each sub-array of light emitting diodes may comprise electrodes arranged to provide independent addressing of at least two of the light emitting diodes of the sub-array.

Each optical element may have mirror symmetry about an optical axis in at least one cross-sectional plane.

Each optical element may have mirror symmetry about an optical axis in all cross-sectional planes around the optical axis.

The light emitting diodes of each sub-array may include a first light emitting diode on the optical axis of the optical element that is aligned thereto and at least one further light emitting diode offset from the optical axis of the optical element that is aligned thereto.

In said at least one cross-sectional plane the reflective light input structure may comprise first and second inclined reflective surfaces facing outwardly of the optical axis.

The first and second inclined reflective surfaces may be curved.

In the at least one cross-sectional plane the reflective light extraction facets may comprise plural pairs of inclined facets facing the optical axis.

The reflective surface may comprise reflective planar regions between the reflective light extraction facets.

In the at least one cross-sectional plane the reflective light extraction facets may have a separation that decreases with distance from the optical axis of the optical element.

The reflective light extraction facets may have lengths that increase with distance from the optical axis of the respective optical element.

The reflective light extraction facets may have total areas that increase with the distance from the optical axis of the respective optical element.

The reflective light extraction facet may have total areas that increase in proportion with the distance from the optical axis of the respective optical element.

Some of the reflective light extraction facets may be arranged to direct light that has not guided within the optical element.

The transmissive surface of each optical element may be planar.

The transmissive surface of each optical element may further comprise a refractive light input structure formed in the transmissive surface of the waveguide and aligned with the respective sub-array of light emitting diodes so that the light emitted thereby passes through the refractive light input structure.

Each optical element may have mirror symmetry about an optical axis in at least one cross-sectional plane.

The reflective planar regions and the reflective light extraction facets may have a stepped structure.

In the at least one cross-sectional plane the refractive light input structure may comprise a plurality of pairs of oppositely inclined refractive input facets.

The transmissive surface of the input substrate may comprise planar regions between the refractive light input structures.

The illumination apparatus may further comprise a transmissive support substrate the light emitting diodes being supported by the transmissive support substrate on the rear side thereof.

A transmissive material with a lower refractive index than a material of the waveguide may be arranged between the transmissive support substrate and the transmissive surfaces of the optical elements. The transmissive material may be air.

Each optical element may further comprise a refractive light output structure formed in a front surface of the transmissive support substrate in front of the respective sub-array of light emitting diodes.

Some of the reflective light extraction facets of each optical element may be arranged to direct light to the refractive light output structure of the optical element.

Each optical element may have mirror symmetry about an optical axis in at least one cross-sectional plane.

In the at least one cross-sectional plane the refractive light output structure may comprise a concave refractive surface arranged to provide negative optical power.

In the at least one cross-sectional plane the refractive light output structure may comprise a plurality of pairs of oppositely inclined transmissive light deflecting facets.

The illumination apparatus may further comprise diffuser structures arranged on at least one surface of the transmissive support substrate.

The angular light output distribution of light passing through the refractive light output structure may be substantially the same as the angular light output distribution of light passing through regions of the transmissive support substrate that do not comprise a refractive light output structure.

The illumination apparatus may further comprise mask regions provided between each sub-array of light emitting diodes and the transmissive support substrate.

Each mask region may comprise electrodes connected to the light emitting diodes of the sub-array.

The reflective surface of the optical element may have a reflective layer formed thereon.

The reflective layer may comprise a metal material.

The waveguides of each optical element may be formed as an integrated body.

The light emitting diodes may have a maximum width of at most 300 micrometers, preferably at most 200 micrometers and more preferably at most 100 micrometres.

In the at least one cross-sectional plane the distance between the transmissive output surface and reflective surface may be less than 1000 micrometres, preferably less than 500 micrometres and more preferably less than 250 micrometres.

The semiconductor material of the monolithic layers of the sub-arrays of light emitting diodes may be n-type.

Each sub-array may further comprise a patterned layer of semiconductor material of opposite type from the monolithic layer.

Each sub-array may further comprise patterned electrodes formed on the patterned layer.

The illumination apparatus may further comprise a control system arranged to control the output of light from the light emitting diodes.

According to a fourth aspect of the present disclosure there is provided a display apparatus comprising: an illumination apparatus according to the third aspect; and a transmissive spatial light modulator illuminated by the illumination apparatus.

Other advantages of the third and fourth aspects of the present embodiments include those as provided for the first and second aspects of the present embodiments.

Such an apparatus may be used for LCD backlighting or for domestic or professional lighting.

Any of the aspects of the present disclosure may be applied in any combination.

Embodiments of the present disclosure may be used in a variety of optical systems. The embodiments may include or work with a variety of projectors, projection systems, optical components, displays, microdisplays, computer systems, processors, self-contained projector systems, visual and/or audiovisual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying figures, wherein like reference numbers indicate similar parts.

FIGS. 15A-G are schematic diagrams illustrating in circuit symbol form example light emitting diode local connections;

DETAILED DESCRIPTION

Figure 1:
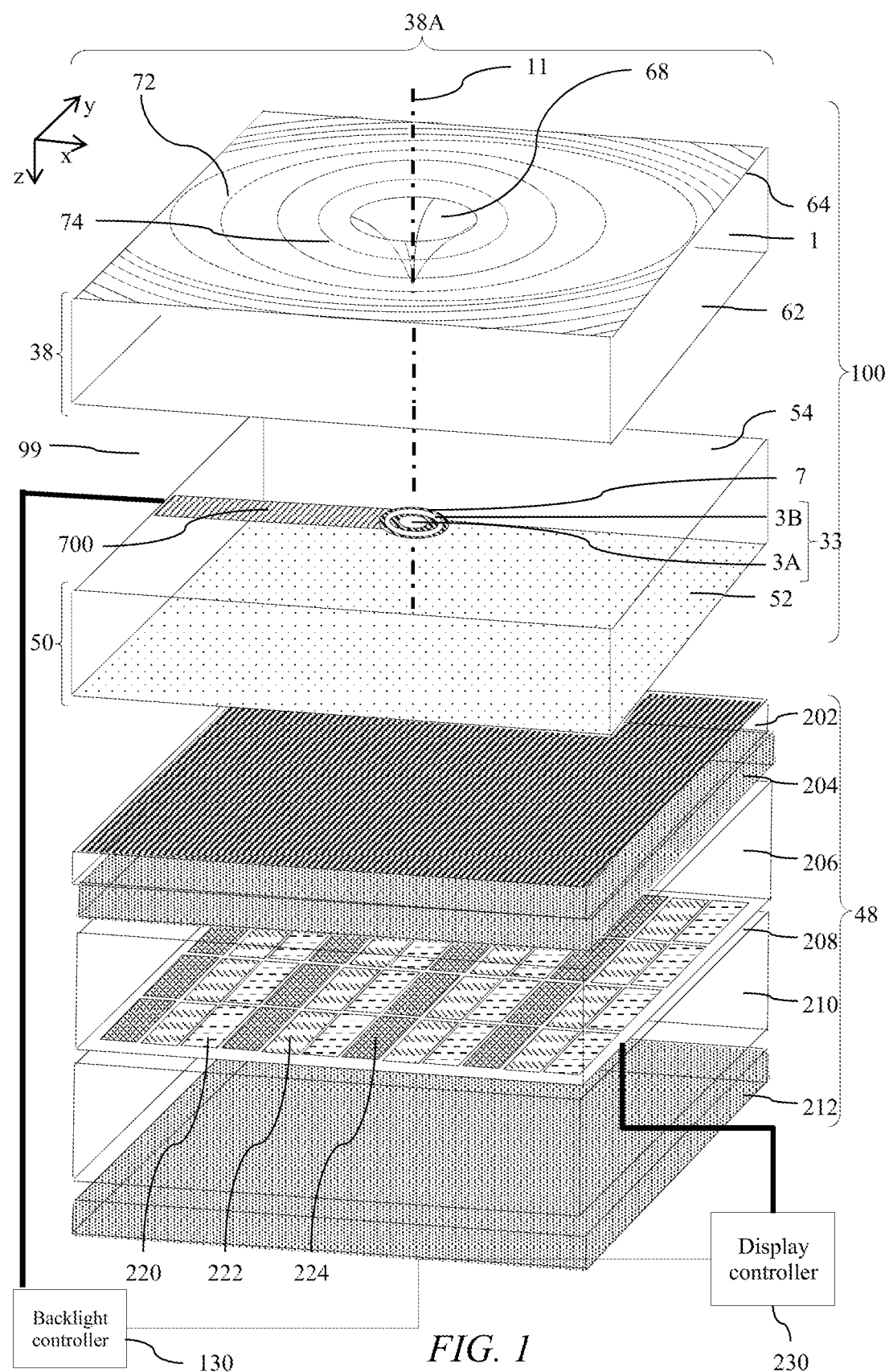
FIG. 1 is a schematic diagram illustrating in side perspective view a display apparatus comprising a backlight comprising a micro-LED and a catadioptric optical element arranged to illuminate an LCD.

A private mode of operation of a display is one in which an observer sees a low contrast sensitivity such that an image is not clearly visible. Contrast sensitivity is a measure of the ability to discern between luminances of different levels in a static image. Inverse contrast sensitivity may be used as a measure of visual security, in that a high visual security level (VSL) corresponds to low image visibility.

For a privacy display providing an image to an observer, visual security may be given as:

$$VSL=(Y+R)/(Y-K) \qquad \text{eqn. 1}$$

where VSL is the visual security level, Y is the luminance of the white state of the display at a snooper viewing angle, K is the luminance of the black state of the display at the snooper viewing angle and R is the luminance of reflected light from the display.

Panel contrast ratio is given as:

$$C=Y/K \qquad \text{eqn. 2}$$

For high contrast optical LCD modes, the white state transmission remains substantially constant with viewing angle. In the contrast reducing liquid crystal modes of the present embodiments, white state transmission typically reduces as black state transmission increases such that $$Y+K \sim P \cdot L \qquad \text{eqn. 3}$$

The visual security level may then be further given as:

$$VSL = \frac{(C + I \cdot \rho/\pi.(C+1)/(P.L))}{(C-1)} \qquad \text{eqn. 4}$$

where off-axis relative luminance, P is typically defined as the percentage of head-on luminance, L at the snooper angle and the display may have image contrast ratio C and the surface reflectivity is ρ.

The off-axis relative luminance, P is sometimes referred to as the privacy level. However, such privacy level P describes relative luminance of a display at a given polar angle compared to head-on luminance, and is not a measure of privacy appearance.

The display may be illuminated by Lambertian ambient illuminance I. Thus in a perfectly dark environment, a high contrast display has VSL of approximately 1.0. As ambient illuminance increases, the perceived image contrast degrades, VSL increases and a private image is perceived.

For typical liquid crystal displays the panel contrast C is above 100:1 for almost all viewing angles, allowing the visual security level to be approximated to:

$$VSL=1+I \cdot \rho/(\pi P \cdot L) \qquad \text{eqn. 5}$$

The perceptual image security may be determined from the logarithmic response of the eye, such that $$S=\log_{10}(V) \qquad \text{eqn. 6}$$

Desirable limits for S were determined in the following manner. In a first step a privacy display device was provided. Measurements of the variation of privacy level, P(θ) of the display device with polar viewing angle and variation of reflectivity ρ(θ) of the display device with polar viewing angle were made using photopic measurement equipment. A light source such as a substantially uniform luminance light box was arranged to provide illumination from an illuminated region that was arranged to illuminate the privacy display device along an incident direction for reflection to a viewer position at a polar angle of greater than 0° to the normal to the display device. The variation I(θ) of illuminance of a substantially Lambertian emitting lightbox with polar viewing angle was determined by measuring the variation of recorded reflective luminance with polar viewing angle taking into account the variation of reflectivity ρ(θ). The measurements of P(θ), r(θ) and (θ) were used to determine the variation of Security Factor S(θ) with polar viewing angle along the zero elevation axis.

In a second step a series of high contrast images were provided on the privacy display including (i) small text images with maximum font height 3 mm, (ii) large text images with maximum font height 30 mm and (iii) moving images.

In a third step each observer (with eyesight correction for viewing at 1000 mm where appropriate) viewed each of the images from a distance of 1000 m, and adjusted their polar angle of viewing at zero elevation until image invisibility was achieved for one eye from a position near on the display at or close to the centre-line of the display. The polar location of the observer's eye was recorded. From the relationship S(θ), the security factor at said polar location was determined. The measurement was repeated for the different images, for various display luminance $Y_{max}$, different lightbox illuminance I(q=0), for different background lighting conditions and for different observers.

From the above measurements S<1.0 provides low or no visual security, 1.0≤S<1.5 provides visual security that is dependent on the contrast, spatial frequency and temporal frequency of image content, 1.5≤S<1.8 provides acceptable image invisibility (that is no image contrast is observable) for most images and most observers and S≥1.8 provides full image invisibility, independent of image content for all observers.

In comparison to privacy displays, desirably wide-angle displays are easily observed in standard ambient illuminance conditions. One measure of image visibility is given by the contrast sensitivity such as the Michelson contrast which is given by:

$$M=(I_{max}-I_{min})/(I_{max}+I_{min}) \qquad \text{eqn. 7}$$

and so:

$$M=((Y+R)-(K+R))/((Y+R)+(K+R))=(Y-K)/(Y+K+2 \cdot R) \qquad \text{eqn. 8}$$

Thus the visual security level (VSL), is equivalent (but not identical to) 1/M. In the present discussion, for a given off-axis relative luminance, P the wide-angle image visibility, W is approximated as $$W=1/VSL=1/(1+I \cdot \rho/(\pi \cdot P \cdot L)) \qquad \text{eqn. 9}$$

In the present discussion the colour variation Δε of an output colour $(u_w'+\Delta u', v_w'+\Delta v')$ from a desirable white point $(u_w', v_w')$ may be determined by the CIELUV colour difference metric, assuming a typical display spectral illuminant and is given by:

$$\Delta\varepsilon=(\Delta u'^2+\Delta v'^2)^{1/2} \qquad \text{eqn. 10}$$

Catadioptric elements employ both refraction and reflection, which may be total internal reflection or reflection from metallised surfaces.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

It would be desirable to provide a collimated illumination apparatus 100 that provides a relatively narrow output cone angle for a display apparatus. In the present disclosure, collimated is used as an accepted term for narrow angle illumination from a display and/or backlight, for example full width half maximum (FWHM) luminance cone angles of less than 40 degrees, and typically less than 30 degrees.

In comparison to conventional wide angle backlights, collimated backlights can provide high efficiency light output for head-on observers, achieving increased luminance for a given power consumption or reduced power consumption for a given luminance. Collimated backlights can also provide low off-axis image visibility for privacy display.

It would further be desirable to provide a switchable collimated illumination apparatus 100 for a privacy display with a narrow angle output in a first mode of operation and a wide angle output in a second mode of operation. In operation, narrow angle output may be provided for a single head-on user, while wide angle output may be provided for multiple display users.

It would further be desirable to provide an environmental illumination apparatus for illumination of an ambient environment with collimated illumination from a large area of illumination with low glare.

It would be desirable to provide a thin switchable illumination apparatus for display, display backlighting or for domestic or professional environmental lighting. Environmental lighting may include illumination of a room, office, building, scene, street, equipment, or other illumination environment. Display backlighting means an illumination apparatus arranged to illuminate a transmissive spatial light modulator such as a liquid crystal display (LCD). The micro-LEDs of a display backlight may be provided with image information, for example in high dynamic range operation as will be described herein. However, in general pixel data is provided by the spatial light modulator.

It would further be desirable to provide a thin backlight for a spatial light modulator that can provide local area dimming for high dynamic range, a thin package, a widely spaced array of light sources and high uniformity. It would be further desirable to provide thin, flexible and free-form shapes (for example circular) backlights for thin substrate LCDs with very low bezel widths that achieve appropriate light output distributions with high uniformity, high efficiency and HDR capability.

The structure and operation of various switchable display devices will now be described. In this description, common elements have common reference numerals. It is noted that the disclosure relating to any element applies to each device in which the same or corresponding element is provided. Accordingly, for brevity such disclosure is not repeated.

Figure 2:
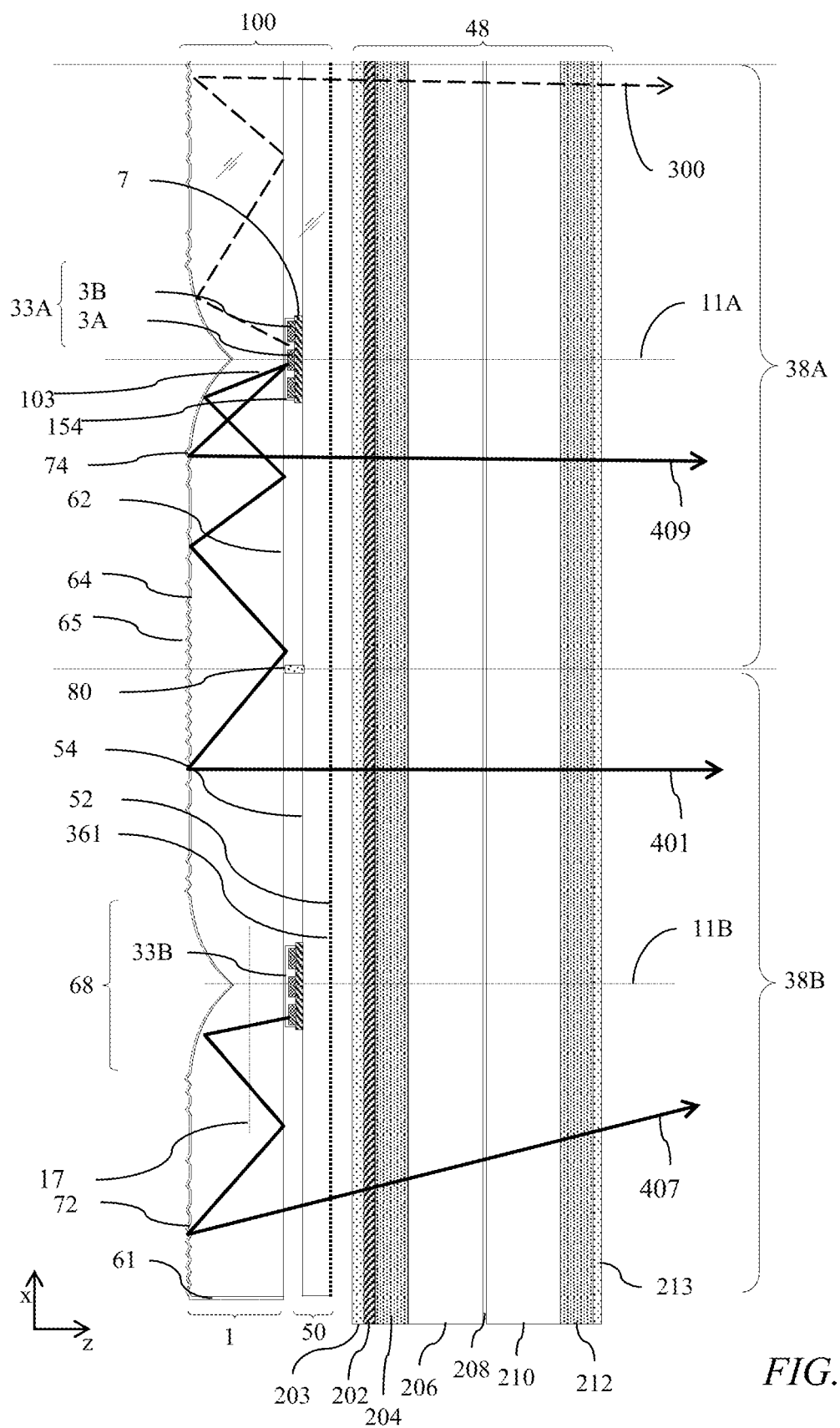
FIG. 2 is a schematic diagram illustrating in top view a display apparatus comprising a backlight comprising a micro-LED array and a catadioptric optical element 38 array arranged to illuminate an LCD.

FIG. 1 is a schematic diagram illustrating in side perspective view a display apparatus comprising a illumination apparatus 100 comprising a sub-array of light emitting diodes 3A, 3B and a unit cell 38A of an optical element 38 of an optical element 38 array arranged to illuminate a spatial light modulator 48; and FIG. 2 is a schematic diagram illustrating in top view in a cross sectional plane through its optical axes 11a,11b, a display apparatus comprising a illumination apparatus 100 comprising a sub-arrays of light emitting diodes 3A, 3B and two unit cells 38A, 38B of an optical element 38 array arranged to illuminate a spatial light modulator 48 such as an LCD.

The display apparatus comprises a display apparatus comprising: an illumination apparatus 100 and a transmissive spatial light modulator 48 illuminated by the illumination apparatus 100. Thus a backlight comprises an illumination apparatus 100 arranged to provide illumination to the transmissive spatial light modulator 48.

Illumination apparatus 100 is arranged for providing illumination 400 over a predetermined area. The predetermined area in FIG. 1 is at least the active area of the spatial light modulator 48 and is typically oversized in comparison to the active area to advantageously provide uniform illumination for off-axis viewing positions.

Spatial light modulator 48 comprises input polariser 210; TFT substrate 212; liquid crystal layer 214 that is pixelated with typically red pixels 220, green pixels 222 and blue pixels 224; colour filter substrate 216 and output polariser 218.

The illumination apparatus comprises an array of sub-arrays 33 of light emitting diodes 3 arrayed across the predetermined area. The light emitting diodes 3A, 3B of each sub-array 33 are arranged to output light rearwardly, that is away from the spatial light modulator 48.

In operation light rays including ray 401 output from the LEDs 3A of the sub-arrays 33 are directed towards the spatial light modulator 48 and output in a direction close to the direction of the optical axis 11. Advantageously visibility of hot spots of illumination near the LEDs may be substantially avoided. Further high image uniformity over the predetermined angle and narrow beam angles may be provided as will be described.

By comparison light rays including ray 407 output from the LEDs 3B of the sub-arrays 33 are directed towards the spatial light modulator 48 and output in a direction away from the direction of the optical axis 11. Advantageously a wider angular range of optical output may be provided. A switchable output beam angle may be achieved as will be described further hereinbelow.

The illumination apparatus further comprises a transmissive support substrate 50, the sub-arrays 33 being supported by the transmissive support substrate 50 on the rear side thereof. The illumination apparatus comprises a two-dimensional array of sub-arrays 33 disposed on a support substrate 50, the light emitting diodes 3, (or LEDs 3), being arrayed across the predetermined area. The support substrate 50 is transmissive to light rays 401, 407 from the sub-arrays 33. Light rays 400 that are extracted from the waveguide 1 are extracted through the substrate 50. Advantageously high efficiency output is achieved. Advantageously the manufacturing cost of the LED support substrate may be reduced.

Support substrate 50 comprises first and second surfaces 52, 54 that are planar. Advantageously the array of sub-arrays 33 may be manufactured on a separate element 50 to the optical element 38 that may have surface suitable for attaching the sub-arrays 33. Higher temperature processing environments may be provided, reducing cost of manufacture. Transparent electrodes 8 such as ITO may be provided on the substrate 50. The transmissive substrate 50 may be glass or polymer material. The waveguide 1 may be glass or may be a polymer material.

A transmissive material 59 with a lower refractive index than a material of the waveguide 1 is arranged in the gap 99 between the transmissive support substrate 50 and the transmissive surfaces 62 of the optical elements 38. In the embodiments of FIGS. 1-2 the transmissive material 59 is air. Light ray 401 guides within the waveguide 1. Advantageously LED cost may be reduced and uniformity increased.

Adhesive regions 80 may be provided to attach the light guide 1 to the support substrate 50, achieving alignment between the two structures. Alignment during environmental and mechanical variations may be provided. Advantageously increased resilience to temperature variations may be provided.

The sub-arrays 33 may be each provided with a wavelength conversion element 154. Wavelength conversion material and/or a light scattering material may be arranged in the wavelength conversion element 154 to receive light from the light emitting diodes 3, for example to convert blue output from gallium nitride (GaN) LEDs to white light or to scatter blue light. The wavelength conversion material may be a phosphor material or quantum dot material. Advantageously the present embodiments may achieve white light output with a narrow beam angle.

The illumination apparatus further comprises mask regions 7 provided between each of the light sub-arrays 33 and the transmissive support substrate 50. The mask regions are opaque and typically reflective. Light from each LED 3A, 3B is not directly output from the illumination apparatus 100. Advantageously the visibility of hot spots is reduced. Further, light may be reflected from the mask regions, increasing efficiency.

Each mask region 7 comprises electrodes 700 connected to the light emitting diodes 3A, 3B of the sub arrays 33. Light extraction near the sub-arrays 33 is reduced and advantageously hot spots are reduced.

The array of optical elements 38 is arrayed across the predetermined area, rearwardly of the sub-arrays 33, each optical element 38 being aligned with a respective at least one sub-array 33, and each optical element 38 comprising a waveguide 1 having a transmissive surface 62 and a reflective surface 64 that is arranged rearwardly of the transmissive surface 62 to receive light from the respective light emitting diode 3 of the sub-array 33 through the transmissive surface 62. The reflective surface 64 may provide illumination apparatus 100 regions 38A, 38B around optical axes 11A, 11B. As will be described further below advantageously a uniform, thin and collimated illumination apparatus may be provided.

The reflective surface 64 of the optical element 38 has a reflective layer 65 formed thereon. Light that is incident on the reflective surface at angles less than the critical angle in the material of the waveguide 1 are directed within the waveguide 1. Advantageously efficiency and uniformity is increased. The reflective layer 65 comprises a metal material. Metals may be provided at low cost and high reflectivity. Advantageously high efficiency may be provided.

Each optical element 38 has mirror symmetry about an optical axis 11 in at least one cross-sectional plane. In the arrangement of FIGS. 1-2 the reflective surface 64 of each optical element 38 has mirror symmetry about an optical axis 11 in all cross-sectional planes around the optical axis 11. In a case that the optical elements have mirror symmetry about an optical axis in all cross-sectional planes around the optical axis, then the optical elements have rotational symmetry about the optical axis. In this case, the optical elements may be arranged in a two dimensional array.

The light emitting diodes 3A, 3B of each sub-array 33 include a first light emitting diode 3A on the optical axis 11 of the optical element 38 that is aligned thereto and at least one further light emitting diode 3B offset from the optical axis 11 of the optical element 38 that is aligned thereto.

The waveguides 1 of each optical element 38 are formed as an integrated body. The optical element 38 may be provided as a single layer, advantageously reducing cost and complexity of manufacture. Light may be guided between adjacent optical elements 38, advantageously increasing efficiency.

The reflective surface 64 of each optical element 38 comprises a reflective light input structure 68 arranged to reflect light received from the respective sub-array 33 of light emitting diodes 3A, 3B in directions in which the light 300 reflected thereby is guided within the waveguide 1 by total internal reflection at the transmissive surface 62.

Light is spread through the waveguide 1 advantageously increasing efficiency and increasing LED separation. The number of LEDs for a given thickness is reduced, advantageously reducing cost and complexity while achieving high uniformity.

In the at least one cross-sectional plane the reflective light extraction facets 72 comprise plural pairs of inclined facets 72A, 72B facing the optical axis 11. Reflective light extraction facets 72 are arranged to reflect light rays 300 that are guided within the waveguide 1 in directions in which the light reflected thereby is output from the waveguide 1 through the transmissive surface 62. Advantageously a narrow cone angle output is provided as will be described further in the illustrative embodiments below.

Some of the reflective light extraction facets 74 are arranged to direct light rays 409 that have not guided within the optical element 38. Advantageously some light may be extracted near the LEDs. The visibility of hotspots or dim spots near the LEDs may be reduced.

The reflective surface 64 comprises reflective planar regions 71 between the reflective light extraction facets 72. Advantageously light is guided within the waveguide by at least some of surfaces 62, 64.

The sub-arrays 33 are located in front of the waveguide 1 and arranged to emit light such as light rays 401, 407 rearwardly. Advantageously hot spots are reduced and uniformity increased.

In said at least one cross-sectional plane the reflective light input structure 68 comprises a first and second inclined reflective surfaces 69A, 69B facing outwardly of the optical axis 11 wherein the first and second inclined reflective surfaces 69A, 69B are curved.

The illustrative output light ray 401 is directed by LED 3 onto the reflective light input structure 68, is guided within the waveguide 1 by means of planar transmissive surface 62 and planar facets 71 and is deflected by light extraction feature 72 to be transmitted by spatial light modulator 48. The operation of the reflective surface 64 will be further described for example with reference to FIG. 17A, hereinbelow.

Air gap 99 is provided between the LEDs 3 and guiding surface 62. Such an arrangement uses refraction at the input planar surface 62 as will be described further below, and may be termed catadioptric.

Advantageously a thin switchable illumination apparatus may be provided. Widely spaced LEDs may be provided over a large area while achieving high image uniformity. Cost and complexity of manufacture may be reduced. High brightness may be achieved.

Optional reflective recirculation polariser 208 is provided to recirculate polarised light within the illumination apparatus 100. Further half wave retarders (not shown) may be arranged between the reflective polariser 208 and the light turning element 5 to increase the luminance of recirculated light using reflections from the reflective surface 64. Diffuser 203 may be provided to improve uniformity as will be described further below. Recirculated light may be reflected from the reflective surface 64 and directed through the polariser 204 by means of the retarders or scattering within the illumination apparatus 100 structure. Advantageously display efficiency may be increased.

The illumination apparatus further comprises a control system 510, 514, 517 arranged to control the output of light from the light emitting diodes 3A, 3B. The control system comprises display controller 510, illumination apparatus 100 controller 514, and LED array driver 517 arranged to control the luminous flux from the array of LEDs 3; and SLM controller 512 arranged to control the pixels 220, 222, 224 of the spatial light modulator 48. Controller 514 may be provided with image data so that the LEDs 3A, 3B of the array of sub-arrays are controlled with image information. Control system 510, 514, 517, 512 is arranged to control the luminous flux of the light emitted from the light emitting diodes 3 wherein the control is in response to image data supplied to the transmissive spatial light modulator 48.

Advantageously high dynamic range images may be provided. For example, in regions of the image on the spatial light modulator 48 where black pixels are provided, the luminous flux from the LEDs 3 of the LED array may be reduced and increased image contrast achieved. Further display efficiency is increased. Highlight regions of the image may be provided with increased luminance to achieve further enhanced dynamic range.

Further the illumination apparatus 100 may be scanned in synchronisation with the addressing of the spatial light modulator 48. A display with reduced moving picture response time (MPRT) may be provided, increasing the sharpness of fast moving objects.

Advantageously addressable illumination can be provided in a thin optical stack. Substrates 206, 210 may comprise thin substrates, such as 150 micrometers thickness or less that may be flexible. Thin substrates may be micro-sheet glass, glass that has been thinned by chemical-mechanical polishing, or polymer substrates such as polyimide or colourless polyimide. Advantageously an LCD that may be curved or used for flexible display may be provided as will be described further hereinbelow.

Further the total thickness of the spatial light modulator 48 may be less than 1 mm, preferably less than 500 micrometers, and most preferably less than 250 micrometers for applications such as mobile display. Control electronics may be provided within the active area of the spatial light modulator to provide substantially zero bezel, for example bezel widths of less than 500 micrometers. Further free-form shapes for the spatial light modulator 48, such as circular display may be achieved as will be described further hereinbelow.

The display may further be provided with switchable illumination angle to provide a switchable privacy display, switchable high efficiency display, switchable low stray light display as will be described further below.

It may be desirable to provide a switchable directionality illumination apparatus for environmental or other illumination purposes to achieve high illuminance and low glare.

Figure 3:
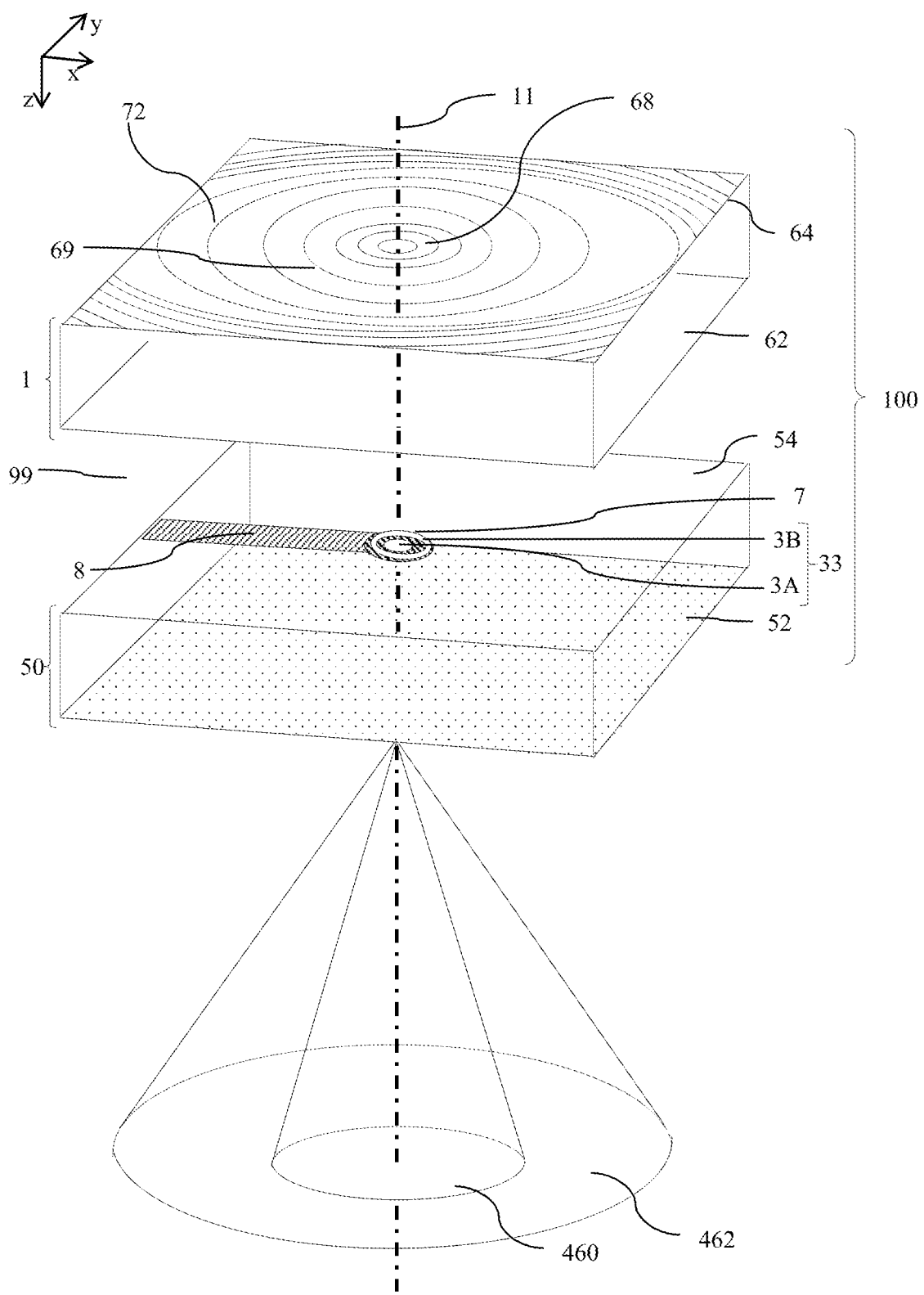
FIG. 3 is a schematic diagram illustrating in side perspective view a collimated output optical stack for environmental lighting.

FIG. 3 is a schematic diagram illustrating in side perspective view a high efficiency and spatially controllable environmental lighting switchable directional illumination apparatus 100 comprising an array of sub-arrays 33 arranged to illuminate an ambient environment. In comparison to the arrangement of FIGS. 1-2, the spatial light modulator 48 is omitted. Features of the arrangement of FIG. 3 not discussed in further detail may be assumed to correspond to the features with equivalent reference numerals as discussed above, including any potential variations in the features.

Output light in the light cone 460 from the illumination apparatus 100 is output in a direction close to the normal 11 to the predetermined area direction when the LED 3A of the array of sub-arrays 33 is operated and output light in the light cone 462 is provided when the LEDs 3A, 3B are both operated.

The light output may be controlled to provide spatially patterned illumination light cones across the predetermined area of the illumination apparatus for each element 38 of the illumination apparatus 100. High spatial uniformity of illumination may be achieved into a narrow cone angle as will be described further hereinbelow.

Advantageously a switchable illumination apparatus may provide sunlight type illumination from a large area light source with high uniformity. The luminance of the illumination apparatus is reduced in comparison to small area collimated sources. Image glare may be reduced and high efficiency achieved.

Further the profile of the illumination may be varied to achieve light dappling simulation by providing image data to the illumination apparatus by means of controllers 510, 514, 517 and omitting spatial light modulator 48. Desirable lighting characteristics for indoors operation may be achieved to simulate an outdoors environment.

The structure and operation of the sub-arrays 33 of light emitting diodes 3A, 3B will now be described.

Figure 4:
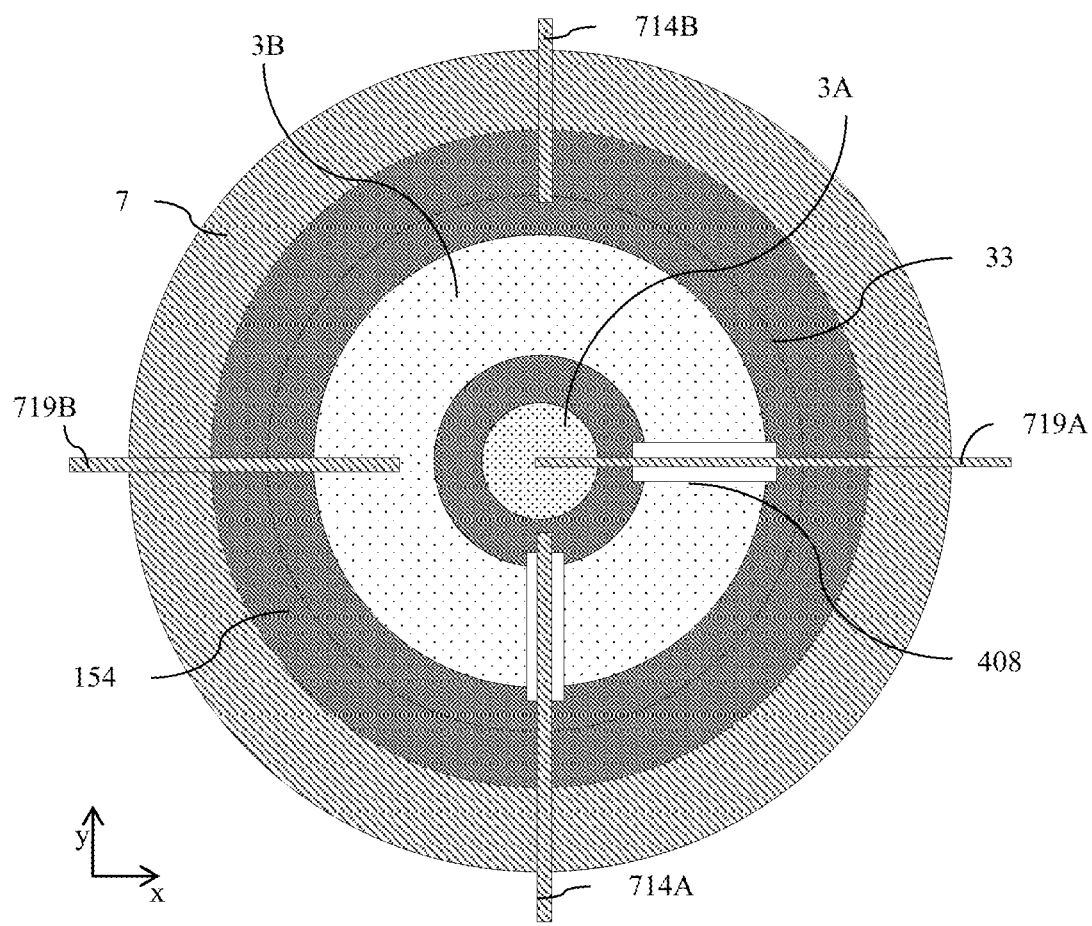
FIG. 4 is a schematic diagram illustrating in top view a sub-array of light emitting diodes comprising central and annular light emission regions.
Figure 5:
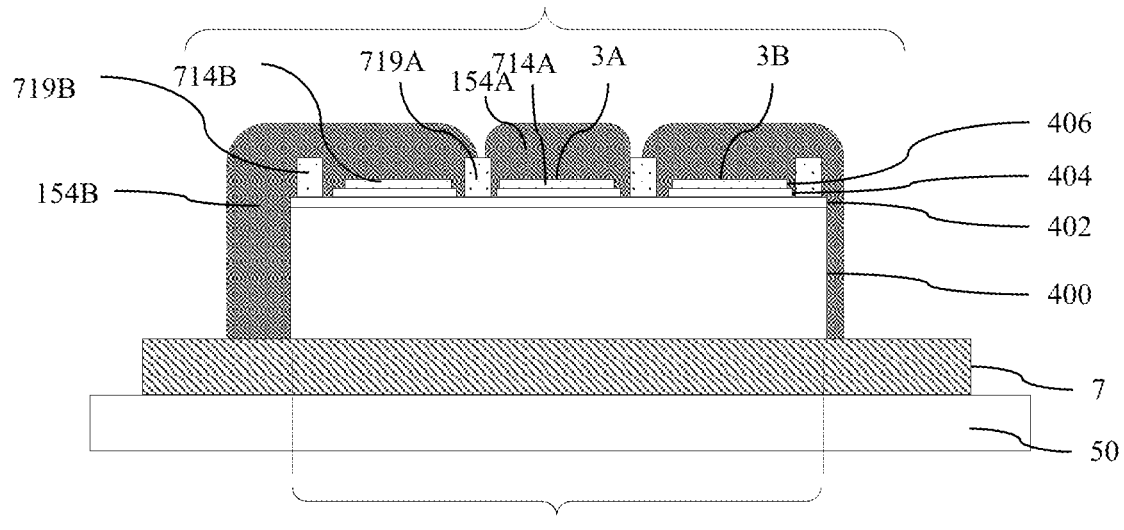
FIG. 5 is a schematic diagram illustrating in side view a sub-array of light emitting diodes.
Figure 6:
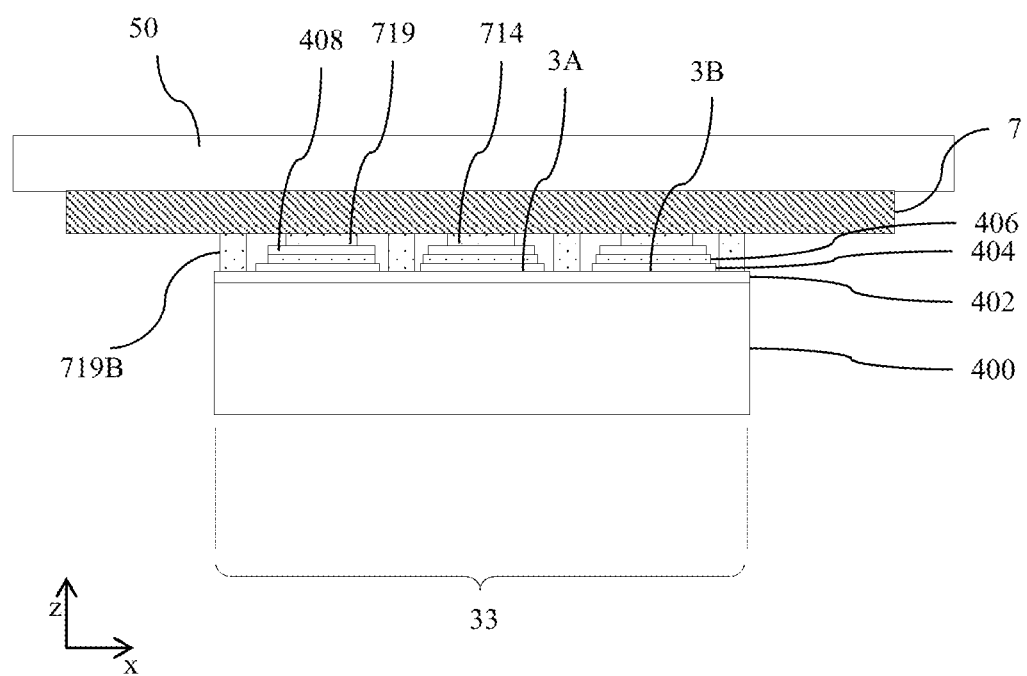
FIG. 6 is a schematic diagram illustrating in side view a sub-array of flip chip light emitting diodes.

FIG. 4 is a schematic diagram illustrating in top view a sub-array 33 of light emitting diodes 3A, 3B comprising central 3A and annular 3B light emission regions; FIG. 5 is a schematic diagram illustrating in side view a sub-array 33 of light emitting diodes 3A, 3B; and FIG. 6 is a schematic diagram illustrating in side view a sub-array 33 of flip chip light emitting diodes 3A, 3B. Features of the arrangement of FIGS. 4-6 not discussed in further detail may be assumed to correspond to the features with equivalent reference numerals as discussed above, including any potential variations in the features.

The light emitting diodes 3A, 3B of each sub-array 33 are formed on a respective monolithic layer 400 of semiconductor material which may for example be undoped GaN. On the upper side of the undoped GaN layer 400 is an n-type doped semiconductor layers 402.

Each sub-array 33 further comprises a patterned layer 404 of semiconductor material of opposite type from the monolithic layers 400, 402 that in the illustrative embodiment is a p-type doped semiconductor layer 404 with suitable multiple quantum wells (not shown) formed therebetween.

On top of the patterned p-doped layer 404, a patterned electrode 406 is provided which spreads the current in the light emitting diodes 3A, 3B. The electrodes 406 spreads the current in the light emitting diode, advantageously reducing current crowding and reduces junction temperature.

Each sub-array 33 thus comprises an array of light emitting diodes 3A, 3B. Advantageously the alignment of the LEDs 3A, 3B is provided by masking of layers during manufacture. Tight control of optical output may be achieved across the predetermined area. The number of placement steps for the sub-arrays 33 is reduced in comparison to placing individual LEDs 3A, 3B that are not on a monolithic layer. Cost and complexity are reduced.

Each sub-array 33 of light emitting diodes 3A, 3B comprises electrodes 714A, 714B and 719A and 719B arranged to connect light emitting diodes 3A, 3B to drive circuitry (not shown) and provide independent addressing of at least two of the light emitting diodes 3A, 3B of the sub-array 33. The electrodes 719A may be prevented from contacting the surface of light emitting diode 3B by means of insulator 408. Advantageously the cost and complexity of electrode attachment is reduced in comparison to arrangements with separately placed LEDs 3A, 3B.

The illumination apparatus 100 further comprises mask regions 7 provided between each of the light emitting diodes 3 and the transmissive support substrate 50. The mask regions are opaque and typically reflective. Light from the LED 3 is not directly output from the illumination apparatus 100. Advantageously the visibility of hot spots is reduced. Further, light may be reflected from the mask regions, increasing efficiency.

The light emitting diodes 3A, 3B may be each provided with a wavelength conversion element 154. Wavelength conversion material and/or a light scattering material may be arranged in the wavelength conversion element 154 to receive light from the light emitting diodes 3, for example to convert blue output from gallium nitride (GaN) LEDs to white light or to scatter blue light. The wavelength conversion material may be a phosphor material or quantum dot material. Advantageously the present embodiments may achieve white light output with a narrow beam angle.

As illustrated in FIG. 5, the wavelength conversion elements 154A, 154B may be patterned to reduce leakage between the optical output of the respective LEDs 3A, 3B.

FIG. 6 differs from FIG. 5 in that the sub-array 33 is mounted with the electrodes 714, 719 and 406 arranged between the monolithic layer 400 and the mask 7. In the case that mask region 7 is metallic, mask region 7 may further form part of the electrical addressing connection to light emitting diodes 3A, 3B. Flip chip arrangements may be provided during transfer of the sub-arrays 33. Advantageously cost of providing electrodes 714, 719 may be reduced.

Other arrangements of light emitting diodes 3 within the sub-array 33 will now be described.

Figure 7:
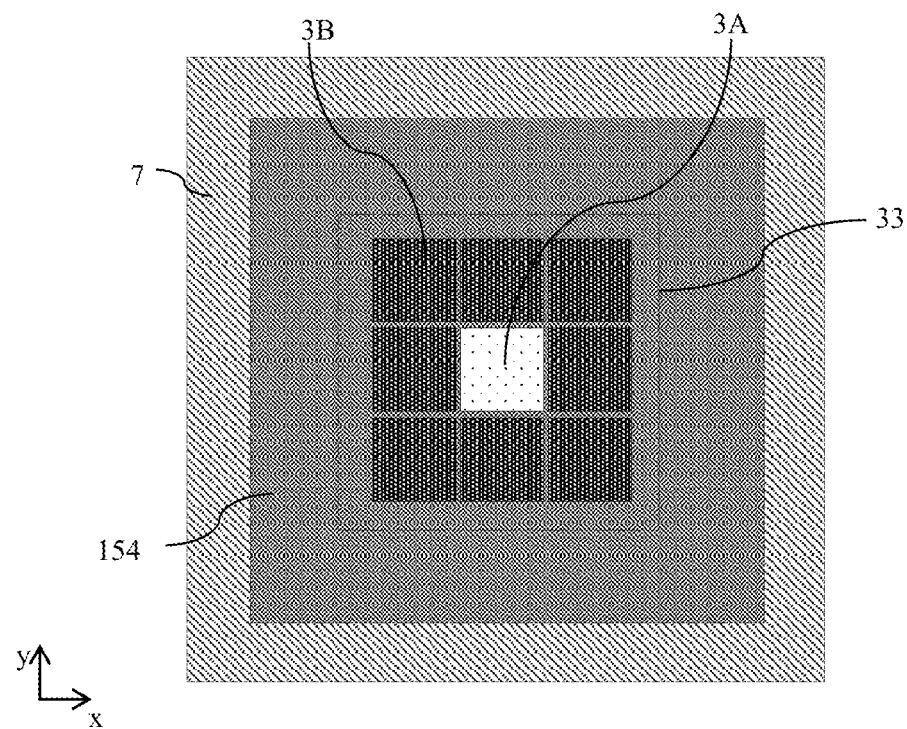
FIG. 7 is a schematic diagram illustrating in top view a sub-array of light emitting diodes comprising an array of light emission regions with two addressable output cone angles.
Figure 8:
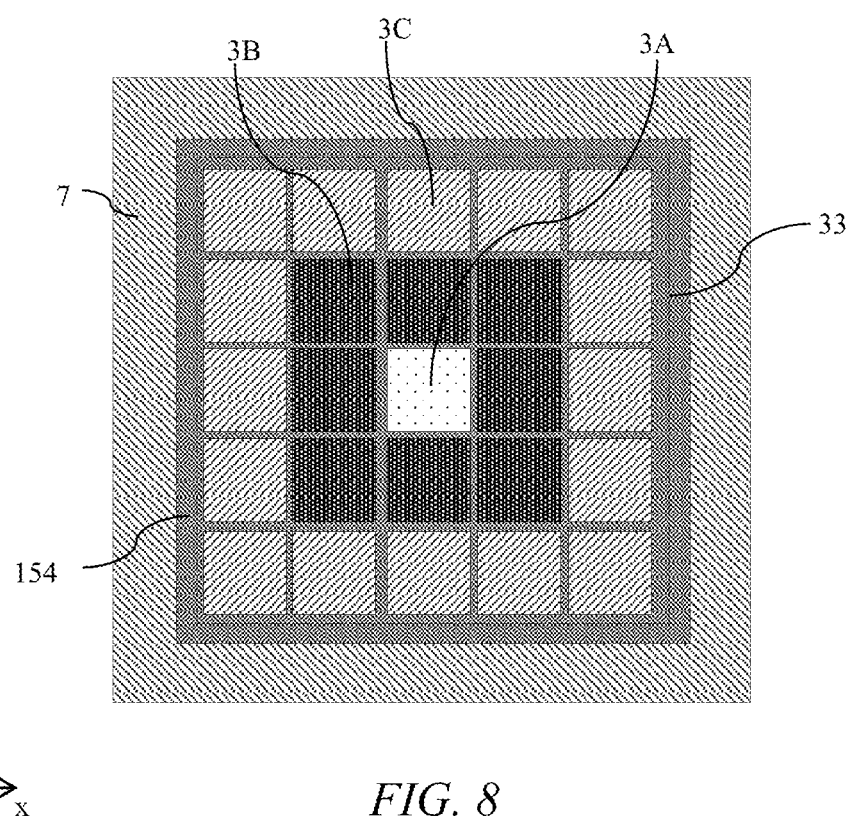
FIG. 8 is a schematic diagram illustrating in top view a sub-array of light emitting diodes comprising an array of light emission regions with three addressable output cone angles.

FIG. 7 is a schematic diagram illustrating in side view a sub-array 33 of light emitting diodes comprising an array of light emission regions with two addressable output cone angles 460, 462; and FIG. 8 is a schematic diagram illustrating in side view a sub-array of light emitting diodes comprising an array of light emission regions with three addressable output cone angles. Features of the arrangements of FIGS. 7-8 not discussed in further detail may be assumed to correspond to the features with equivalent reference numerals as discussed above, including any potential variations in the features.

FIG. 7 differs from FIG. 4 in that instead of being a continuous annular region, light emitting element 3B comprises separate light emitting regions. The separate light emitting regions may be connected in series or in parallel or in a combination of the two as will be explained further below. Advantageously the profile of light emission may be varied in different angular directions. Compensation for non-symmetric shape optical elements 38 may be provided. Advantageously spatial uniformity may be increased.

FIG. 8 differs from FIG. 7 in that a further set of light emitting regions comprising light emitting diodes 3C is provided. Such an array may provide further increase in cone size in comparison to cone 462 of FIG. 3. Advantageously further control of angular output profile may be provided, and wider viewing freedom may be achieved.

FIG. 8 differs from FIG. 4 in that the light emitting diode 3B is shaped as an annulus with a narrow gap. The electrode 719A which connects to light emitting element 3A passes though the gap. Electrode connections 719A and 719B to the light emitting elements 3A, 3B may be made without needing an insulator 408. Advantageously fabrication cost is reduced.

Other arrangements of light emitting diodes 3A, 3B will now be described.

FIGS. 9A-D are schematic diagrams illustrating in side view a sub-array of light emitting diodes comprising an array of light emission regions with two addressable output cone angles. Features of the arrangements of FIGS. 9A-D not discussed in further detail may be assumed to correspond to the features with equivalent reference numerals as discussed above, including any potential variations in the features.

Figure 9A:
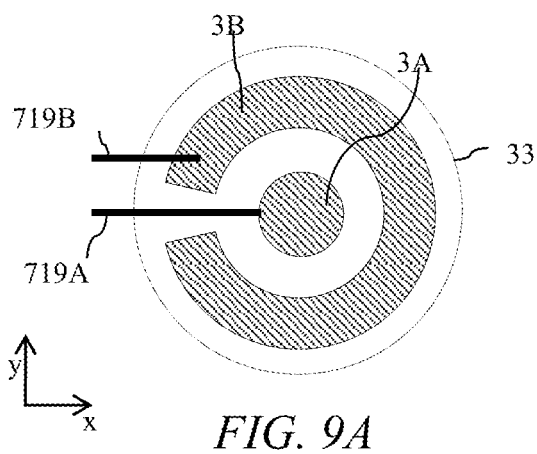
FIGS. 9A-D are schematic diagrams illustrating in top view sub-arrays of light emitting diodes comprising an array of light emission regions with two addressable output cone angles.

FIG. 9A differs from FIG. 8 in that the annulus forming light emitting elements 3B comprises separate light emitting elements. The separate light emitting elements 3B are shown connected in parallel to addressing electrodes 719A, 719B. When connected in parallel the driving voltage of the light emitting 3B is the same as for a single element and the current is larger. The drive voltages for light emitting diodes 3A, 3B may therefore be the same.

Advantageously the drive circuit may have fewer voltage rails and is therefore cheaper.

Figure 9B:
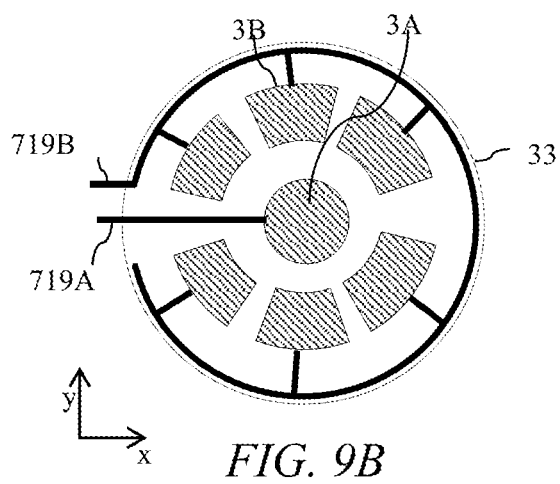

FIG. 9B differs from FIG. 9A in that the light emitting elements 3B are shown with individual electrode connections and therefore may be individually controlled. Individual control of the light emitting elements enables the optical uniformity of the illumination apparatus to be adjusted and improved.

Figure 9C:
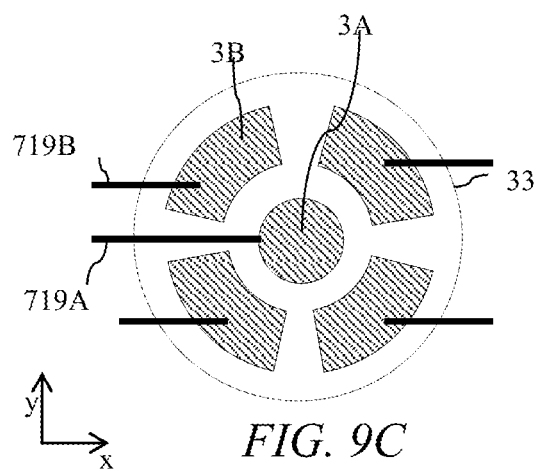
Figure 9D:
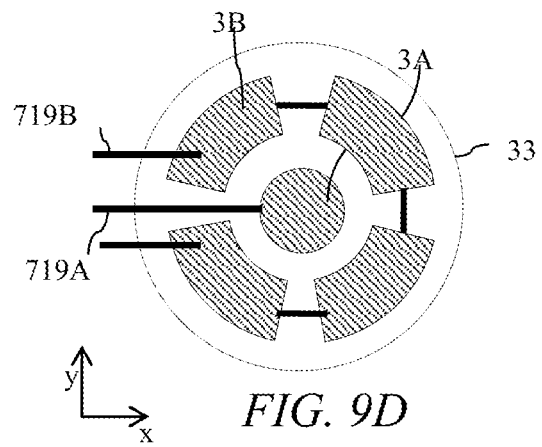

FIG. 9C differs from FIG. 9B in that the light emitting diodes 3B are connected in series. The electrode connection is therefore simpler, and the current through all the light emitting diodes 3B is the same, however the required operating voltage is increased compared to that of light emitting element 3A. The light emitting diodes 3B may be formed from more individual diodes shown and may be connected with a combination of series and parallel electrodes for example as shown schematically in the circuit of FIG. 14D below. Such a connection gives some resilience to failure of individual diodes. Advantageously the yield and reliability of the illumination apparatus is improved.

Other arrangements of light emitting diode sub-arrays will now be described.

Figure 10A:
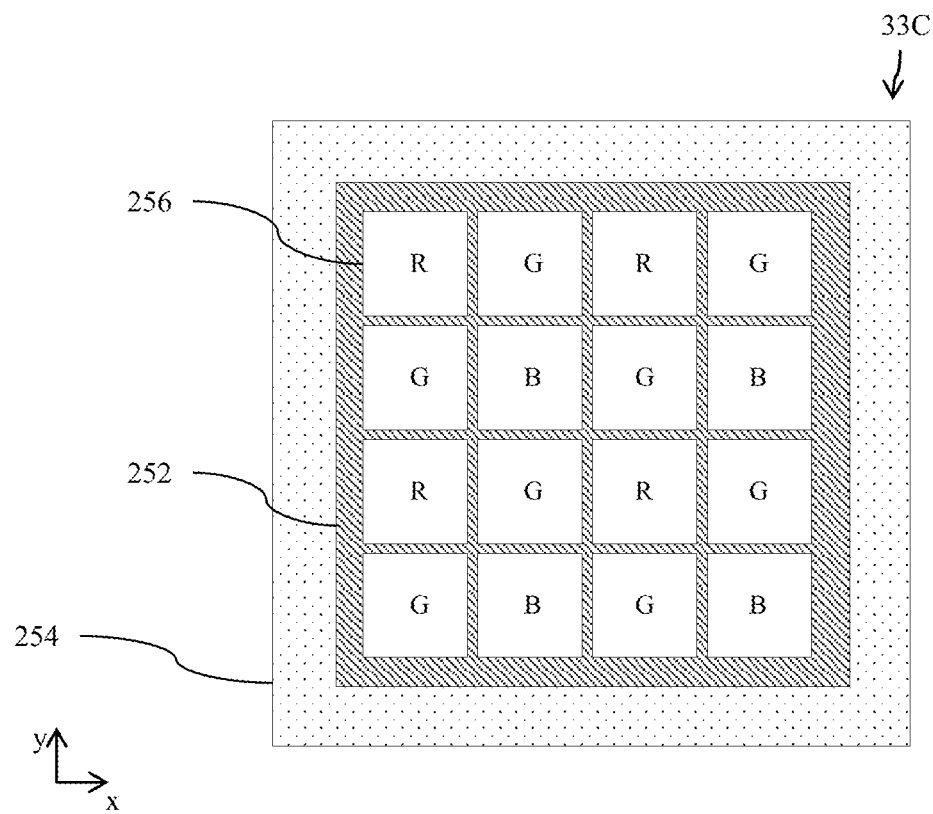
FIG. 10A is a schematic diagram illustrating in top view a sub-array of light emitting diodes comprising a pixel of an array of emitters.
Figure 10B:
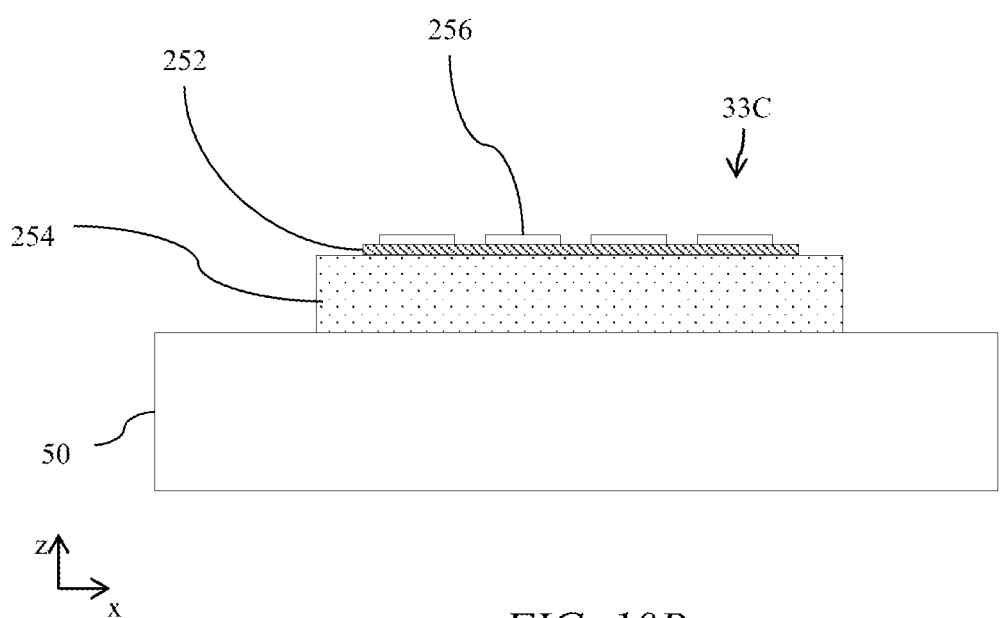
FIG. 10B is a schematic diagram illustrating in side view a sub-array of light emitting diodes comprising a pixel of an array of emitters.

FIGS. 10A-B are schematic diagrams illustrating in plan view and side view respectively a sub-array 33C of light emitting diodes comprising an array of light emission regions 256 that may be controlled as a white emitter. Features of the arrangements of FIGS. 10A-B not discussed in further detail may be assumed to correspond to the features with equivalent reference numerals as discussed above, including any potential variations in the features.

FIG. 10A differs from FIG. 8 in that the sub-array 33C comprising an R,G,B assembly 33C of LEDs 256 is driven together. The LEDs 256 may be for example be all blue emitting LEDs (not illustrated) formed from GaN that may comprise a colour conversion layer (not shown) to form a white emitter; may use multiple colour conversion materials to form a white emitter; or may be formed from different semiconductor materials that emit red, green and blue light. The sub-array 33C may be addressed or driven as a single white emitter or may form all or part of addressable light emitting elements 3A, 3B for example.

The LEDs 256 may be top emitting LEDs formed on a reflector 252 which may be a metal for example Au, Pt, Pd, Rh, Ni, W, Mo, Cr and Ti, or an alloy or a combination of them, and may optionally function as an electrode connection to the LEDs 256. The reflector 252 may serve as a common anode or a common cathode of the LEDs 256. Alternatively, the reflector 252 may be insulated from LEDs 256 by a transparent insulator (not shown). The reflector 252 and LEDs 256 may be formed on or assembled on an intermediate substrate such as a silicon substrate 254.

Figure 37A:
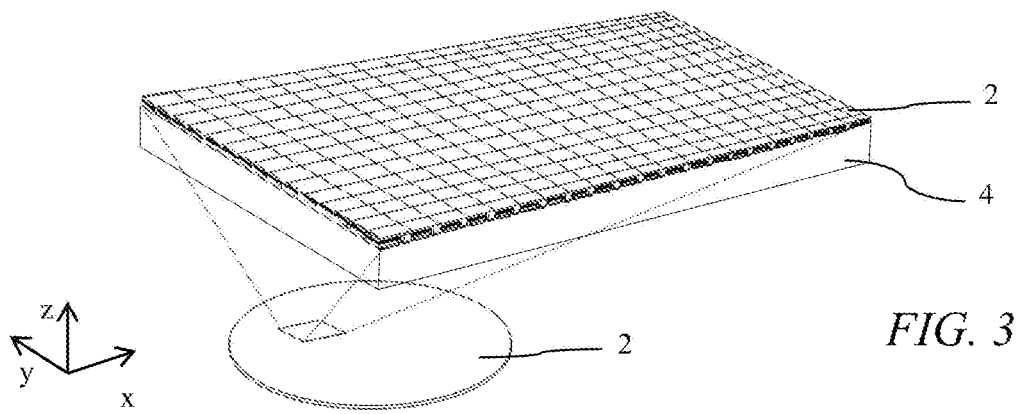
FIG. 37A is a schematic diagram illustrating in side perspective view a monolithic LED wafer.
Figure 37B:
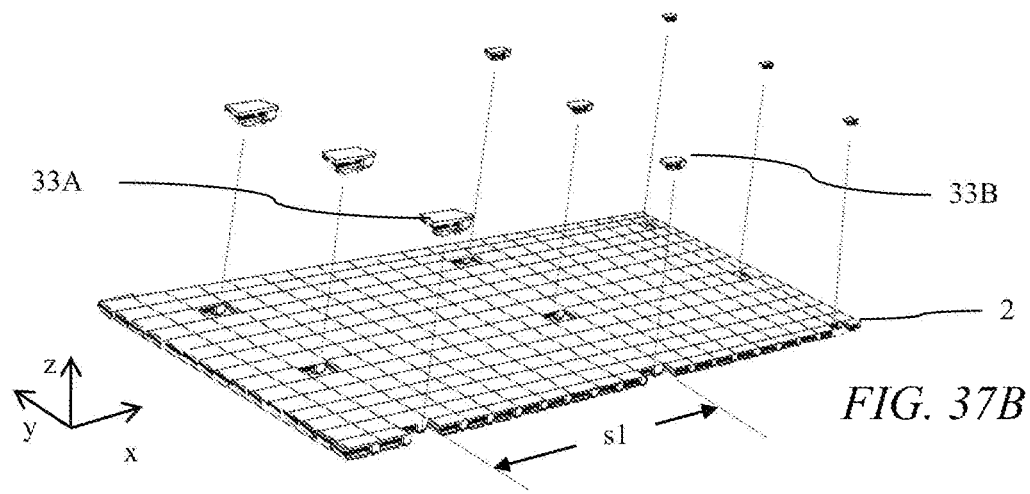
FIG. 37B is a schematic diagram illustrating in side perspective view extraction of a sparse array of sub-arrays from a monolithic LED wafer.

The R, G, B assembly from different semiconductor materials on to the silicon substrate 254 may be on to a silicon wafer using methods illustrated in FIGS. 37A, 37B. The sub-arrays 33C may then be subsequently singulated from the silicon wafer substrate again by means of a process illustrated in FIG. 37 to form an emitter in a sparse emitter array of many sub-arrays 33C on glass substrate 50. The silicon substrate 254 may be a substrate or may itself incorporate some circuitry such as storage, memory and driving electronics, or be an integrated circuit such as that illustrated in FIGS. 13A-C and FIGS. 14A-D.

FIGS. 11A-G are schematic diagrams illustrating in plan view arrangements of emitters and inter-emitter electrode connections in a sub-array of light emitting diodes comprising an array of light emission regions that may be controlled as a single white emitter. Features of the arrangements of FIGS. 11A-B not discussed in further detail may be assumed to correspond to the features with equivalent reference numerals as discussed above, including any potential variations in the features.

Figure 11A:
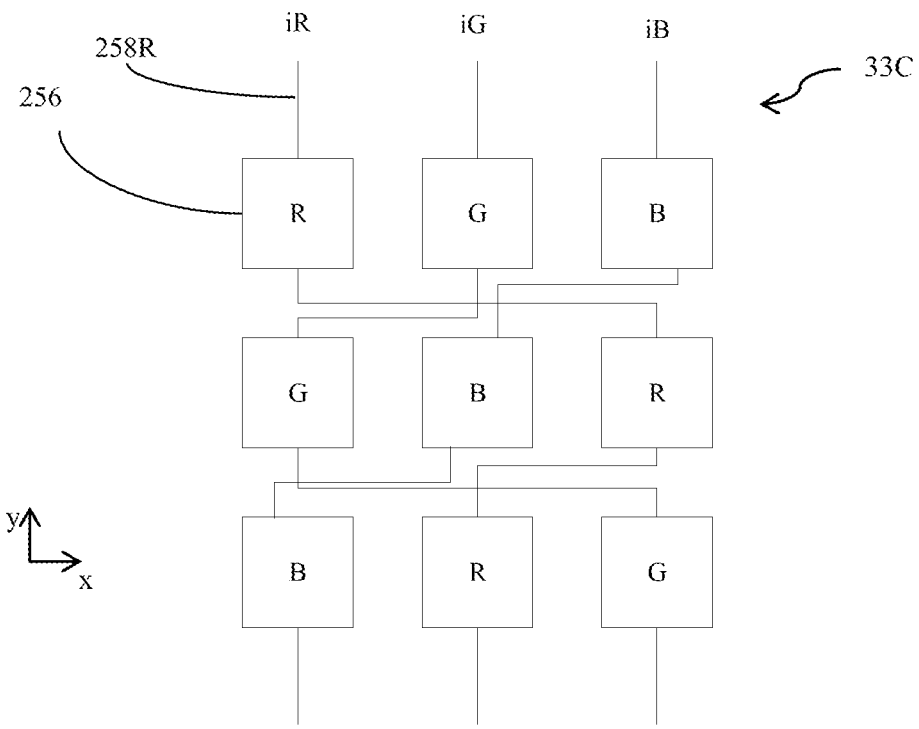
FIGS. 11A-G are schematic diagrams illustrating in plan view sub-arrays of light emitting diodes each comprising an array of light emission regions.

FIG. 11A differs from FIG. 8 in that the sub-array 33C comprises LEDs 256 forming an emitter. The red light emitters from LEDs 256 forming the emitter are electrically connected in series by schematically illustrated electrode 258R and share a common current iR. Similarly, the green and blue emitting LEDs 256 are respectively wired in series. By altering the respective individual currents iR, iG, iB the intensity of the sub-array 33C and its white point may be controlled.

Figure 11B:
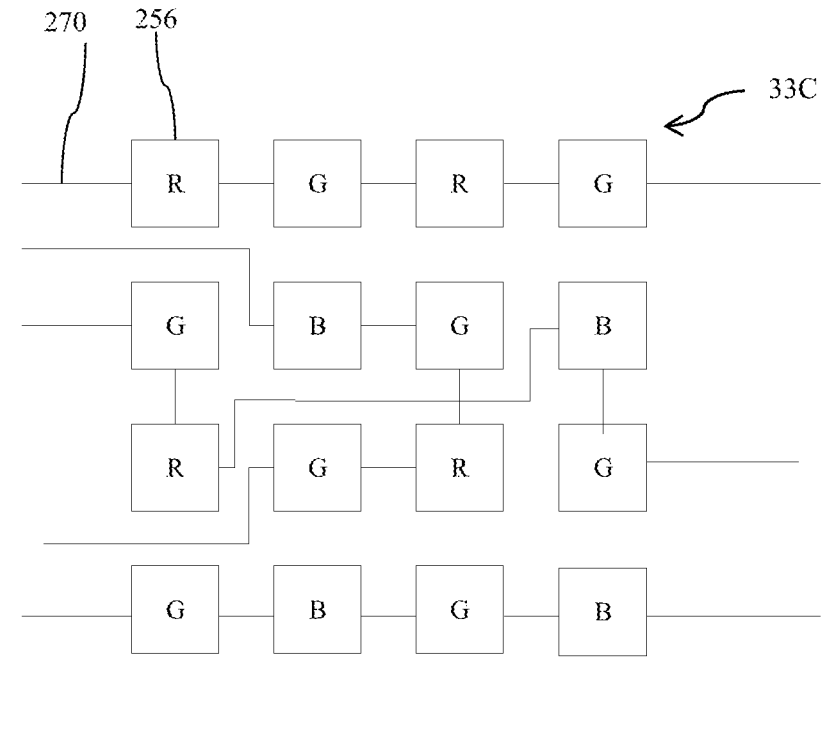

FIG. 11B differs from FIG. 11A in that the LEDs 256 are formed in a sub-array 33C comprising R,G,G,B emitters. This arrangement may provide more luminance in the green area of the spectrum to which the eye is more sensitive and thus form a brighter source with less emitter elements. In this case the R,G,G,B elements are wired in series strings illustrated schematically electrodes 270. This differs from FIG. 11A in that this connection arrangement keeps the voltage on each string the same even if the forward voltages of the LEDs themselves vary across the different R, G, B. This can simplify the drive circuit and reduce power consumption. The individual R,G,G,B strings may be connected with a common anode or a common cathode connection (not illustrated) or may be further connected in series which reduces the number of connection to the emitter at the expense of needing a higher drive voltage. Keeping the separate connections as shown rather than having one series string at the emitter provides some fault tolerance because a single open circuit device does not prevent the entire sub-array 33C from emitting FIG. 11C differs from FIG. 11B in that the sub-array 33C is formed from series connected RGB LEDs addressed by electrodes 262.

Figure 11C:
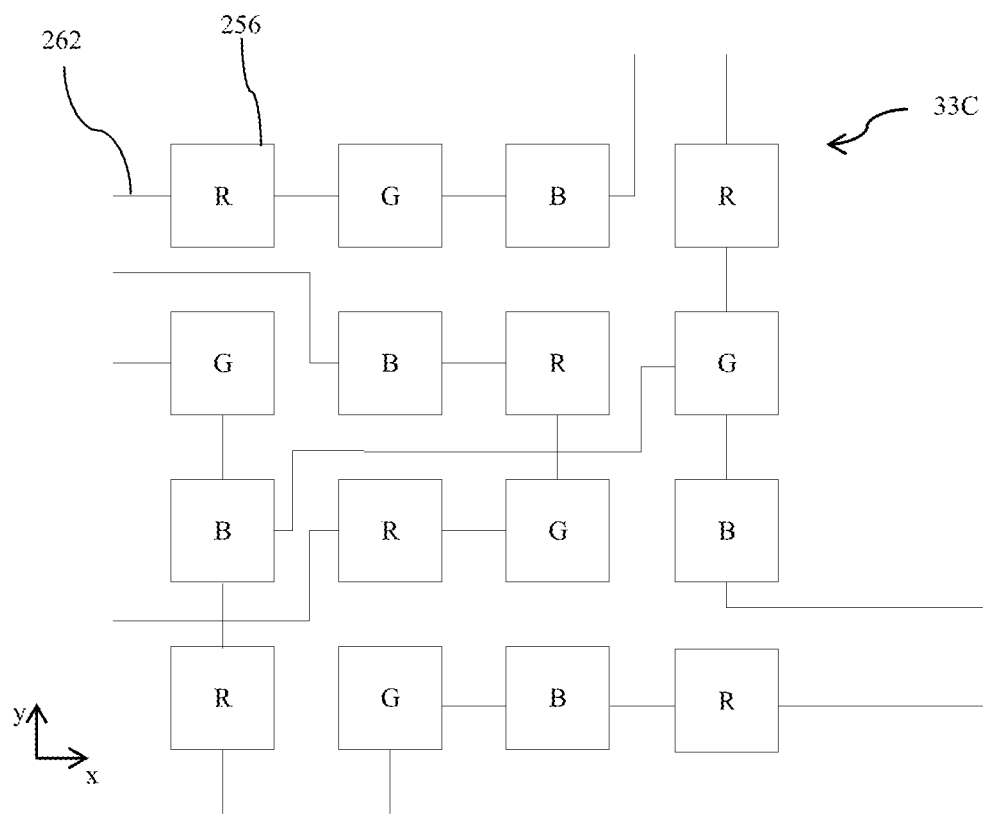
Figure 11D:
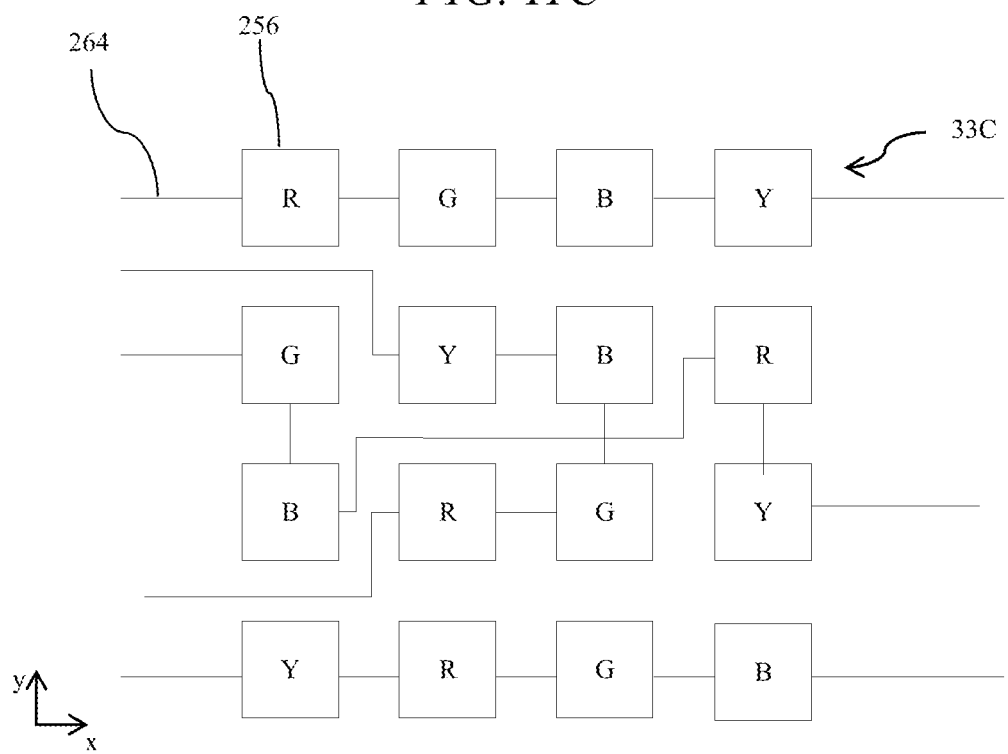

FIG. 11D differs from FIG. 11A in that the sub-array 33C is formed from R,G,B,Y LEDs where Y represents a yellow or amber emitter. Such an arrangement of LEDs can improve the colour rendering index of the light from the sub-array 33C.

Figure 11E:
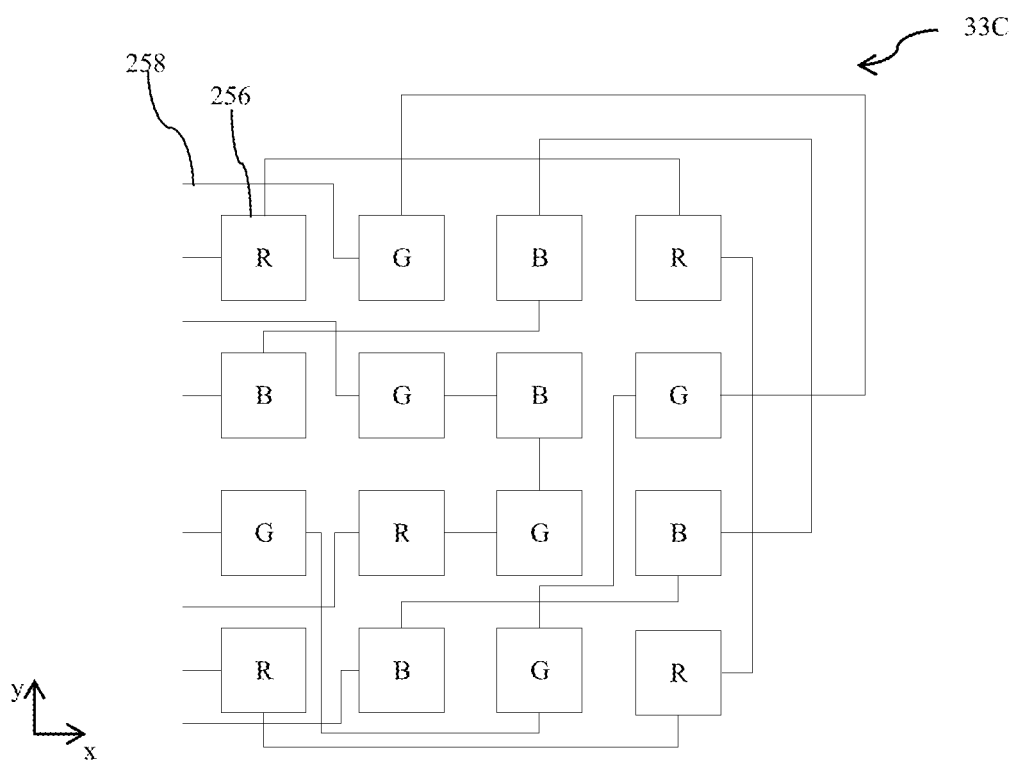

FIG. 11E differs from FIG. 11C in that the sub-array 33C is formed from LEDs 256 in a 4×4 array in which the R, G, B elements are respectively connected in series by electrodes 258. Again, separating the control of the R, G, B elements of the sub-array 33C enables the white point of the sub-array 33C to be controlled. However, each electrode 258 will have a different voltage supply if the forward voltage of the R, G, B LEDs 256 are different.

Figure 11F:
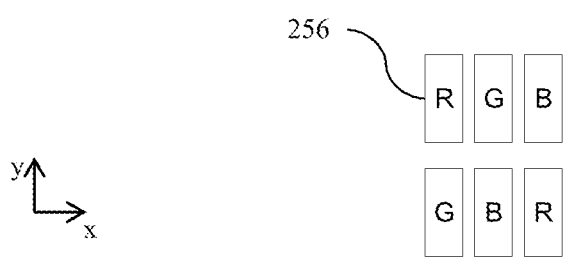
Figure 11G:
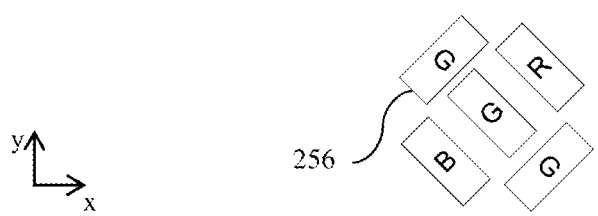

FIGS. 11F-G differ from FIG. 11B in that the sub-array 33C is formed from LEDs 256 that are rectangular. The LEDs may be positioned in a rectangular matrix as illustrated in FIG. 11F, which achieves high packing density, or may be positioned in a diamond shape which produces a more circularly symmetric source as illustrated in FIG. 11G which may better match circularly symmetric optics as illustrated in FIG. 1 for example. The LEDs 256 may be for example R,G,G,B or R,G,B,Y or all Blue emitters or other emission colour combinations.

Other spatial arrangements of LED emitter shape, colour of emitters and electrode connections topologies are possible and will be appreciated from the teaching above.

Figure 12A:
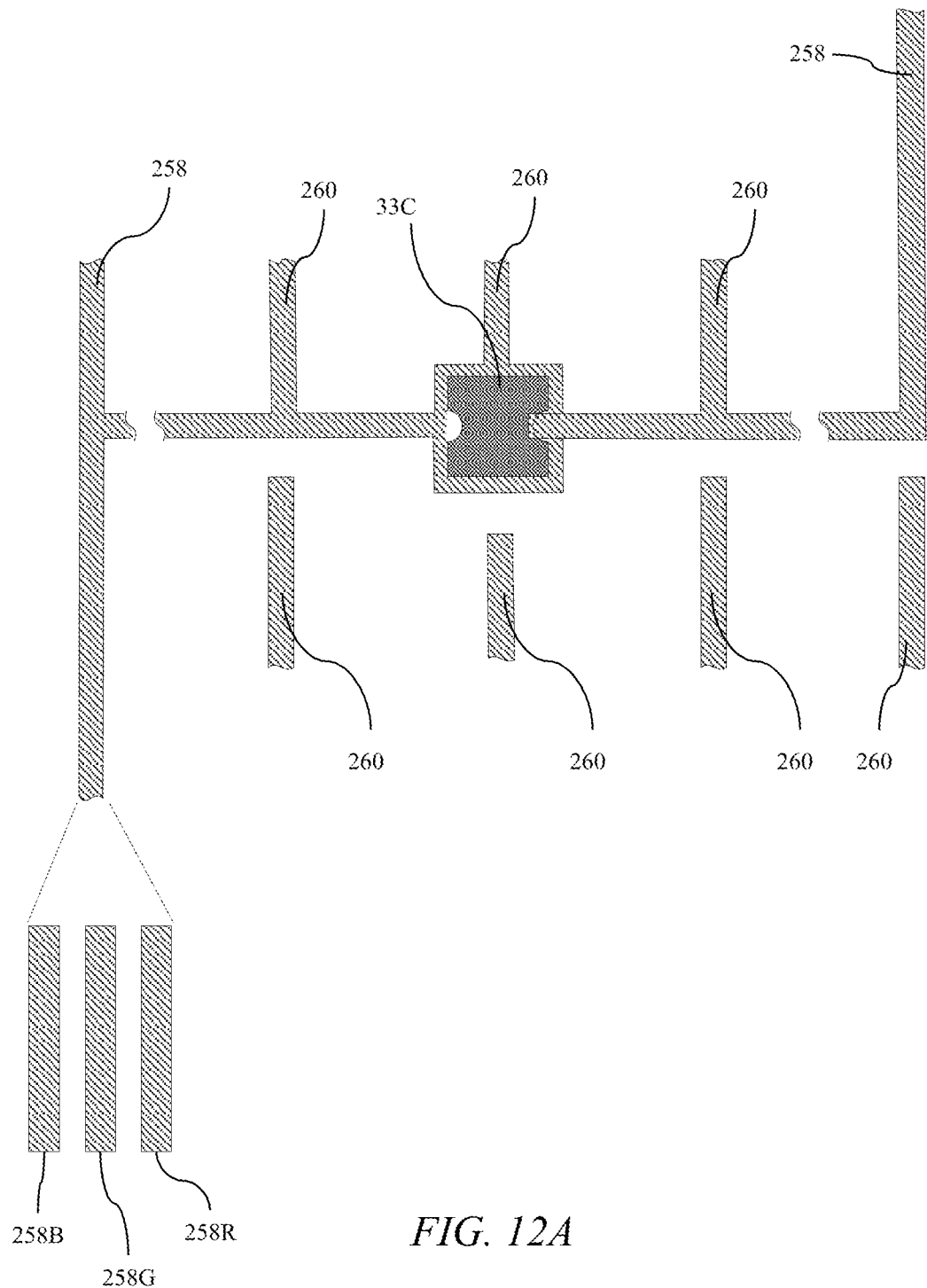
FIG. 12A-B are schematic diagrams illustrating in plan view connections of a sub-array to addressing electrodes of a larger array of pixels.

FIG. 12A illustrates a schematic view of the connections to the sub-array 33C forming an emitter of the illuminator such as a display or backlight or environmental lighting apparatus. The anode and cathode connections to the LED emitters 256 are made by electrodes 258. After making connection to the sub-array 33C these may extend horizontally or vertically towards a connection with a further addressing circuitry which may be located at the edge of the panel or integrated within the panel itself. The electrodes 258 may comprise separate electrodes 258R, 258B and 258G, or other arrangements as may be understood from FIG. 11A-E, arranged parallel with each other as illustrated.

FIG. 12A also illustrates balance electrodes 260. The balance electrodes are not needed for electrical addressing purposes and may be arranged so that they do not connect to either the anode or cathode electrodes 258.

Figure 12B:
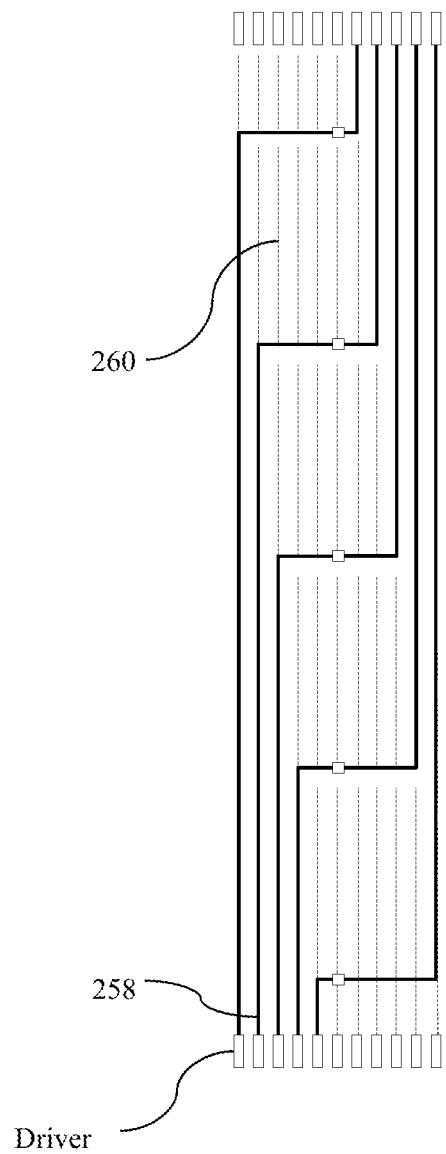

FIG. 12B illustrates that the balance electrodes 260 are present to balance the spatial optical absorption though the substrate 50. As such they fill the gaps between the anode and cathode connections to the LEDs 256 of the sub-array 33C at the same spatial density as the electrodes 258 used for addressing the sub-array 33C. Alternatively the balance electrodes 260 may be connected to convenient anode and cathode electrodes 258 without causing an electrical short of the LEDs of the sub-array 33C. In this way the balance electrodes 260 may be prevented from accumulating a charge that cannot then be discharged. FIG. 12B illustrates the electrode structure 258 of FIG. 12A to five sub-arrays 33C. Balance electrodes 260 are arranged in gaps between addressing electrodes are filled in by. Advantageously a uniform output luminance is achieved.

Control systems to drive light emitting diodes 3A, 3B will now be described.

Figure 13A:
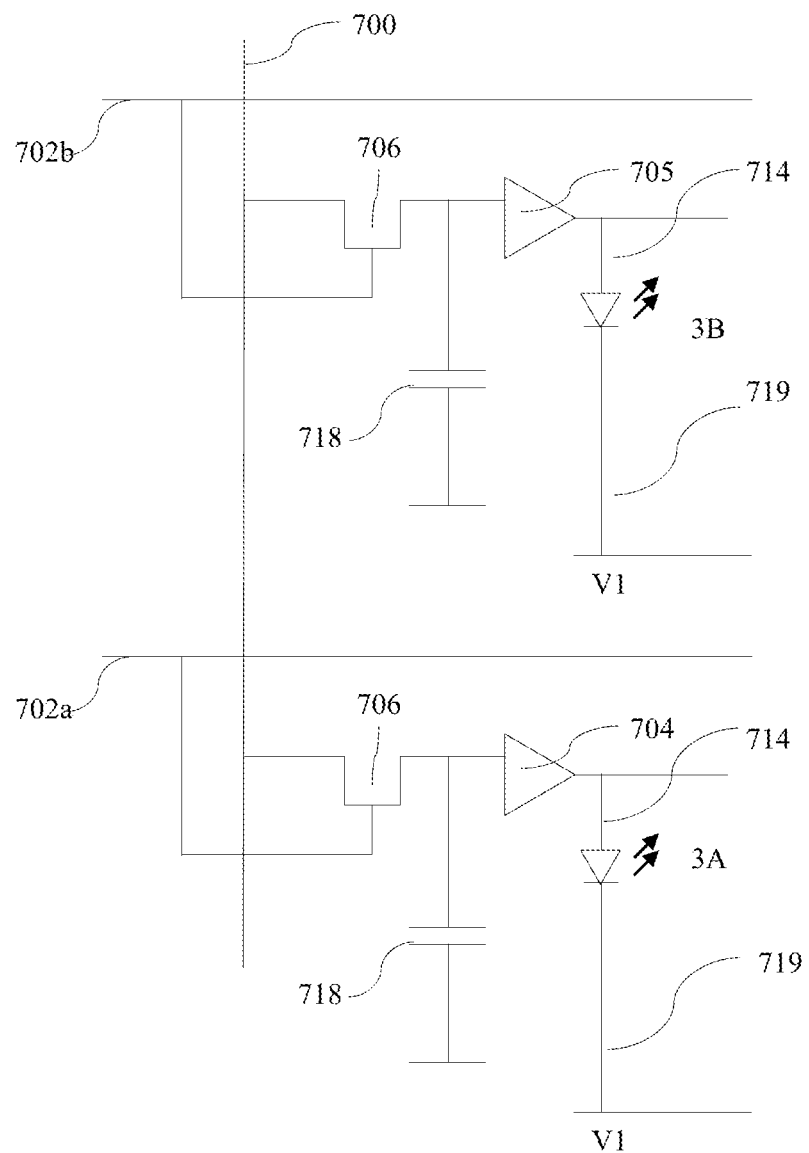
FIGS. 13A-C are schematic diagrams illustrating addressing schemes for the plurality of LEDs.

FIG. 13A is a schematic diagram illustrating an addressing embodiment for the plurality of LEDs. The LEDs 3A, 3B of the plurality LEDs are addressed by column addressing electrodes 700 and row addressing electrodes 702a, 702b to form a 1-dimensional or 2-dimensional matrix or array. The drive circuit comprises TFT 706, amplifier 704 and 705 and capacitor 718. In this embodiment row electrodes 702a, 702b are connected to the gate of TFT 706 and when the row addressing electrode 702a or 702b is pulsed, the data from column addressing electrode 700 is stored on capacitor 718. Electrodes 702a and 702b provide separate addressing or control of LEDs 3A, 3B. Capacitor 718 may be small compared to that typically used in a matrix to drive an LCD panel and may be provided by the input capacitance of amplifier 704. The amplifier 704 may drive one or more LEDs 3A.

Amplifier 704 may be provided with 1 or more supply voltages (not shown). Amplifier 704 may include a voltage to current converter circuit. Amplifier 704 may drive one or more strings of one or more LEDs 3A. Amplifier 705 may be more powerful than amplifier 704 in order to drive the larger area of LEDs 3B. The voltage rail V1 may be selected to enable sufficient current to flow through the LEDs 3A, 3B without creating excessive power dissipation in amplifier 704. This circuitry may be replicated for each of the array of LEDs 3A, 3B so that an image may be displayed.

The LEDs 3A, 3B of the LED array may be driven from a common row addressing electrode 700 and have separate column addressing electrodes 700. This embodiment needs more column addressing circuits compared with the illustration in FIG. 8 which needs more row addressing circuits.

Figure 13B:
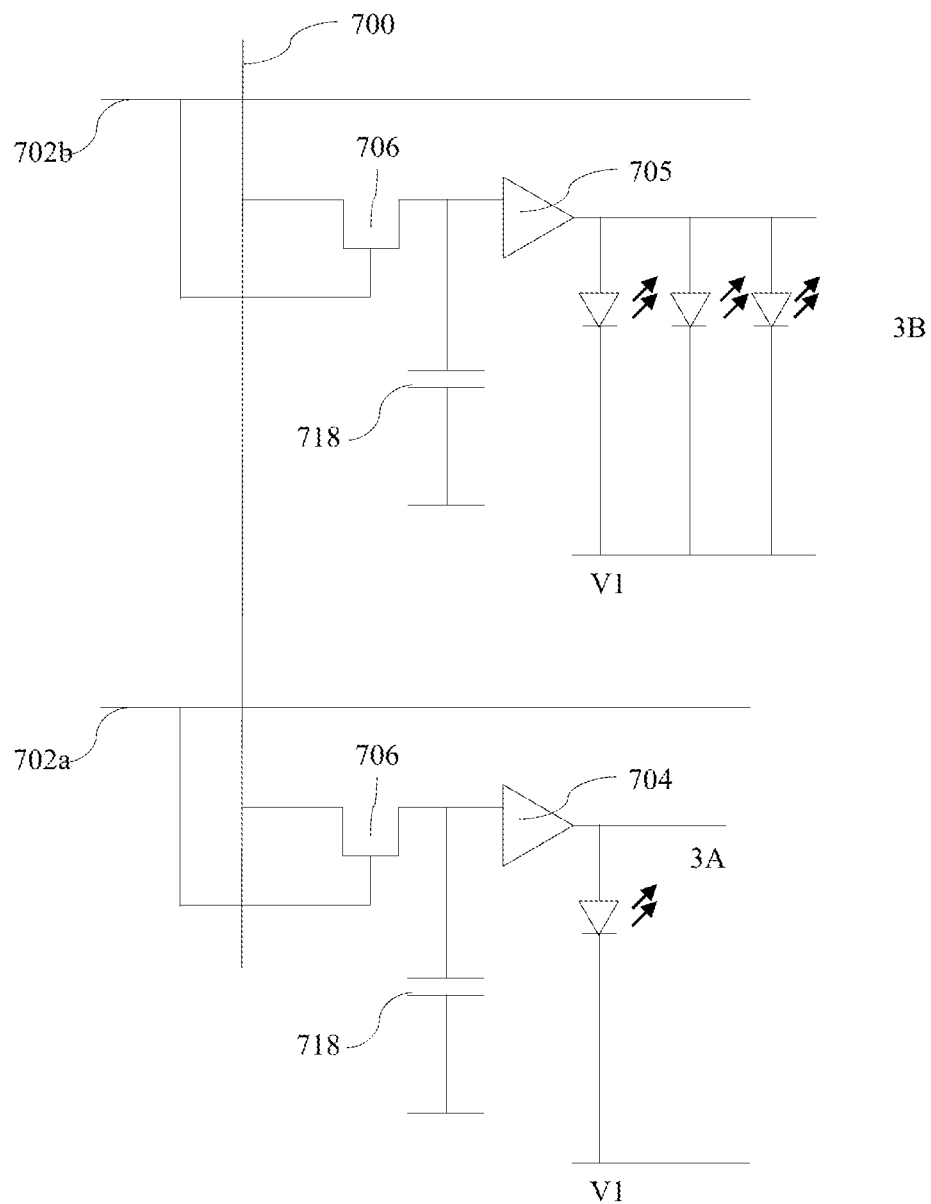

FIG. 13B is a schematic diagram illustrating a further addressing embodiment for the plurality of LEDs 3A, 3B of the sub-array 33. The LEDs 3B are individually provided as shown in FIG. 7 rather than as a continuous region or annulus. Three LEDs of the set forming LEDs 3B at are shown connected in parallel. Other numbers of LEDs 3B from the set may be driven in parallel for example 9.

The LEDs 3A, 3B of each emitter may be addressed with a common column or a common row as described above.

Figure 13C:
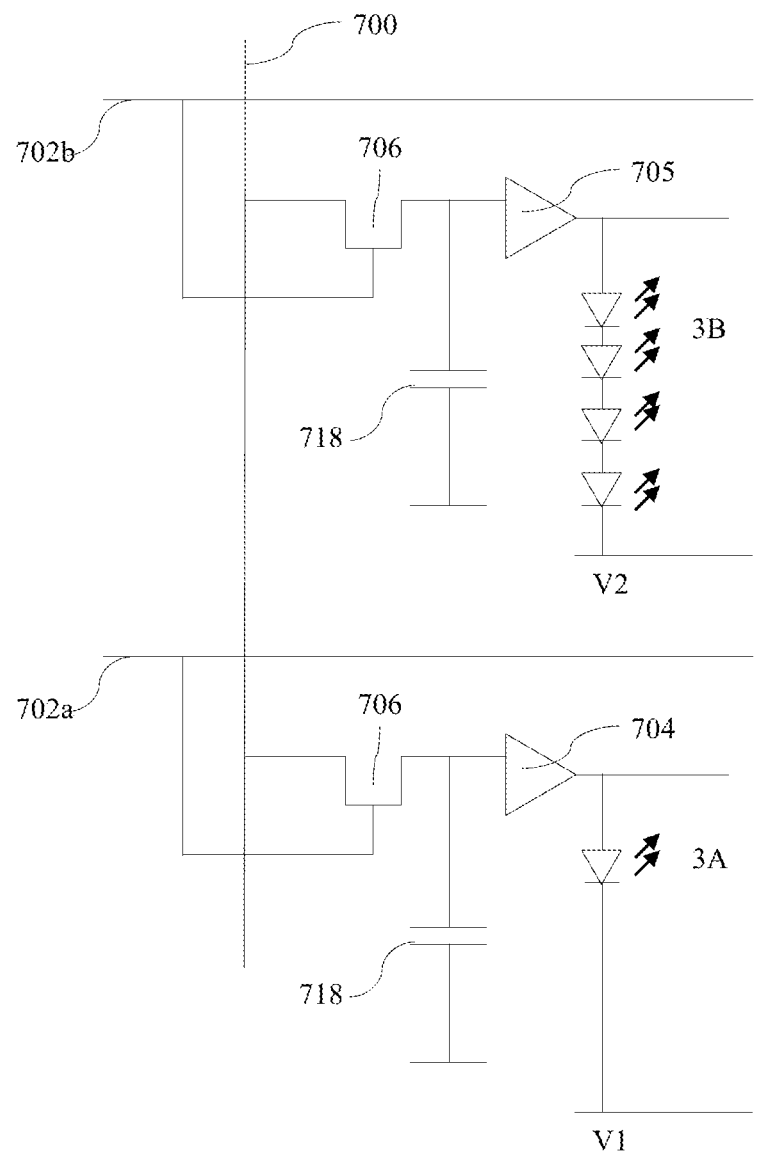

FIG. 13C is a schematic diagram illustrating a further addressing embodiment for the plurality of LEDs 3A, 3B. In this embodiment the light emitting diodes 3A, 3B are individually provided as shown in FIG. 7 and in this case the light emitting diodes 3A, 3B are connected in series. In this case the current in amplifier 704, 705 will be similar however the voltage rails V1 and V2 may be different to take account of the forward voltage drop of the series connected light emitting diodes 3A, 3B.

Further addressing schemes will now be described.

Figure 14A:
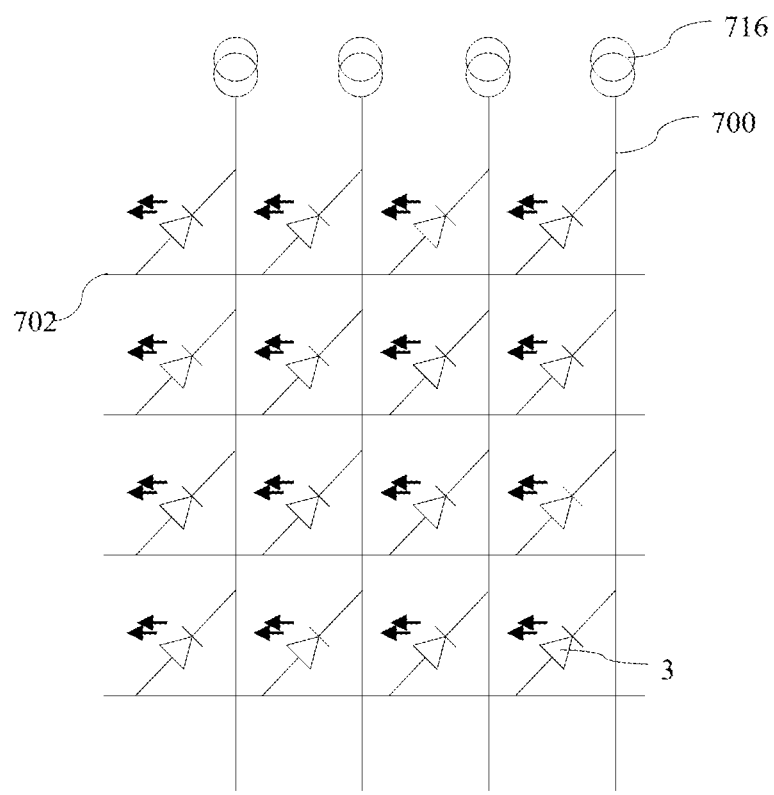
FIGS. 14A-D are schematic diagrams illustrating addressing systems for the plurality of LEDs.

FIG. 14A is a schematic diagram illustrating an addressing system for the plurality of LEDs.

The LEDs 3A, 3B may also be controlled by a passive addressing matrix as described in FIG. 14A. The electrodes of each of the light emitting diodes 3 of the plurality light emitting diodes 3A, 3B are respectively connected to one column addressing electrode 700 and one row addressing electrode 702 to form a matrix. In this embodiment an array of current sources 716 is used to drive the addressing electrodes 700. The voltage on each of the row electrodes 702 is pulsed in sequence to scan or address the array of light emitting diodes 3. A current source 716 may be provided for each column electrode 700 or may be time multiplexed (shared) amongst a set of column electrodes 700. The light emitting diodes 3 have a relatively sharp voltage vs. current curve and can be operated with very short pulses without cross-talk between them. The array of light emitting diodes 3 forms an addressable illumination apparatus 100 or a display without the need for additional active components such as TFTs or integrated circuits at each emitter. However, all the energy to illuminate the LEDs must be provided during the addressing pulse. In addition, some LEDs of the passive matrix array will experience a reverse bias voltage, which may damage the LEDs is too high or passing too much current. Advantageously the addressing matrix is simple and low cost.

It would be desirable to reduce the peak LED current while maintaining light output levels.

Figure 14B:
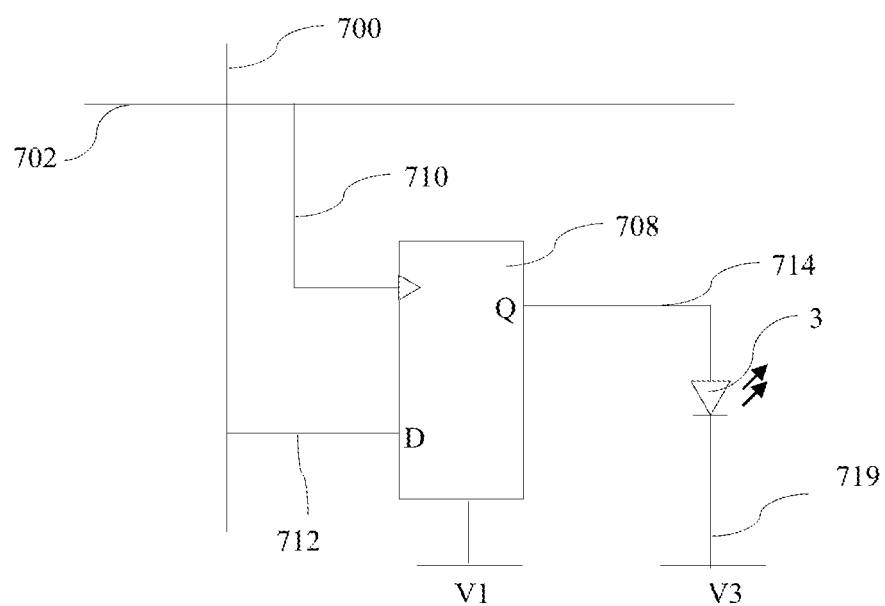

FIG. 14B is a schematic diagram illustrating another addressing embodiment for the plurality of LEDs. The light emitting diodes 3 of the plurality light emitting diodes 3A, 3B are addressed by column addressing electrodes 700 and row addressing electrodes 702 to form a one-dimensional or two-dimensional matrix. For clarity only one LED 3 and one column electrode 700 and one row electrode 702 of the matrix is shown. FIG. 14B differs from FIG. 14A in that each LED 3 has associated with it an integrated circuit 708 which includes a storage or memory or latching function. The integrated circuit 708 may be an analog or digital circuit and may be embodied as a separate chip located using a method that is similar to the LED 3 location method or may be embodied with TFTs. The integrated circuit 708 may be provided with one or more additional supply potentials V1, V2 (only V1 shown). When the row electrode 702 is pulsed the clock input 710 of integrated circuit 708 stores the column electrode 700 voltage connected to the Data input 712. The output 714 of the integrated circuit 708 drives the LED 3. The other end of the LED is connected to supply potential V3. The integrated circuit 708 may include a voltage to current converter. The potential V3 and the anode and cathode connections of the LED 3 may be configured so that the LED is forward biased and emits light. The integrated circuit 708 provides drive to the LED 3 for longer than the duration of the addressing pulse on row electrode 702 and the peak current drive to the light emitting diodes 3A, 3B is reduced. Advantageously the peak current in each LED 3A, 3B is reduced.

Figure 14C:
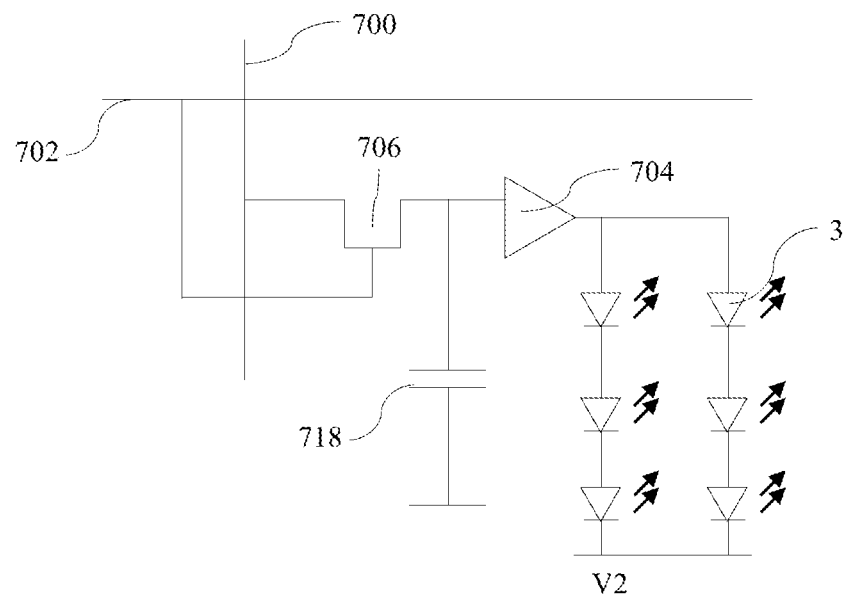

FIG. 14C is a schematic diagram illustrating another addressing embodiment for the plurality of LEDs. The light emitting diodes 3 of the plurality light emitting diodes 3A, 3B are addressed by column addressing electrodes 700 and row addressing electrodes 702 to form a 1-dimensional or 2-dimensional matrix or array. Drive circuit comprises TFT 706, amplifier 704 and capacitor 718. In this embodiment row electrodes 702 is connected to the gate of TFT 706 and when the row addressing electrode 702 is pulsed, the data from column addressing electrode 700 is stored on capacitor 718. Capacitor 718 may be small compared to that typically used in a matrix to drive an LCD panel and may be provided by the input capacitance of amplifier 704. The amplifier 704 may drive one or more light emitting diodes 3A, 3B. Amplifier 704 may be provided with one or more supply voltages (not shown). Amplifier 704 may include a voltage to current converter circuit. Amplifier 704 may drive one or more strings of one or more light emitting diodes 3A, 3B. In this example embodiment two strings of three light emitting diodes 3A, 3B are illustrated. The other end of the strings of light emitting diodes 3A, 3B is connected to potential V2, and the voltage output from amplifier 704 must be greater than voltage V2 by the combined forward voltage drop (Vf) of the string of light emitting diodes 3A, 3B in order for the light emitting diodes 3A, 3B to illuminate.

It would be desirable to provide some resilience of the display or illumination apparatus 100 to failure of individual light emitting diodes 3A, 3B. The failure may be an open circuit which may be caused for example by mis-placement of light emitting diodes 3A, 3B in manufacture or may be a short circuit for example from damaged electrode wiring.

Figure 14D:
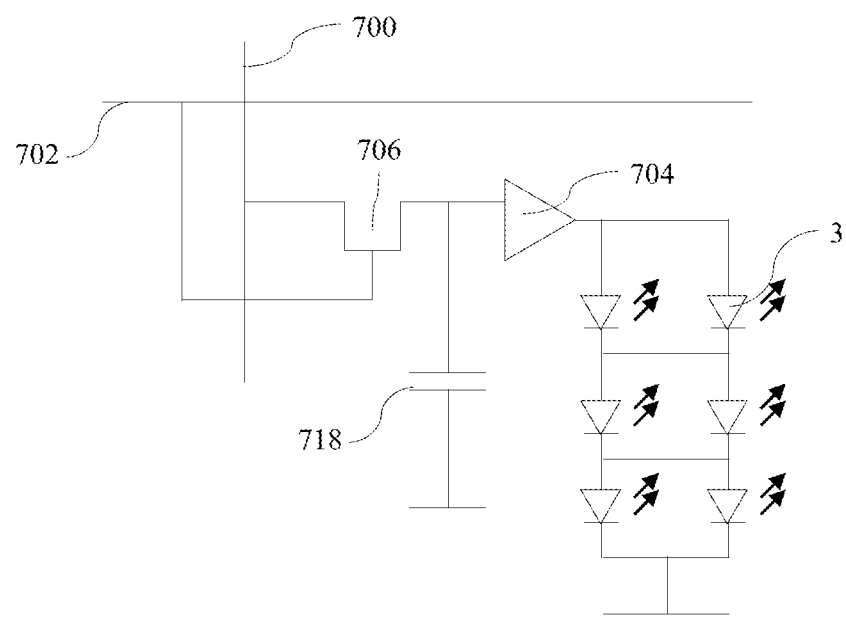

FIG. 14D is a schematic diagram illustrating another addressing embodiment for the plurality of LEDs. The light emitting diodes 3A, 3B of the plurality light emitting diodes 3A, 3B are addressed by column addressing electrodes 700 and row addressing electrodes 702 in a one-dimensional or two-dimensional matrix. In this embodiment the light emitting diodes 3A, 3B are arranged in bridged strings. This configuration provides some immunity to individual LED 3 being open circuit or short circuit. Advantageously the display or illumination apparatus 100 can be fault tolerant and more reliable.

Features of the arrangements of FIGS. 13A-C and FIGS. 14A-D not discussed in further detail may be assumed to correspond to the features with equivalent reference numerals as discussed above, including any potential variations in the features.

Further description of the structure and operation of the reflective surface 64 of the optical element 38 will now be given.

FIGS. 15A-G illustrate circuit diagrams of local connections within a sub-array 33C. Advantageously the number of addressing electrodes 258 needed may be reduced, when using a large number of small LEDs 256 to achieve the desirable luminance.

Combinations of 2, 3 or 4 LEDs are shown but more complex combinations can be readily appreciated. Two or more emitting LEDs 256 may be connected in series, however if one LED 256 fails open circuit then then all in that series string go off. Two or more LEDs 256 may also be connected in parallel however the most efficient of the parallel string set tends to hog the most current. Advantageously current hogging may be reduced by incorporating sharing resistors 272.

Also illustrated in FIGS. 15E-G are example embodiments with four LEDs 256 connected in series and parallel, with a bridging electrode to give some fault tolerance and with sharing resistors 272.

Figure 16A:
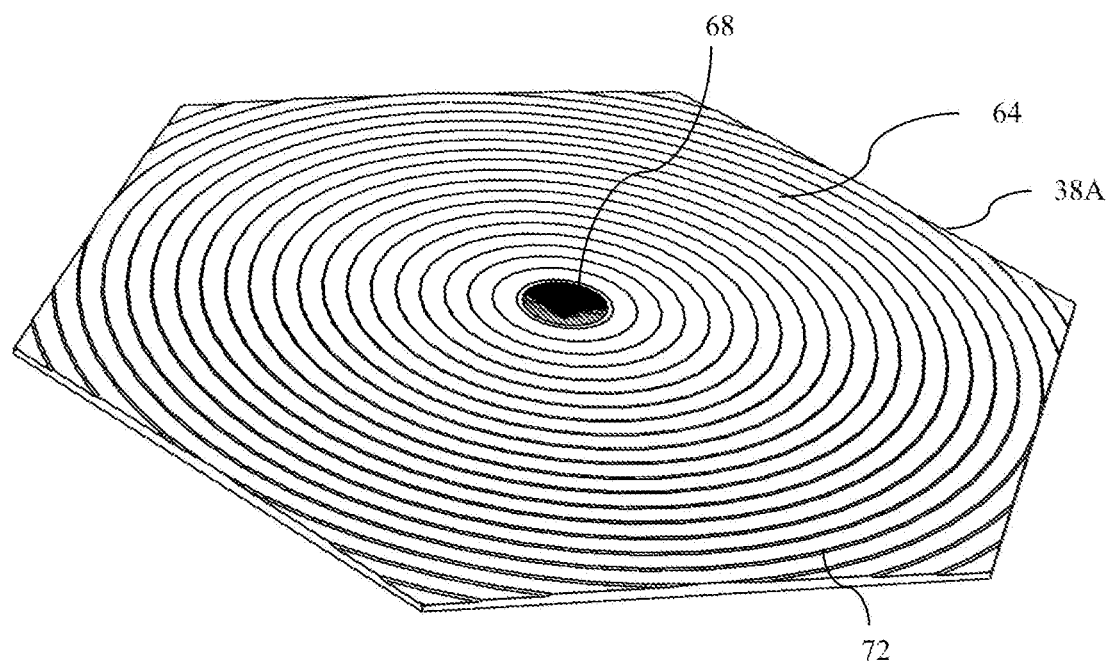
FIG. 16A is a schematic diagram illustrating in side perspective view a rear reflective surface for a backlight.

FIG. 16A is a schematic diagram illustrating in side perspective view a reflective surface 64 for a collimating optical element 38 unit cell. One unit cell 38A of the illumination apparatus 100A comprises reflective surface 64 with optical axis 11, input region 68 and light extraction facets 72. The unit cell may be hexagonal as illustrated, square or other packing arrangement. Features of the arrangement of FIG. 16A not discussed in further detail may be assumed to correspond to the features with equivalent reference numerals as discussed above, including any potential variations in the features.

Each optical element 38 has mirror symmetry about an optical axis 11 in all cross-sectional planes around the optical axis 11. Advantageously high uniformity may be provided over a large area. The spacing of LEDs may be increased, reducing cost and complexity of manufacture.

In a case that the optical elements have mirror symmetry about an optical axis in all cross-sectional planes around the optical axis, then the optical elements have rotational symmetry about the optical axis. In this case, the optical elements may be arranged in a two dimensional array.

In the embodiments of FIGS. 1-2 the transmissive surface 62 of each optical element 38 is planar. The operation of the refractive planar input surface 62 of FIGS. 1-2 will now be described.

Figure 16B:
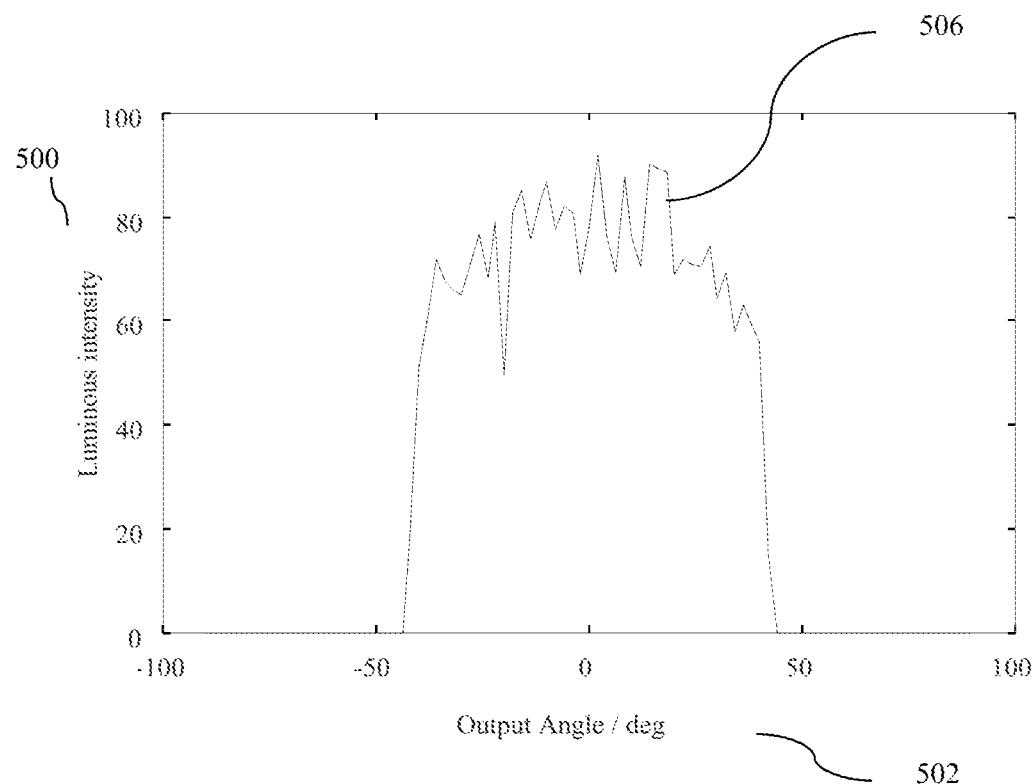
FIG. 16B is a schematic graph illustrating in at least one cross-sectional plane the simulated profile of output luminous intensity with illumination angle from a planar transmissive input surface 62 onto a detector plane.

FIG. 16B is a schematic graph illustrating in at least one cross-sectional plane the simulated profile 506 of input luminous intensity 500 within the waveguide with illumination angle 502 from a planar transmissive input surface 62 onto a detector plane 17 of FIG. 2 near the planar input surface 62.

The LEDs 3 are simulated with a Lambertian output profile, that is the luminous intensity varies as the cosine of the output angle. The profile 506 arises from the refraction of this output at the planar input surface 62 and has desirable features. First, the light is constrained with the critical angle in the medium of the waveguide 1. Further, the profile 506 of luminous emittance has a small variation with angle within the waveguide, such that high uniformity at the reflective input structure 68 is provided, and high uniformity of luminance may be provided within the waveguide 1. Advantageously alignment tolerances may be relaxed, and uniformity may be increased.

The waveguide 1 may be considered as a catadioptric optical element in that it combines refraction at the input surface 62 and reflection at the reflective surface 64.

The operation of light extraction facets 72 will now be described.

Figure 17A:
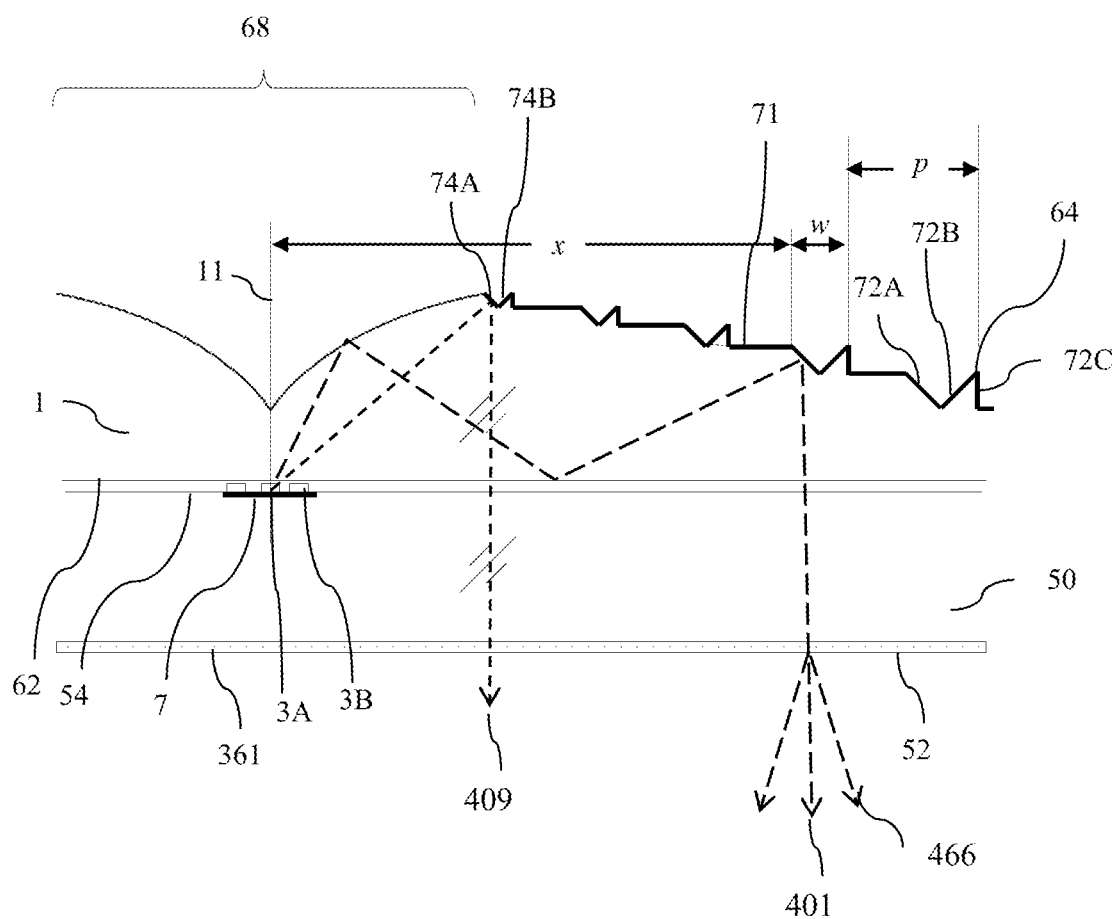
FIG. 17A is a schematic diagram illustrating in side view light paths in the optical structure comprising the rear reflective surface of FIG. 16A.
Figure 17B:
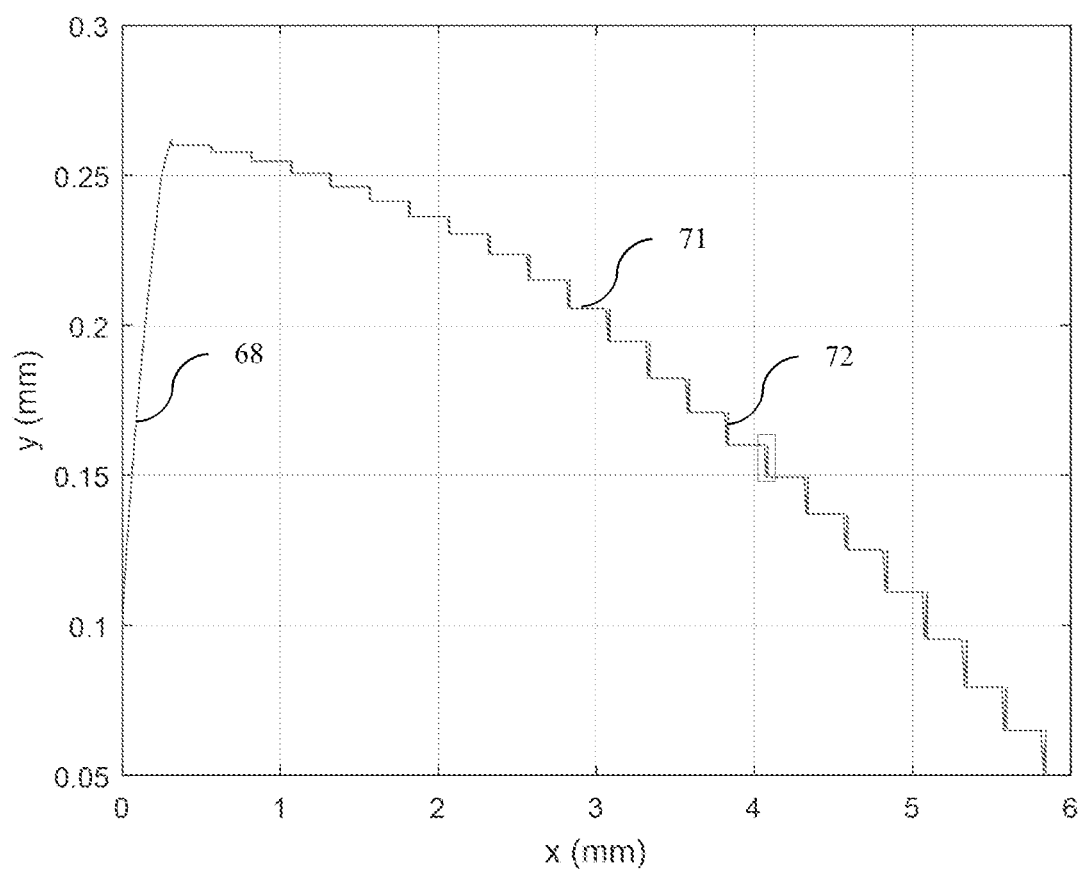
FIGS. 17B-C are graphs illustrating an illustrative embodiment for the profile of the rear reflective surface of FIG. 16A.
Figure 17C:
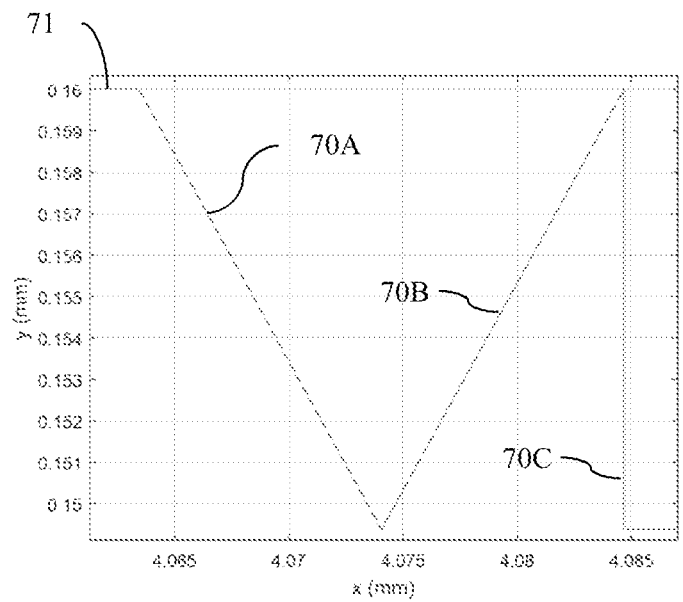

FIG. 17A is a schematic diagram illustrating in side view light paths in the optical structure comprising the rear reflective surface of FIG. 16A; and FIGS. 17B-C are graphs illustrating an illustrative embodiment for the profile of the rear reflective surface of FIG. 16A. Features of the arrangement of FIGS. 17A-C not discussed in further detail may be assumed to correspond to the features with equivalent reference numerals as discussed above, including any potential variations in the features.

Light extraction facets 72 comprise facets 72A, 72B that are pairs of facets that face in opposite directions in at least one cross sectional plane. Thus facet 72A faces the adjacent sub-array 33 while facet 72B faces the sub-array in an adjacent unit cell of the optical element 38.

In the embodiment of FIG. 17A a further vertical facet 72C is provided that achieves a stepped shape of the reflective surface 64. The reflective planar regions 71 and the reflective light extraction facets 72 have a stepped structure. Advantageously light may be distributed over a large area by means of guiding. LED cost may be reduced and uniformity increased. Advantageously leakage between adjacent optical elements may be reduced. Dynamic range of a high dynamic range display apparatus may be increased.

Light rays 401, 409 are provided by light extraction facets 72A, 74 respectively are shown. The illumination apparatus 100 further comprises diffuser structures 361 arranged on at least one surface of the transmissive support substrate 50. Diffuser structures 361 provide a fan of rays 466 from the output rays 401, 409.

Switchable operation of the illumination apparatus 100 will now be described.

Figure 18:
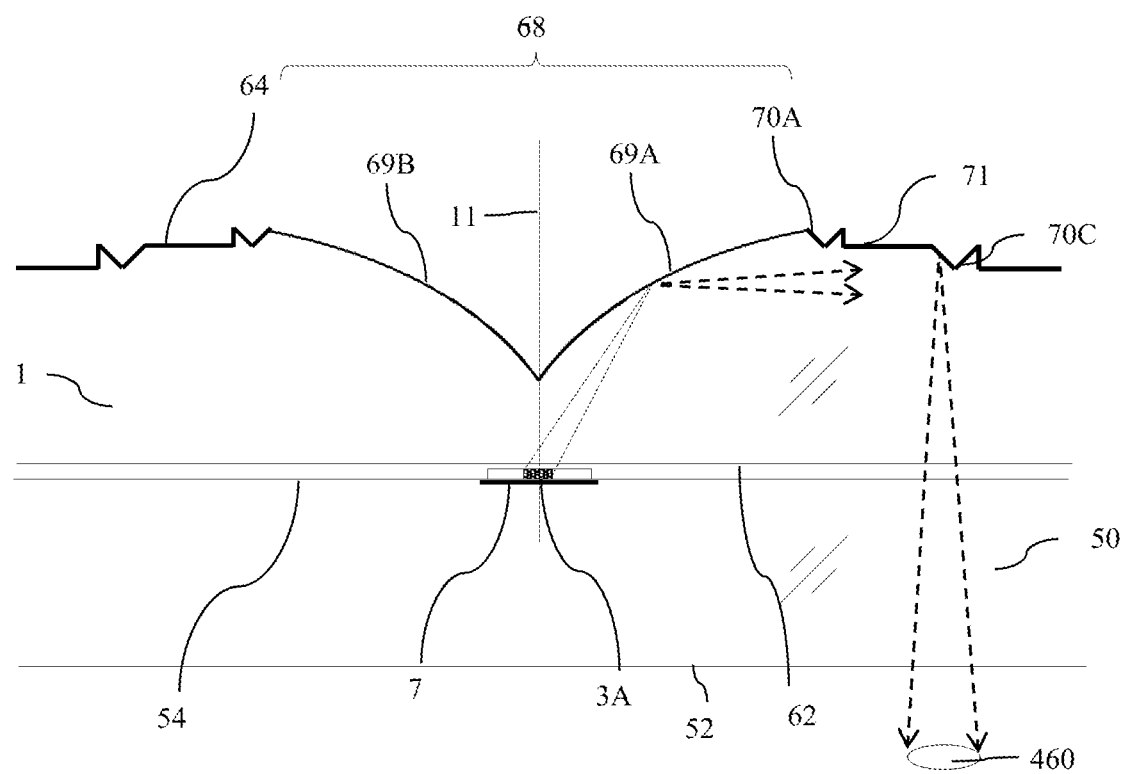
FIG. 18 is a schematic diagram illustrating in side view light paths in the optical structure comprising the rear reflective surface of FIG. 16A for the central light emitting diode light emission region.
Figure 19:
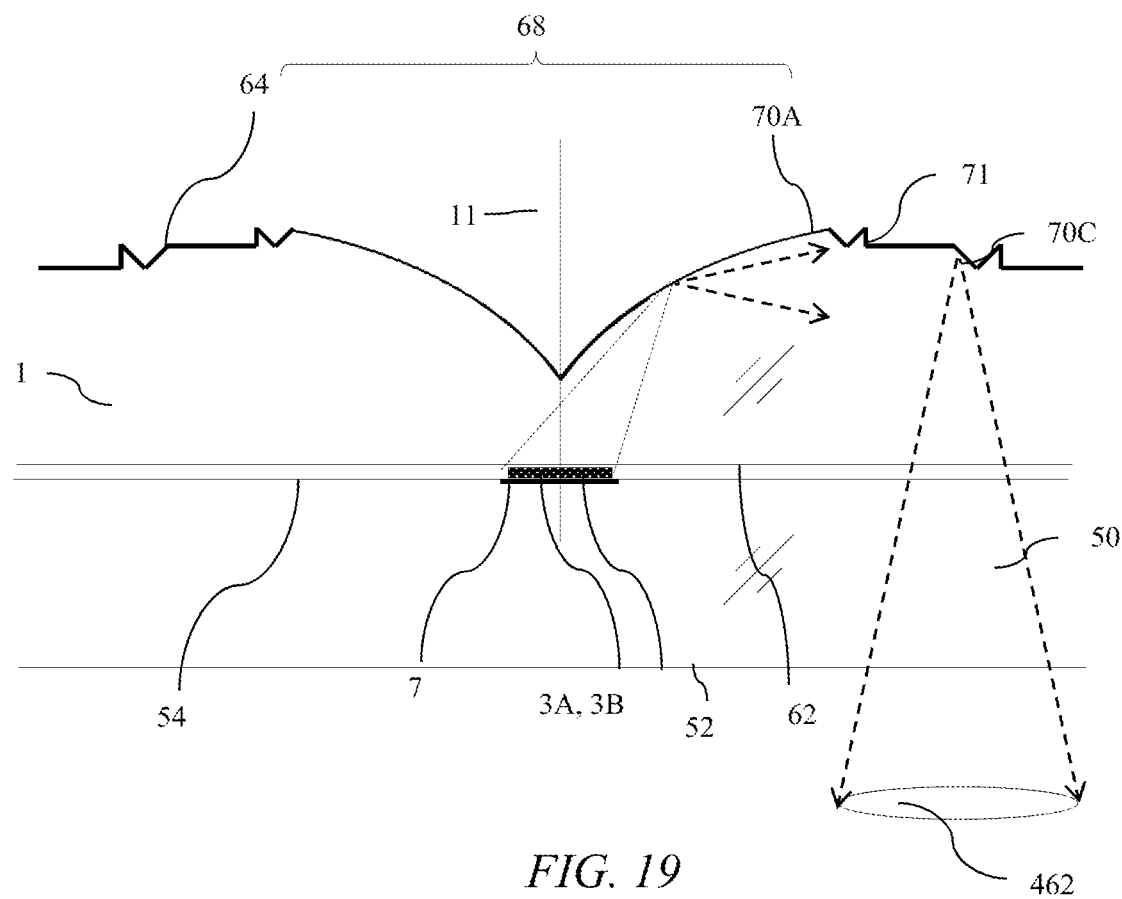
FIG. 19 is a schematic diagram illustrating in side view light paths in the optical structure comprising the rear reflective surface of FIG. 16A for all the light emitting diode light emission regions.

FIG. 18 is a schematic diagram illustrating in side view light paths in the optical structure comprising the rear reflective surface of FIG. 16A for the central light emitting diode light emission region; and FIG. 19 is a schematic diagram illustrating in side view light paths in the optical structure comprising the rear reflective surface of FIG. 16A for all the light emitting diode light emission regions. Features of the arrangements of FIGS. 18-19 not discussed in further detail may be assumed to correspond to the features with equivalent reference numerals as discussed above, including any potential variations in the features.

In comparison to the on-axis ray paths 401, 409 of FIG. 17A, the light cones 460 are provided by illumination of light emitting diode 3A and the light cone 462 is provided by illumination of light emitting diode 3B. A switchable illumination apparatus with a narrow mode and a wider mode of directional output is advantageously provided.

An illustrative embodiment will now be described.

Figure 20A:
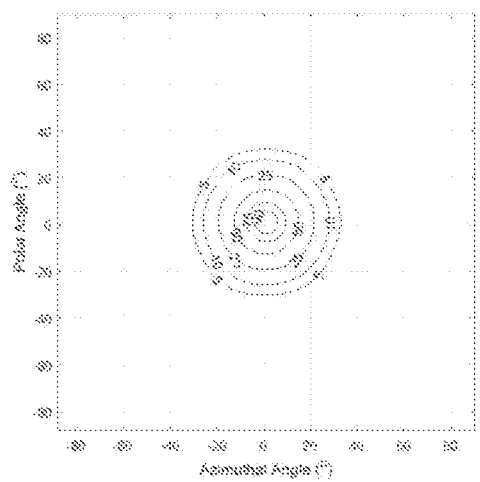
FIG. 20A is a graph illustrating the polar distribution of output luminance for a backlight comprising the rear reflective surface of FIG. 16A and for the central light emitting diode light emission region.
Figure 20B:
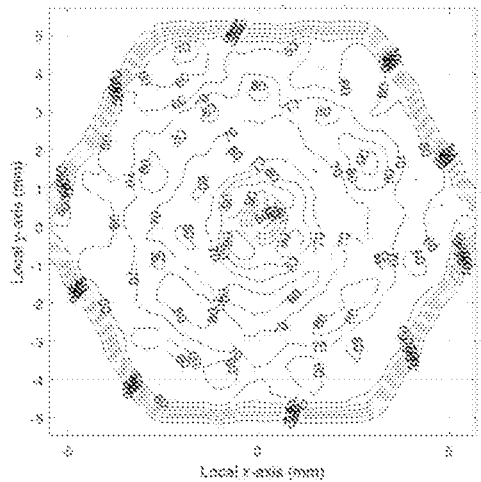
FIG. 20B is a graph illustrating the uniformity of output luminance for a backlight comprising the rear reflective surface of FIG. 16A and for the central light emitting diode light emission region over a 10 degree output cone angle.
Figure 20C:
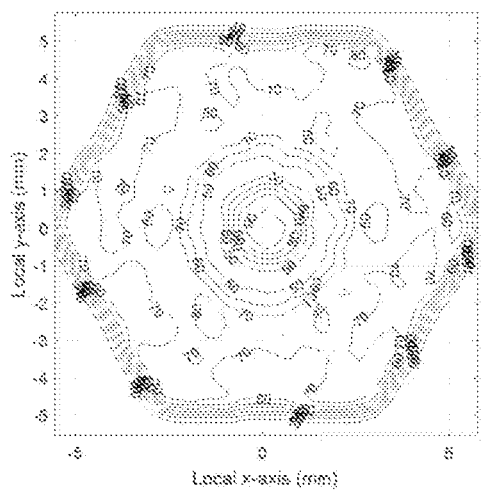
FIG. 20C is a graph illustrating the uniformity of output luminance for a backlight comprising the rear reflective surface of FIG. 16A and for the central light emitting diode light emission region over the entire output cone angle.

FIG. 20A is a graph illustrating the polar distribution of output luminance for a illumination apparatus 100 comprising the rear reflective surface of FIG. 16A and for the central light emitting diode 3A light emission region; FIG. 20B is a graph illustrating the uniformity of output luminance for a illumination apparatus 100 comprising the rear reflective surface of FIG. 16A and for the central light emitting diode light emission region over a 10 degree output cone angle; and FIG. 20C is a graph illustrating the uniformity of output luminance for an illumination apparatus 100 comprising the rear reflective surface of FIG. 16A and for the central light emitting diode light emission region over the entire output cone angle for the illustrative embodiment of TABLE 1.

TABLE 1

| Item | Value |
| --- | --- |
| LED 3A shape | Square |
| LED 3A size (micrometers) | 50 × 50 |
| LED 3A + LED 3B shape | Square |
| LED 3A + LED 3B size (micrometers) | 150 × 150 |
| Optical element 38 unit cell shape | Hexagonal |
| Optical element 38 maximum width (mm) | 11.5 |
| Light extraction facet 72A, 72B tilt angle (°) | 45 |
| Optical element 38 max thickness, d (mm) | 0.26 |
| Optical element 38 edge thickness, d (mm) | 0.05 |

TABLE 1-continued

| Item | Value |
| --- | --- |
| Waveguide refractive index, n | 1.58 |
| Extraction facet 72 pitch, p (mm) | 0.25 |
| Diffuser FWHM (°) | 10 |

The sub-arrays 33 comprise light emitting diodes 3B that (together with light emitting diodes 3A) have a maximum width of at most 300 micrometers, preferably at most 200 micrometers and most preferably at most 100 micrometers. In the at least one cross-sectional plane the distance between the transmissive output surface and reflective surface 64 is less than 1000 micrometers, preferably less than 500 micrometers and more preferably less than 250 micrometers. Advantageously the total area of semiconductor material may be reduced, achieving reduced cost. A low thickness illumination apparatus 100 may be provided. The illumination apparatus may be flexible and have high uniformity.

The light emitting diodes 3A, 3B output light in respective first light output distributions, that are typically Lambertian or close to Lambertian in output. Referring to FIG. 18 the optical elements 38 output light from the waveguide 1 originating from each light emitting diode 3A of the respective sub-array 33 in a respective second light output distribution that has a luminous intensity half maximum solid angle that is smaller than the luminous intensity half maximum solid angle of the respective first light output distribution of the light emitting diode 3A from which the light originates. In the case that the LED 3A is illuminated, the ratio of luminous intensity half maximum solid angle of the second light output distribution to the luminous intensity half maximum solid angle of a Lambertian light distribution is less than 1, preferably less than 0.5, more preferably less than 0.25 and most preferably less than 0.1.

FIGS. 20B-C illustrate that high uniformity is achieved for collimated light across the predetermined area. Advantageously a collimated output may be achieved with high uniformity. High efficiency may be provided in desirable output directions. An illumination apparatus 100 suitable for privacy display, high efficiency display and low stray light night mode display may be provided.

The operation with LEDs 3A, 3B illuminated will now be described.

Figure 21:
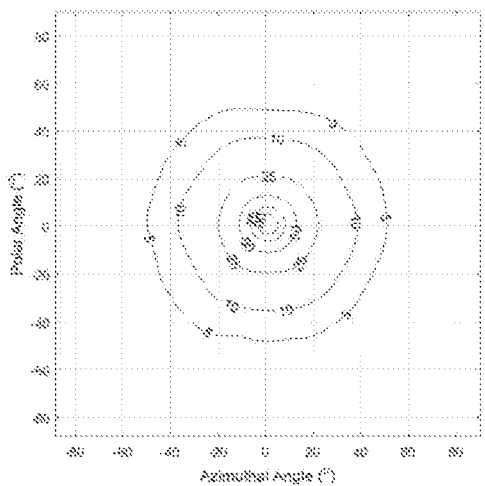
FIG. 21 is a graph illustrating the polar distribution of output luminance for a backlight comprising the rear reflective surface of FIG. 16A and for all the light emitting diode light emission regions.
Figure 22:
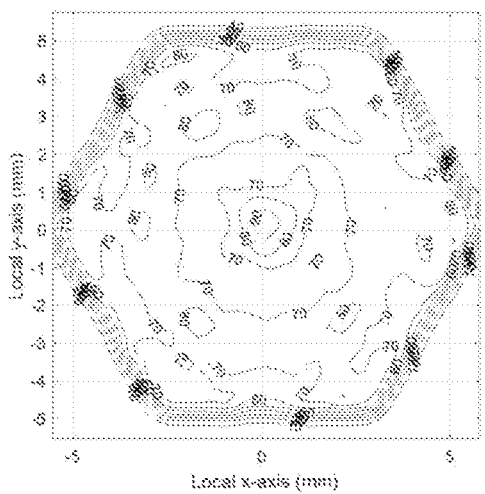
FIG. 22 is a graph illustrating the uniformity of output luminance for a backlight comprising the rear reflective surface of FIG. 16A and for all the light emitting diode light emission regions.
Figure 23:
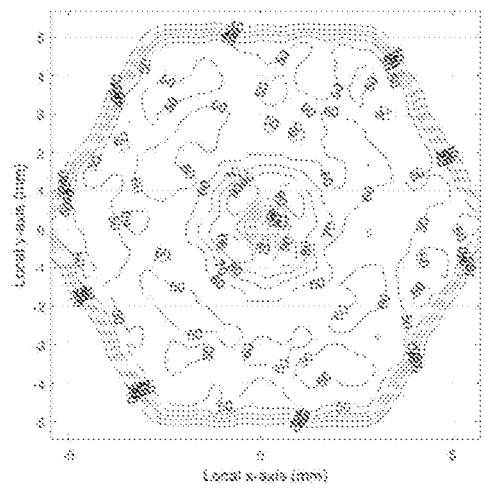
FIG. 23 is a graph illustrating the uniformity of output luminance for a backlight comprising the rear reflective surface of FIG. 16A and for all the light emitting diode light emission regions.

FIG. 21 is a graph illustrating the polar distribution of output luminance for an illumination apparatus 100 comprising the rear reflective surface of FIG. 16A and for all the light emitting diode light emission regions 3A, 3B; FIG. 22 is a graph illustrating the uniformity of output luminance for a illumination apparatus 100 comprising the rear reflective surface of FIG. 16A and for all the light emitting diode light emission regions; and FIG. 23 is a graph illustrating the uniformity of output luminance for a illumination apparatus 100 comprising the rear reflective surface of FIG. 16A and for all the light emitting diode light emission regions and for the illustrative embodiment of TABLE 1.

Referring to FIG. 19 the optical elements 38 output light from the waveguide 1 originating from each light emitting diode 3A, 3B of the respective sub-array 33 in a respective second light output distribution that has a luminous intensity half maximum solid angle that is smaller than the luminous intensity half maximum solid angle of the respective first light output distribution of the light emitting diodes 3A, 3B from which the light originates.

The ratio of luminous intensity half maximum solid angle of the second light output distribution to the luminous intensity half maximum solid angle of a Lambertian light distribution is less than 1, preferably less than 0.5, more preferably less than 0.25 and most preferably less than 0.1.

The arrangement of optical structures in the plane of optical array will now be further described.

Figure 24:
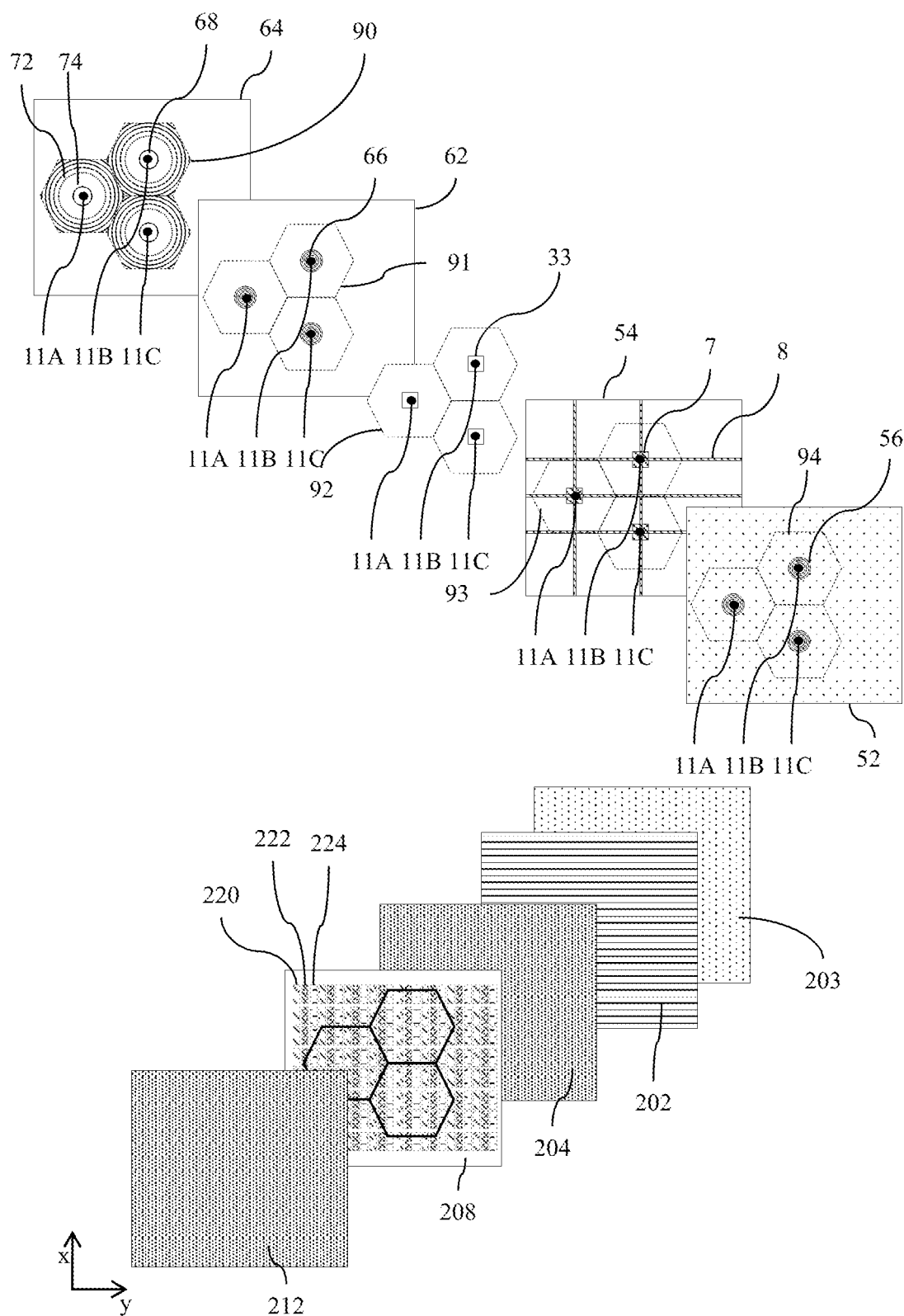
FIG. 24 is a schematic diagram illustrating in expanded front view layers of a display apparatus comprising a backlight comprising a micro-LED array and a catadioptric optical element 38 array arranged to illuminate an LCD.

FIG. 24 is a schematic diagram illustrating in expanded front view layers of a display apparatus comprising an illumination apparatus 100 comprising a LED array and an optical element 38 array arranged to illuminate a spatial light modulator 48. Features of the arrangement of FIG. 24 not discussed in further detail may be assumed to correspond to the features with equivalent reference numerals as discussed above, including any potential variations in the features.

Reflective surface 64 comprises a plurality of tessellated polygons, in this illustration hexagonal regions 90 are centred on optical axes 11a, 11b and 11c. Hexagonal regions are arranged over the width of the illumination apparatus 100 and represent the location of each optical element 38 in the plane of the reflective surface 64. Each optical element 38 comprises reflective light input structure 68 and reflective facets 72, 74 as will be described further hereinbelow.

Transmissive input surface 62 comprises hexagonal regions 91 centred on the same respective optical axes 11a, 11b and 11c as for the reflective surface 64. Refractive light input structures 66 are arranged in alignment with optical axes 11a, 11b and 11c.

The plurality of light emitting diodes 3A, 3B is centred on hexagonal regions 92 and on the same respective optical axes 11a, 11b and 11c as for the reflective surface 64.

The first surface 54 of the transmissive LED support substrate 50 comprises hexagonal regions 93 centred on the same respective optical axes 11a, 11b and 11c as for the reflective surface 64, as well as opaque regions 7 that may be electrodes, as well as addressing electrodes 8 to provide electrical connectivity to each of the light emitting diodes 3A, 3B, each arranged in alignment with optical axes 11a, 11b and 11c.

The transmissive output surface 52 comprises hexagonal regions 94 centred on the same respective optical axes 11a, 11b and 11c as for the reflective surface 64, as well as refractive light output structure 56.

Light output through the transmissive output surface 52 may be incident on a diffuser 203, reflective polariser and spatial light modulator 48 comprising input polariser 204, liquid crystal pixel layer 208 and output polariser 212. For illustrative purposes the location of the hexagonal structures in alignment with the spatial light modulator 48 is shown, illustrating that many pixels may be illuminated by each optical element 38. The arrangement of optical elements 38 in the optical array may be provided to minimise appearance of mura in the final output image. Further the arrangement may be adjusted to optimise the appearance of high dynamic range addressing of the plurality of light emitting diodes 3A, 3B.

It would be desirable for the light from the plurality of light emitting diodes 3A, 3B to be distributed such that the output luminance is substantially spatially uniform over the area of each optical element 38, and the luminous intensity directional distribution is substantially the same for each region over the area. Further it would be desirable to provide such spatially and directionally uniform distribution of light output across adjacent optical elements 38 of the optical array to achieve desirable uniform illumination of the spatial light modulator 48.

The operation of the optical array that achieves spatially uniform distribution of light output will now be further described with reference to certain raypaths of light from the LED 3.

Figure 25:
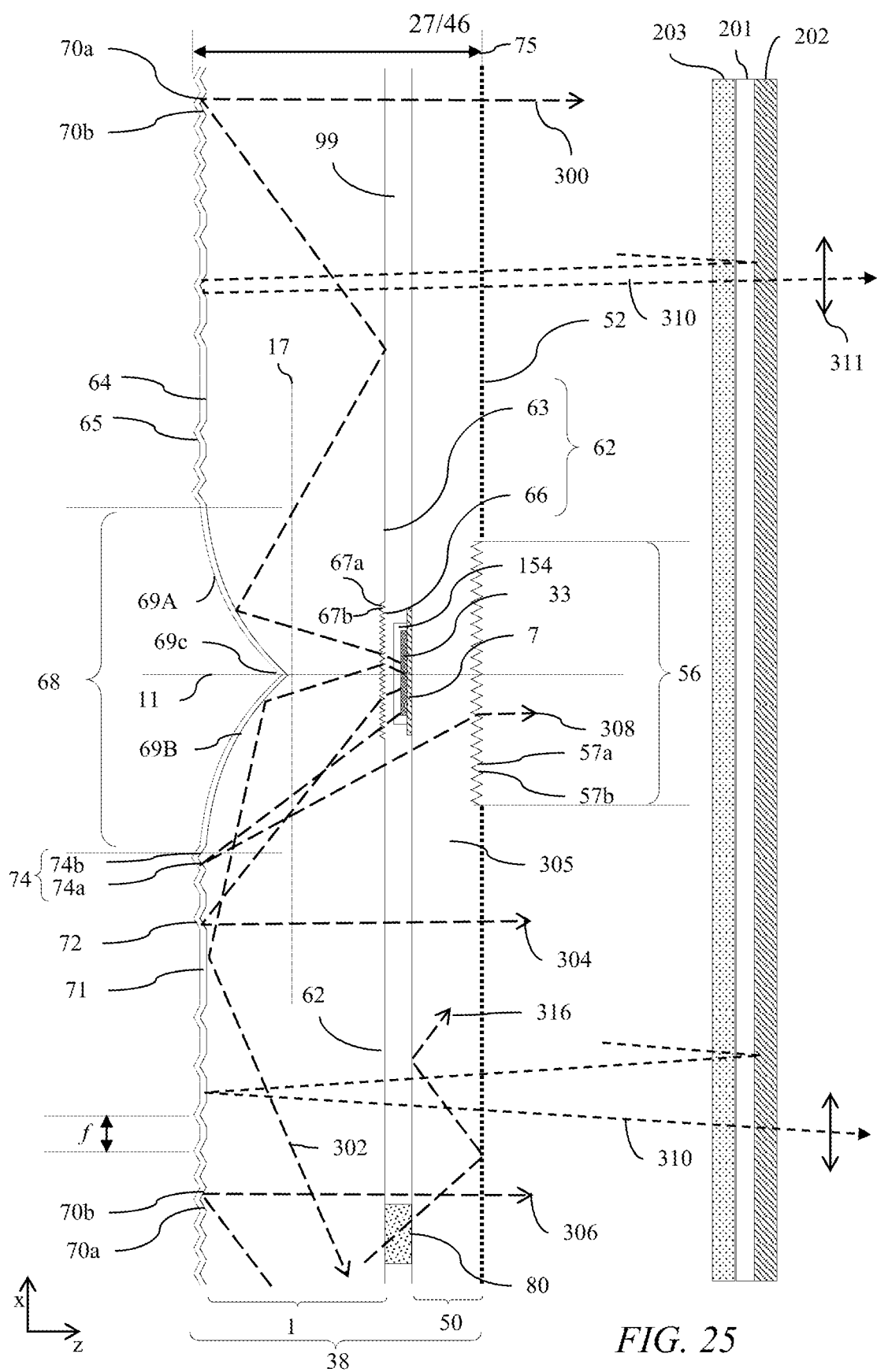
FIG. 25 is a schematic diagram illustrating in top view light rays from a micro-LED and catadioptric optical element comprising a light input microstructure for a catadioptric input substrate.

FIG. 25 is a schematic diagram illustrating in top view light rays from a LED 3 and optical element 38 comprising a refractive light input microstructure 66 for a waveguide 1. Features of the arrangement of FIG. 25 not discussed in further detail may be assumed to correspond to the features with equivalent reference numerals as discussed above, including any potential variations in the features.

The plurality of light emitting diodes 3A, 3B is arranged between the reflective surface 64 and the transmissive output surface 52. The first surface 54 of the transmissive LED support substrate 50 for each optical element 38 comprises a mask region 7 wherein a respective one or more of the light emitting diodes 3A, 3B of the plurality of light emitting diodes 3A, 3B is arranged between the mask region 7 and the reflective surface 64.

The mask region 7 is further provided between the refractive light output structure 56 and the respective one or more of the light emitting diodes 3A, 3B of the plurality of light emitting diodes 3A, 3B. Mask region 7 is aligned with an optical axis 11 of the optical element 38 and may be provided by an addressing electrode of the LED 3 as illustrated in FIG. 1 for example comprising aluminium or other reflective metal materials. Drive electrodes 8 that are not in the mask region 7 may be provided by transmissive conductor materials such as ITO or silver nanowires to advantageously achieve increased efficiency of light transmission through the transmissive LED support substrate 50.

The plurality of light emitting diodes 3A, 3B is arranged to illuminate the reflective surface 64 with light rays 300, 302, 304, 306, 308. Light rays 300, 302, 304, 306, 308 from sub-array 33 are incident on wavelength conversion layer 5 aligned to the sub-array 33. The micro-LED may comprise a blue emitting gallium nitride LED chip and the wavelength conversion layer 5 may for example comprise phosphor or quantum dot materials that may be arranged to convert some of the blue light into yellow light or red and green light. The sub-array 33 may comprise an ultra-violet emitting LED and the wavelength conversion material is arranged to provide white light output.

Light rays 300, 302, 304, 306, 308 are directed towards the reflective surface 64 and prevented from illuminating the transmissive output substrate 52 directly by mask regions 7 that shield the transmissive output surface 52 from light from the sub-array 33. By way of comparison with the present embodiments, if mask regions 7 were not present, light rays from the sub-array 33 would be transmitted directly to the transmissive output surface 52 and be output from the surface 52 with a Lambertian luminous intensity directional distribution that would undesirably provide a hot spot at the LED location for certain viewing angles. Advantageously the mask regions 7 achieve reduced appearance of hot spots.

The mask regions 7 may further be reflective such that light rays propagating with the optical array that are reflected from the reflective surface 64 towards the sub-array 33 are reflected and recirculated. Advantageously illumination apparatus 100 efficiency may be increased.

Light rays 300 illustrate a raypath from the sub-array 33 that passes through refractive light input structure 66. Light input structure 66 provides a redistribution of luminous intensity angular distribution from the micro-LED and will be described further below. Light ray 300 is incident onto reflective surface 64 at reflective light input structure 68 that extends from the reflective surface 64 to the transmissive output surface 52. In at least one cross-sectional plane through its optical axis 11 the reflective light input structure 68 comprises a first inner surface 69a and a second inner surface 69b facing the first inner surface. The first and second inner surfaces 69a, 69b may comprise curved reflective surfaces 69a, 69b. Advantageously light may be efficiently reflected within the waveguide 1.

For each optical element 38 of the optical array, the refractive light input structure 66 and reflective light input structure 68 are arranged to direct at least some light from the respective aligned at least one sub-array 33 to be the light ray 300 that is guided within the catadioptric optical array. Light rays 300 are reflected by the surface 69a within the waveguide 1 and are further incident on transmissive surface 62 that comprises planar regions 63 that extend between the input structures 66. Ray 300 has an angle of incidence greater than the critical angle at the interface of the waveguide 1 to the gap 99 that may comprise air and is guided within the optical element 38 between the reflective surface 64 and transmissive input surface 62 such that it is directed back towards reflective surface 64 where it is incident onto inclined facet 70a.

Advantageously light ray 300 may be directed to regions of the optical element 38 that are remote from the sub-array 33. Further the guiding of light ray 300 within the waveguide 1 achieves a reduction in the total thickness 75 of the optical array.

The plurality of reflective light extraction facets 72 is arranged to direct light through the transmissive output surface 52 of the optical array. Some of the reflective light extraction facets 72 of the reflective surface 64 are arranged to direct at least some light through the transmissive output surface 52 of the optical element 38 in a direction substantially normal to the transmissive output surface 52. In other words, facet 70a may be inclined to deflect guided light ray 300 in a direction that is substantially parallel to the optical axis 11. Other light rays (not shown) that guide within the waveguide 1 may be provided at other output angles that are close to the direction of the optical axis 11, as will be described further below.

The reflective light extraction facets 72 are illuminated by light cones from the light input structure 68 that has a limited cone angle of illumination. The angular output from the facets 72 when output into air thus has a non-Lambertian output. The facets 72 may further be arranged as elements of a curved surface to achieve increased collimation across the width of the element 38. The cone angle of illumination from the optical element may be non-Lambertian as will be described below. Advantageously display efficiency may be increased for head-on viewing in comparison to Lambertian illumination apparatuses. Further for displays in which angular output similar to Lambertian displays is desirable, such as for highly curved displays, uniform illumination of a Lambertian diffuser can be achieved. Further an illumination apparatus 100 for a privacy display may be provided with reduced off-axis luminance such that the display is not clearly visible for off-axis viewing locations.

Light ray 302 illustrates a raypath that after reflection from curved inner surface 69b is incident on reflective planar regions 71 between at least some of the reflective light extraction facets 72 of the reflective surface 64. Light ray 300 is guided within the waveguide 1 such that it is directed into a neighbouring optical element 38 of the optical array.

Such a ray from a neighbouring optical element 38 is further illustrated by ray 306. The reflective light extraction facets 72 of the reflective surface 64 are provided by pairs of inclined facets 72A, 72B that are inclined with opposing inclination angles. Light rays 306 are incident on inclined reflective facet 70b to be directed to the output surface 52 in a direction that is substantially normal to the plane of the substrates 1, 50.

Advantageously light rays 302, 306 may provide some mixing between neighbouring optical elements 38. Such mixing may provide a spatial uniformity at the nominal interface between the two elements 38. Further, the luminous intensity directional distributions are substantially the same at the nominal interface, achieving improved uniformity for a wide range of viewing angles. Advantageously display uniformity is improved.

It would be desirable to achieve uniform output luminous intensity distribution near to the optical axis 11, illustrated by light ray 304 for light that has not guided within the waveguide 1. Some of the reflective light extraction facets 72 arranged on the reflective surface 64 of the optical element 38 are arranged to direct light ray 304 that has not guided within the optical array. Advantageously spatial uniformity may be increased while achieving luminous intensity angular directional distribution that is the same across different regions of the optical element 38.

Light rays 308 may be provided from the region of the transmissive output surface 52 between the mask 7 and the spatial light modulator 48. Light ray 308 illustrates a raypath that achieves illumination in an otherwise shadowed region of surface 52. Light reflecting facets 74 of the reflective surface 64 of the respective optical element 38 are arranged to direct light to the refractive light output structure 56. In at least one cross-sectional plane the refractive light output structure 56 comprises a plurality of pairs of oppositely inclined transmissive light deflecting facets 57a, 57b. As illustrated in FIG. 24, the refractive light output structure 56 comprising plurality of pairs of oppositely inclined transmissive light deflecting facets 57a, 57b may be circularly or elliptically symmetric, in the plane of the transmissive output surface 52. Hexagonal boundaries may be used in arrays of optical elements to provide continuous arrays. The facets 72, 74 may be concentric with the optical axis, but may be interrupted in the outer regions of each optical element 38.

The angular light output distribution of light passing through the refractive light output structure 56 is substantially the same as the angular light output distribution of light passing through regions of the transmissive support substrate 50 that do not comprise a refractive light output structure 56.

To continue the illustrative embodiment, the facets 57a, 57b may be planar facets with a surface normal direction that has an inclination of 60 degrees to the optical axis 11 in at least one cross sectional profile.

Adhesive regions 80 may further comprise a transmissive material so that some of the light rays 316 that guide in the waveguide 1 are directed to guide within the transmissive LED support substrate 50. Such guiding light may provide reduction of non-uniformities and may be extracted by means of diffusion on or in the substrate 50 or by refractive light output structure 56.

The operation of the light input structure 66 will now be described further.

As illustrated in FIG. 25, for each optical element 38 in at least one cross-sectional plane the transmissive surface 62 of the waveguide 1 comprises a refractive light input structure 66 aligned to the respective optical axis 11. Each light input structure 66 extends from the transmissive input surface 62 to the reflective surface 64 of the waveguide 1. In other words, the refractive light input structure 66 may be a microstructure that is arranged on the transmissive input surface 62 of the waveguide 1. The refractive input structure 66 may be fully or partially recessed into the waveguide 1 or may be proud of the surface 62. The refractive input structure 66 may be formed on the surface of a transmissive substrate such as a polymer or glass, for example by means of UV casting, printing, embossing or injection moulding.

The refractive light input structure 66 comprises a plurality of pairs of oppositely inclined refractive input facets 67a, 67b that may be inclined at equal and opposite inclination angles to the normal direction in the at least one cross-sectional plane. In the plane of the optical array 38 the plurality of pairs of inclined refractive input facets 67a, 67b are circularly or elliptically symmetric. In an illustrative embodiment, each input facet may have a planar surface and the angle of each surface 67a, 67b to the optical axis 11 may be 52 degrees. The pitch of the microstructure may be 50 microns for example. Advantageously refractive input facets 67a, 67b may have a low depth, minimising total illumination apparatus 100 thickness 75.

In the at least one cross-sectional plane the reflective light extraction facets 72 have a separation f that decreases with distance from the optical axis 11 of the optical element 38. Advantageously increased uniformity may be achieved.

It would be desirable to recycle unwanted polarised light from a spatial light modulator 48 comprising an LCD. Reflective polariser 202 is arranged to provide polarisation recirculation of light reflected from the reflective surface 64 of the optical element 38. Incident light rays 308, 310 are typically unpolarised and a single polarisation state 311 is transmitted, while an orthogonal polarisation state is reflected. Optional retarder 201 that may be a quarter waveplate may be arranged to modify the reflected polarisation state to the planar regions 71 of the reflective surface 64. Reflected light has a polarisation state that is transformed into an orthogonal polarisation state and transmitted through the reflective polariser 202. Advantageously efficiency may be improved. Further, diffuser layers arranged on the reflective polariser and/or retarder may be arranged to further increase spatial uniformity and reduce mura visibility. In comparison to conventional light recirculating backlights, thickness and cost is reduced because no separate rear reflector layer (that may typically have a thickness of 0.1 mm or more) is used.

Diffuser 203 may be provided by a surface and/or bulk diffusing structure. It may further be desirable to provide diffusion for light that is output from the output refractive microstructure 56.

Optical structures that may be optionally provided near the region of the LED 3 will now be described.

Figure 26A:
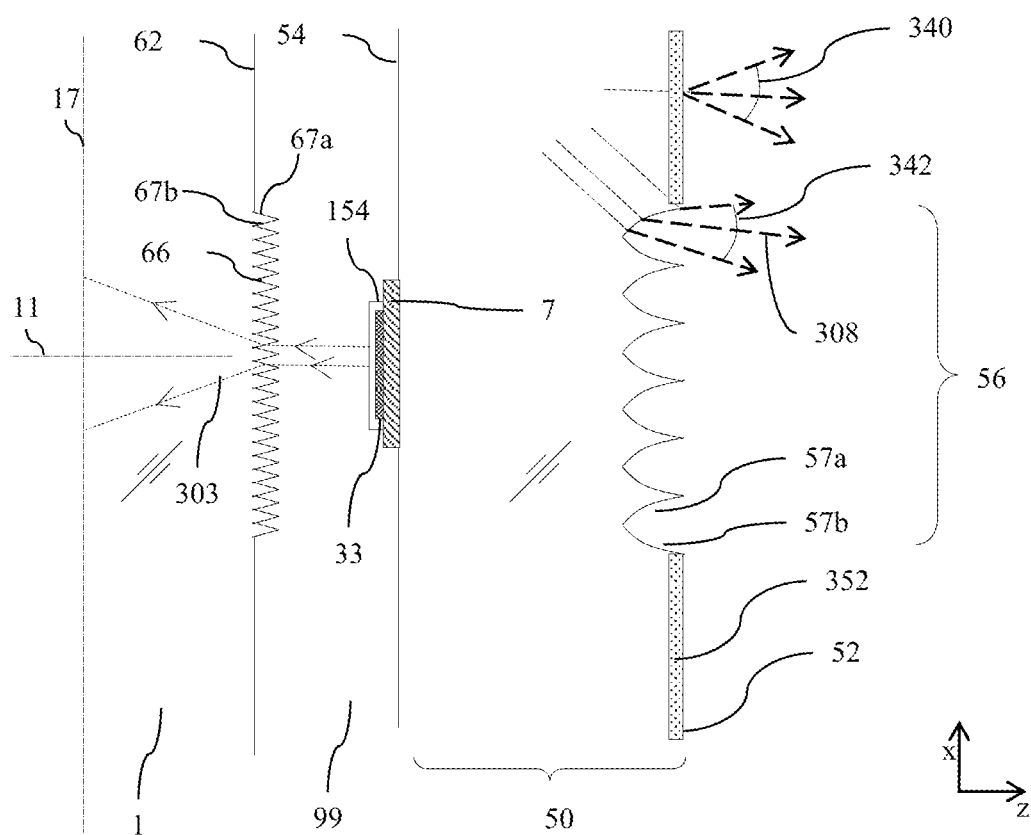
FIG. 26A is a schematic diagram illustrating in top view the transmissive output surface of the LED support substrate arranged to provide diffused output.

FIG. 26A is a schematic diagram illustrating in top view a detail of the optical element 38 comprising the refractive light input structure 66 and refractive light output structure 56 of the transmissive output surface 52 of the LED support substrate arranged to wherein the structure 56 further provides diffused output. Features of the arrangement of FIG. 26A not discussed in further detail may be assumed to correspond to the features with equivalent reference numerals as discussed above, including any potential variations in the features.

Each optical element 38 further comprises a refractive light output structure 56 formed in a front surface of the transmissive support substrate 50 in front of the respective at least one emitting diode 3. Some of the reflective light extraction facets 72 of each optical element 38 are arranged to direct light rays 308 to the refractive light output structure 56 of the optical element 38. Each optical element 38 has mirror symmetry about an optical axis 11 in at least one cross-sectional plane.

In the at least one cross-sectional plane the refractive light output structure 56 may comprise a concave refractive surface arranged to provide negative optical power.

In the embodiment of FIG. 26A, in the at least one cross-sectional plane the refractive light input structure 56 comprises a plurality of pairs of oppositely inclined refractive input facets 57a, 57b. In other words, the refractive light output structure 56 comprises a plurality of pairs of oppositely inclined transmissive light deflecting facets. Transmissive light deflecting facets 57a, 57b may be provided with curved surfaces, such that light cone solid angle 342 for light rays 308 from the surfaces 57a, 57b is substantially the same as the cone 340 from diffuser surface 352 that may be arranged on the surface 52.

Thus, the angular light output distribution of light from the refractive light output structure 56 is substantially the same as the angular light output distribution of light from the plurality of reflective light extraction facets 72 that is transmitted through regions of the transmissive output substrate that do not comprise a refractive light output structure 56. Advantageously spatial and angular uniformity may be increased in the region of the LED 3.

The transmissive surface 62 of the input substrate comprises planar regions 74 between the refractive light input structure 56s.

FIG. 26A further illustrates an embodiment wherein the transmissive surface 62 of each optical element 38 further comprises a refractive light input structure 66 formed in the transmissive surface 62 of the waveguide 1 and aligned with the respective at least one of light emitting diode 3 so that the light emitted thereby passes through the refractive light input structure 56. Each optical element 38 has mirror symmetry about an optical axis 11 in at least one cross-sectional plane and comprises refractive facets 67a, 67b.

The output of the sub-array 33 and refractive light input structure 66 will now be further described.

Figure 26B:
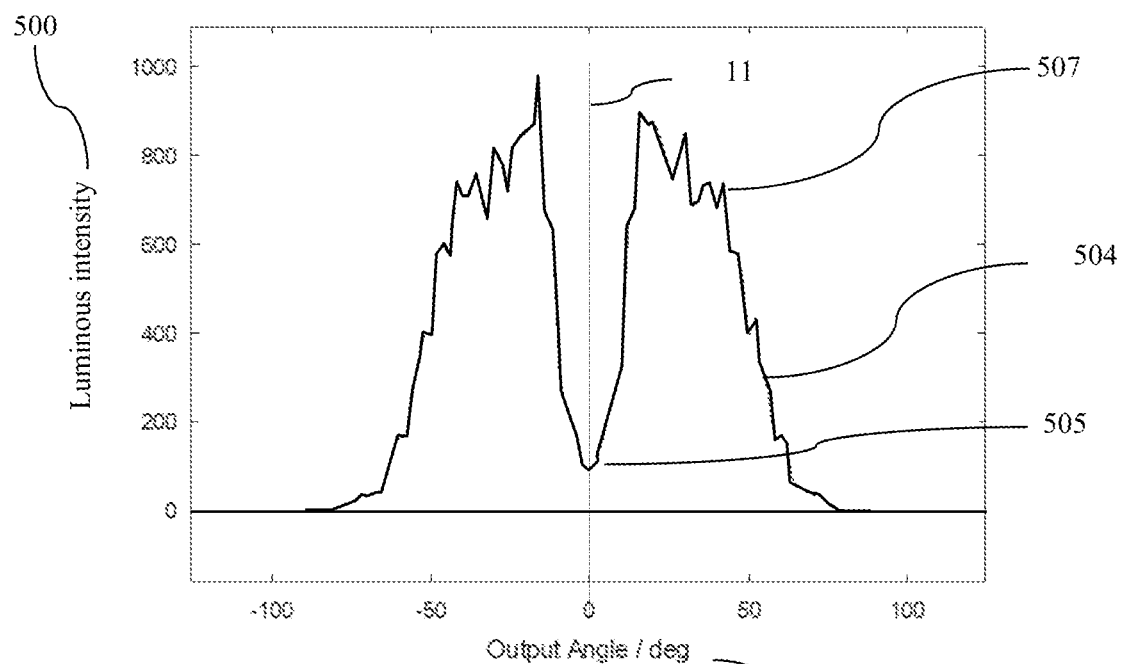
FIG. 26B is a schematic graph illustrating the variation of output luminous intensity from a refractive microstructure of FIG. 25 on the transmissive side of the input substrate of a catadioptric optical element.

FIG. 26B is a schematic graph illustrating in at least one cross-sectional plane the profile 504 of simulated output luminous intensity 500 with illumination angle 502 from a refractive light input structure 66 onto a nominal detector plane 17 arranged between the light input structure 66 and the reflective surface 64 and arranged to receive light before incidence onto the reflective surface 64. Features of the arrangement of FIG. 26B not discussed in further detail may be assumed to correspond to the features with equivalent reference numerals as discussed above, including any potential variations in the features.

Profile 504 has a dip 505 in directions that are on-axis and thus reduced luminous intensity is directed towards the axial location of the cusp 69c of the refractive light input structure 68 of FIG. 26A. Facets 67a, 67b provide increased luminous intensity in directions near peak 507 that illuminate reflective facets 74 of the rear reflective surface 64, and increase luminous intensity of light rays 308 that are directed to the refractive light output structure 56.

Advantageously increased luminous intensity is provided in the region of the refractive light output structure 56 and the uniformity of output across the transmissive output surface 52 may be increased. Further the thickness of the LED support substrate 50 and the total thickness 75 may be reduced. Light may be provided with a spatial and angular luminous intensity distribution that matches other regions of the output surface 52. The uniformity of the display from a wide range of viewing angles may be maintained, minimising image mura.

The output directional distribution of an illustrative embodiment will now be described.

Figure 27:
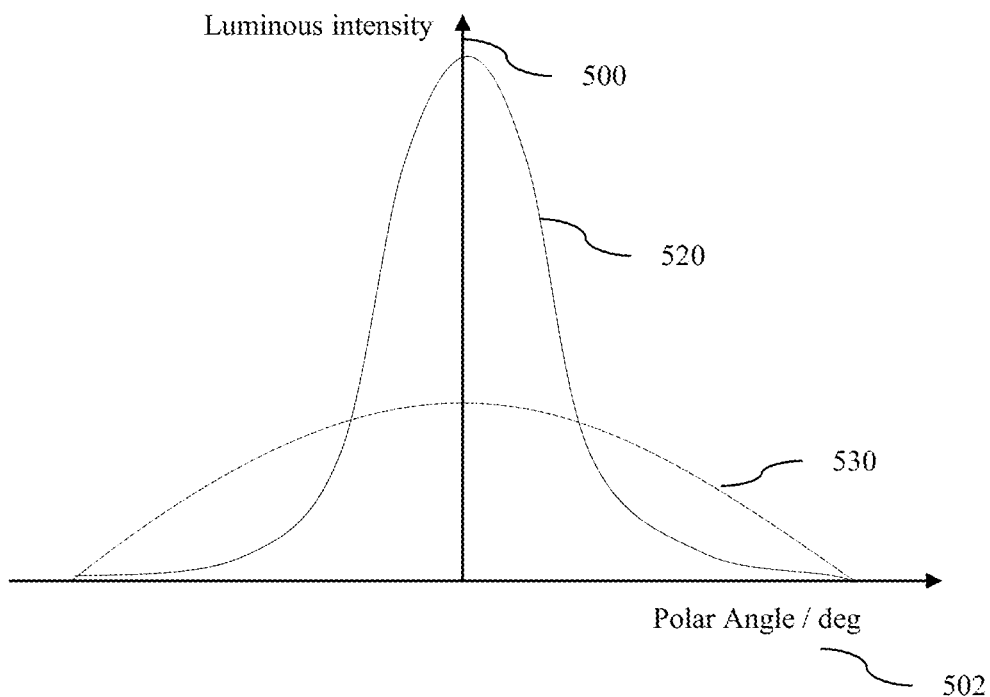
FIG. 27 is a schematic graph illustrating the luminous intensity variation of a directional distribution in comparison to a Lambertian directional distribution.
Figure 28:
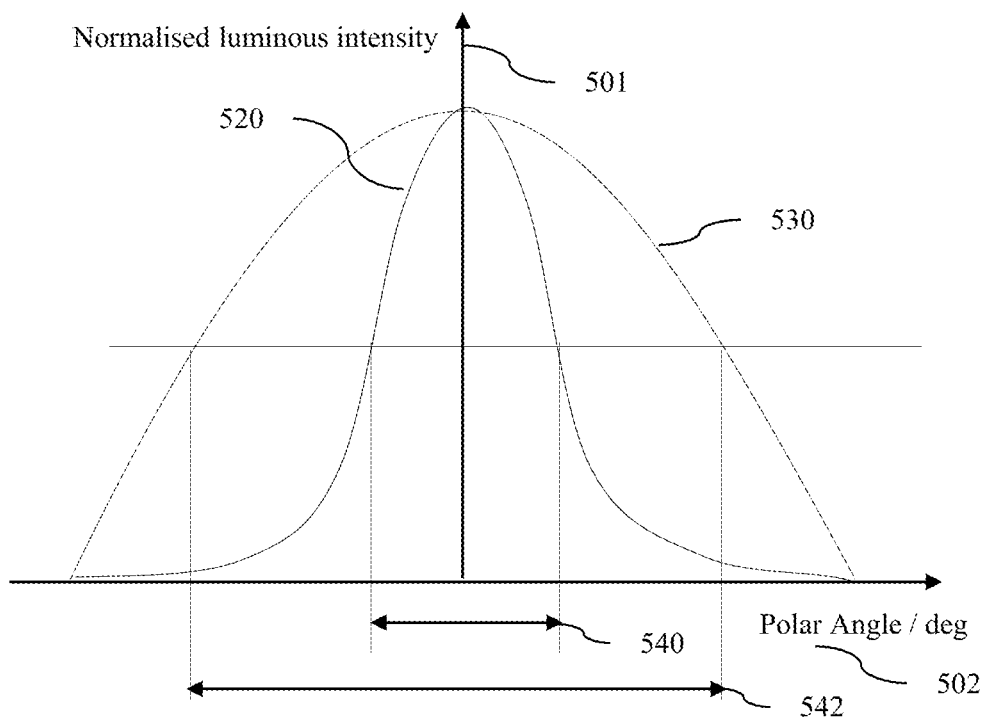
FIG. 28 is a schematic graph illustrating the luminous intensity variation of a normalised directional distribution in comparison to a Lambertian directional distribution.

FIG. 27 is a schematic graph illustrating in one cross-sectional plane the directional distribution 520 from the array of the present embodiments in comparison to a Lambertian directional distribution 530; and FIG. 28 is a schematic graph illustrating in one cross-sectional plane the solid angle of a normalised directional distribution 520 in comparison to a normalised Lambertian directional distribution 530.

Luminous intensity is a measure of the energy density in a light cone and is the number of lumens per unit solid angle. In the present embodiments the luminous intensity half maximum solid angle describes the subtended size of the illumination output cone for which the luminous intensity is half of the peak luminous intensity in each direction.

Luminance of a display is determined by the luminous intensity per subtended unit area. A Lambertian surface has a has a luminance that is independent of viewing angle and thus luminous intensity that is proportional to the cosine of the angle of observation to the normal direction to the surface.

The luminous intensity half maximum solid angle is the solid angle defined by the cone of light in which the luminous intensity in any direction falls to 50% of the peak luminous intensity. The solid angle $\Omega$ of a symmetric cone of full width half maximum angle $2\theta$ is given by:

$$\Omega = 2\pi*(1-\cos\theta) \qquad \text{eqn. 13}$$

A Lambertian light source has a cosine distribution of luminous intensity such that the FWHM 542 illustrated in FIG. 28 is 120 degrees and the half angle, $\theta$ is 60 degrees. In the two-dimensional arrays of the present embodiments, the directional distribution is also two dimensional, so that the profiles 520, 530 are representative of the solid angle of the output.

In the present embodiments, the output is directional, that is the light output distribution 540 thus has a luminous intensity half maximum solid angle that is smaller than the luminous intensity half maximum solid angle of the light output distribution from each of the plurality of light emitting diodes 3A, 3B (that have substantially Lambertian output). The present embodiments achieve half maximum solid angles that are less than $\pi$ steradian and the half cone angle $\theta$ in a single cross-sectional plane is less than 60 degrees, preferably less than approximately 40 degrees, more preferably less than approximately 30 degrees and most preferably less than approximately 20 degrees. In other words, the ratio of luminous intensity half maximum solid angle of the present embodiments to the luminous intensity half maximum solid angle of a Lambertian light source is less than 1, preferably less than 50% and more preferably less than 25%. For a privacy display the ratio is most preferably less than 10%.

In the present disclosure, the angular directional distribution refers to the distribution of luminous intensity for a point on the display, in other words the angular directional distribution is the spread of ray density with angle for the point. The uniformity of a display represents the spatial distribution across the optical array for any given viewing angle.

It would be desirable to provide light cone angular output that is substantially the same in the at least one cross-section and in the direction orthogonal to the at least one cross section, such that the output cone angles are uniform across the optical array.

Figure 29:
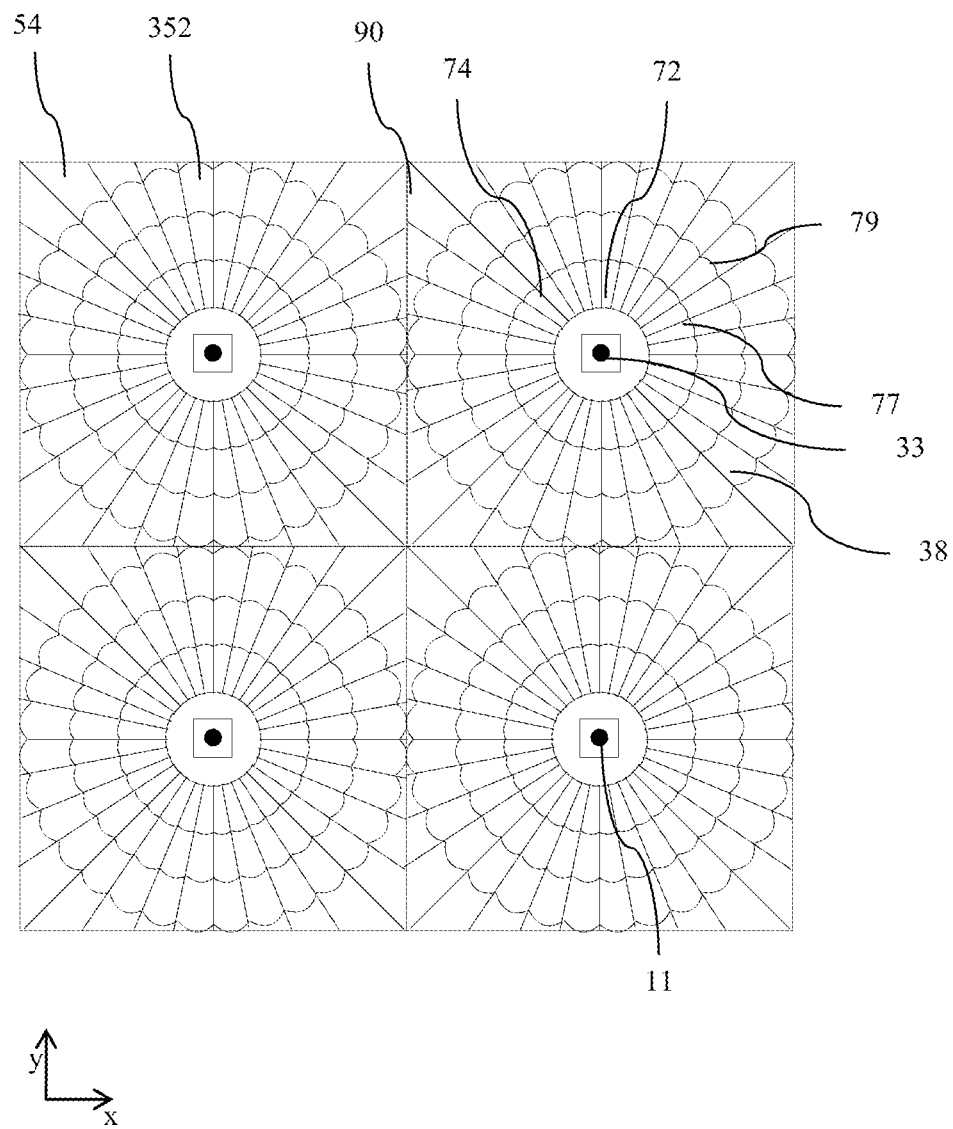
FIG. 29 is a schematic diagram illustrating in front view an arrangement of a diffuser structure provided on at least one surface of the transmissive LED support substrate.

FIG. 29 is a schematic diagram illustrating in front view an arrangement of diffuser provided on at least one of the surfaces 52, 54 of the transmissive LED support substrate 50. Features of the arrangement of FIG. 29 not discussed in further detail may be assumed to correspond to the features with equivalent reference numerals as discussed above, including any potential variations in the features.

Diffuser structures 352 may comprise radially extended lens surfaces that provide diffusion in a direction that is orthogonal to the at least one optical cross section illustrated in FIG. 2 for example.

In the plane of the predetermined area, the spread of light may be related to the size of the sub-array 33. Such angle may vary with distance from the sub-array 33 and may be different from the angle of the profiles 520. It would be desirable to achieve a light cone angle normal to the predetermine area that is similar to the cone angle 340 in the cross-sectional plane.

The radial lenses of FIG. 29 may be provided with a constant radius of curvature and thus the sag of the lenses increases with distance from the optical axis 11. Diffusion may be increased by the higher sag for light that is output further from the sub-array 33 and advantageously increased uniformity of light cone in a plane orthogonal to the at least one cross-sectional plane of FIG. 2. Advantageously improved spatial and angular uniformity of directional distribution may be achieved.

It would be desirable to provide displays with high spatial and angular uniformity, very low bezel widths and with free form shapes. The arrangement of the optical structures of the present embodiments will now be considered further in front view.

Figure 30A:
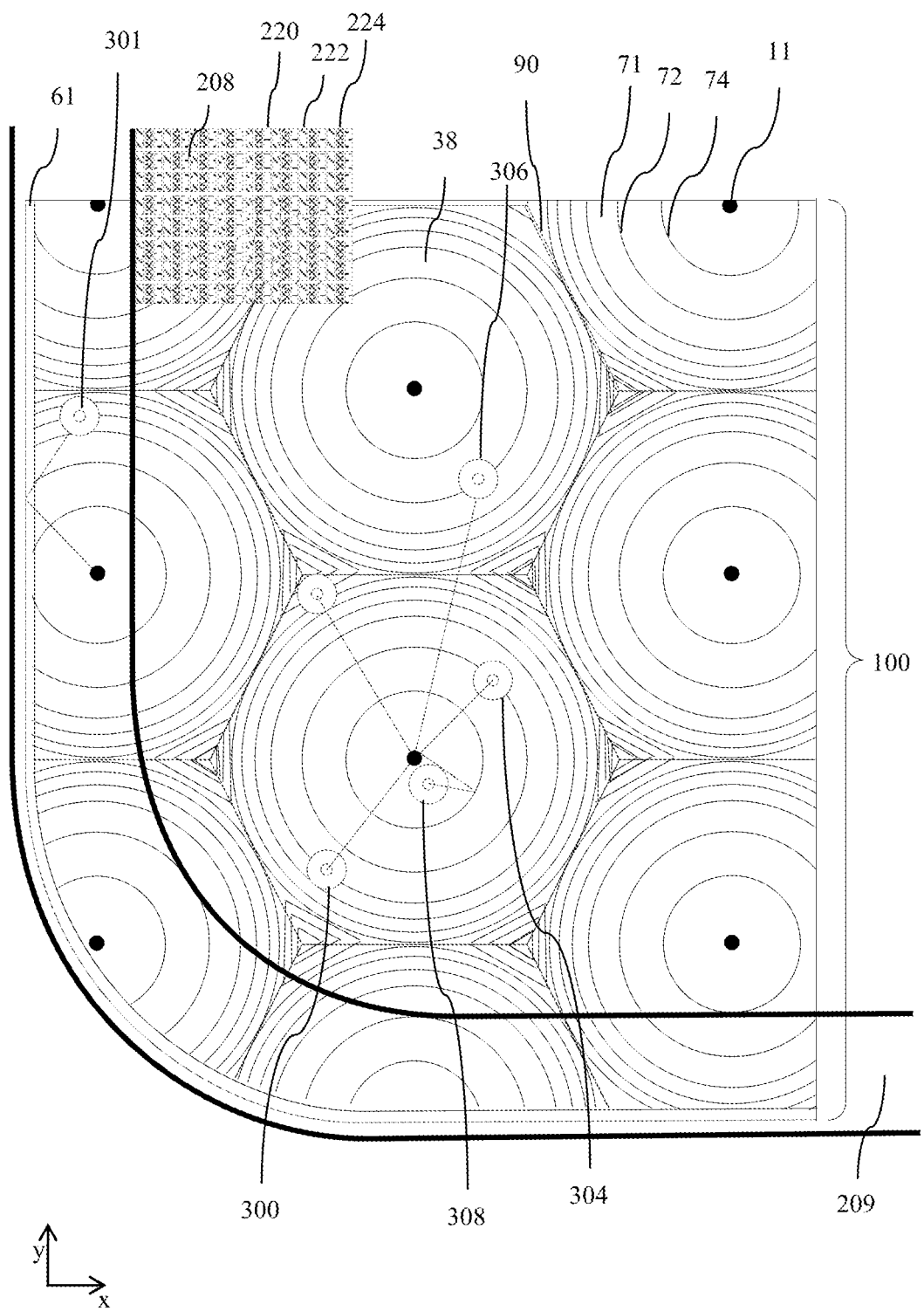
FIG. 30A is a schematic diagram illustrating in front view an arrangement of reflective light extraction facets of the reflective surface with a hexagonal packing of catadioptric optical elements.

FIG. 30A is a schematic diagram illustrating in front view arrangements of reflective light extraction facets 72 of the reflective surface 64 with a hexagonal extent 90 and hexagonal packing of optical elements 38. Features of the arrangement of FIG. 30A not discussed in further detail may be assumed to correspond to the features with equivalent reference numerals as discussed above, including any potential variations in the features.

In the plane of the array the reflective light extraction facets 72, 74 are circularly symmetric. The plurality of reflective light extraction facets 72 of an optical element 38 are concentric with the optical axis 11 of said optical element 38.

The propagation of light rays 300, 304, 306, 308 as described in FIG. 25 are illustrated. Light from sub-array 33 aligned to the optical axis 11 is directed through each of the pixels 220, 222, 224 of the spatial light modulator 48 with substantially the same luminous intensity directional distribution. Advantageously high spatial uniformity may be provided with high efficiency.

In other embodiments (not illustrated), the reflective light extraction facets may be elliptically symmetric about the optical axis 11. Elliptical light extracting facets 72, 74 may provide asymmetric light output cones in orthogonal directions, for example to provide preferential viewing comfort in one direction compared to the other. For example, a fixed landscape display may have higher viewing freedom in the lateral direction compared to the elevation direction. Advantageously increased efficiency or increased viewing freedom may be provided.

Referring to the lower edge of the display of FIG. 2, in seal region 209 no pixels are provided and outside the seal region 209 the liquid crystal layer 208 comprises pixels 220, 222, 224. The width of the seal region may be 1 mm or less. FIG. 30A further illustrates raypath 301 that may be reflected from reflective material 61 arranged on the edges of the optical array as illustrated by ray 301 in FIG. 2. Advantageously, display bezel width may be minimised and free form display shapes achieved such as the curved display corner illustrated in FIG. 30A.

It would be desirable to provide further control of display luminance uniformity.

In a rotationally symmetric optical element 38 the luminous intensity of extracted light falls with distance from the optical axis 11 as the total area of the reflecting facet 72 increases with distance, being proportional to the circumference of the facet. The length of circular reflecting facets 72 increases in proportion to the radius. It is desirable to maintain a uniform luminance across the area of the optical array.

The extracted luminance over the area of an optical element 38 is determined by the incident luminous intensity in any notional region across the element 38 and the area of extraction facets 72 in said area. For facets 72 that are arranged with equal width and equal pitch, the total facet 72 area is determined by the facet 72 circumference and increases proportionally with distance from the sub-array 33. For a fixed luminous intensity in each notional region, the output luminance will fall towards the edge of the element, and create a non-uniformity. It would be desirable to maintain uniform luminance across the area of the element 38 by increasing the luminous intensity of extracted light from the centre to the edges of the element 38. To continue the illustrative example, a desirable increase of luminous intensity towards the edges is illustrated in FIG. 26.

In the present embodiments, as illustrated in FIG. 25, some increased luminous intensity at the outer notional regions of the element 38 is achieved by guiding light from the sub-array 33 to the outer regions.

Further, in the embodiment of FIG. 30A, the reflective light extraction facets 72 of each optical element 38 are arranged with a separation that decreases with distance from the optical axis 11 of the element. Thus, the number of facets 72 per unit area increases at high radius, and such an increase in facet 72 density provides increased light extraction that compensates for the increased facet 72 circumference.

Further light ray 312 is shown for light rays that are reflected from the edge reflector 61. Advantageously very low bezel widths may be achieved with free-form shapes.

Further arrangements to achieve uniform spatial uniformity of luminance will now be described.

Figure 30B:
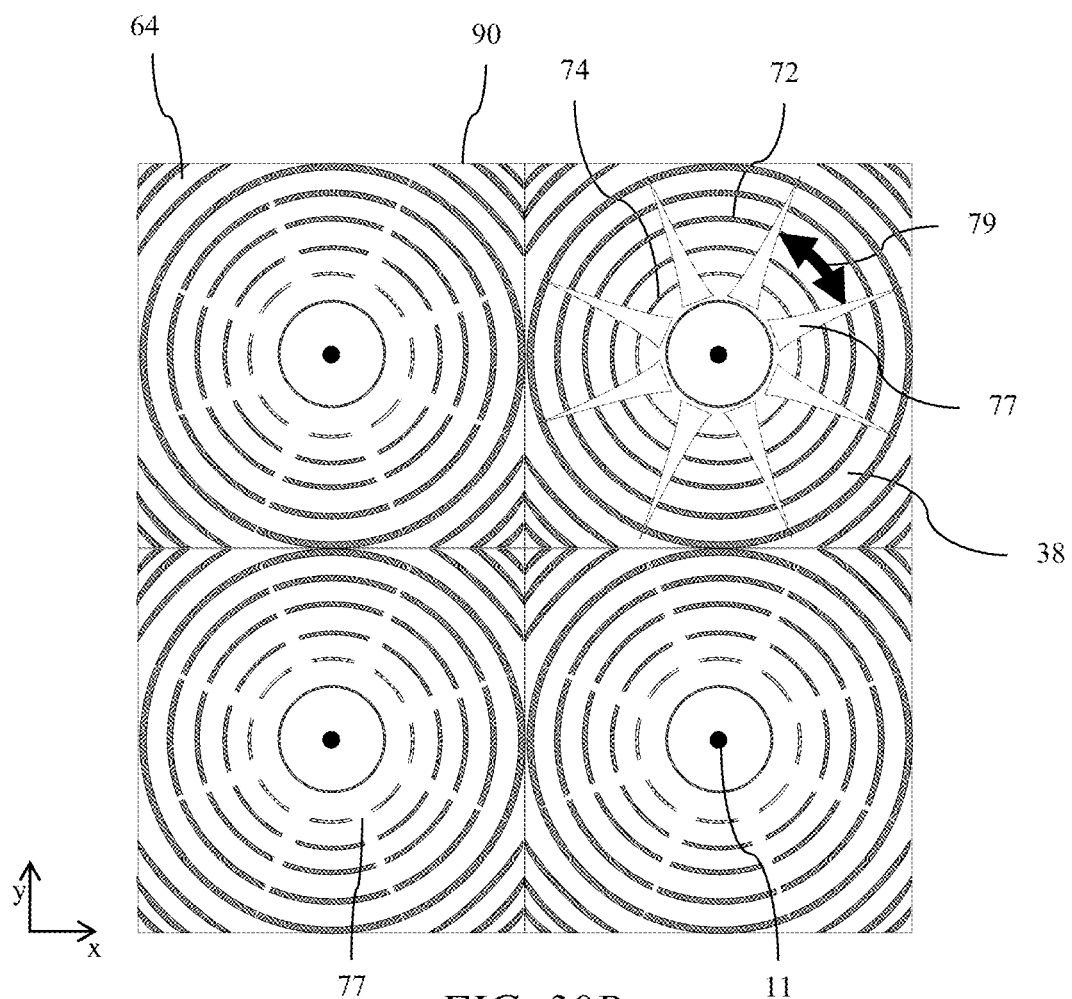
FIG. 30B is a schematic diagram illustrating in front view arrangements of reflective light extraction facets of the reflective surface with a square packing of catadioptric optical elements.

FIG. 30B is a schematic diagram illustrating in front view arrangements of reflective light extraction facets 72 of the reflective surface 64 with a square extent 90 and a square packing of optical elements 38. Square extent 90 may provide a different mura visibility to the hexagonal extent of FIG. 30A. Features of the arrangement of FIG. 30B not discussed in further detail may be assumed to correspond to the features with equivalent reference numerals as discussed above, including any potential variations in the features.

The reflective light extraction facets 72 have lengths 79 that increase with distance from the optical axis 11 of the respective optical element 38. The reflective light extraction facets 72 have total areas that increase with the distance from the optical axis 11 of the respective optical element 38. Advantageously uniformity may be increased.

In comparison with the arrangement of FIG. 30A, the spacing of the facets 72, 72, 74 in at least one cross sectional plane may be similar. Additional planar regions 77 are provided that reduce the total length of each facet 72, 74, with length that varies depending on facet function and distance from the optical axis 11. Thus facets 72, 74 may comprise facet segments 79, the length of the facet segments increasing with distance from the sub-array 33. Output diffusers, for example arranged on surfaces 52, 54 of transmissive LED support substrate 50 may be arranged to provide uniform output in gap between facet segments. Thus in the plane of an optical element 38 the length of the reflective light extraction facets 72 increases with distance from the optical axis 11 of the respective optical element 38. Typically, the facets 72 will have an area in the plane of the optical element such that the total area of the reflective light extraction facets 72 increases with the distance from the optical axis 11 of the respective optical element 38. Further, the total area of the reflective light extraction facets 72 is proportional to the distance from the optical axis 11 of the respective optical element 38. Compensation for the non-linear variation in luminous intensity may be provided.

A one-dimensional collimating optical element 38 will now be described.

Figure 31:
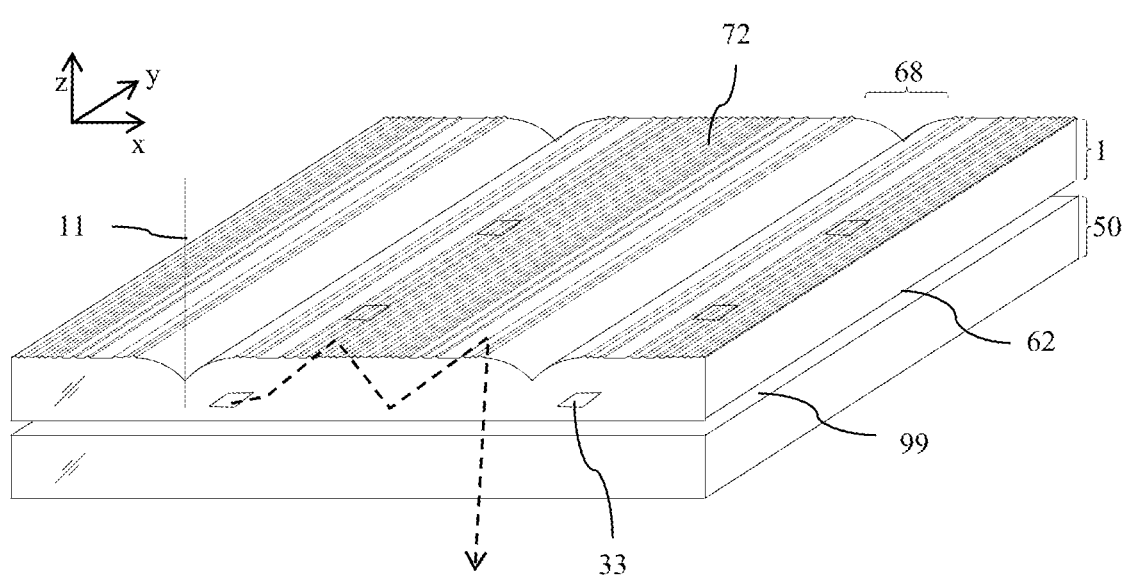
FIG. 31 is a schematic diagram illustrating in perspective side view a one dimensional catadioptric optical element 38 array with reflective surface structure of the type illustrated in FIG. 2 and aligned micro-LED array.

FIG. 31 is a schematic diagram illustrating in perspective side view a one dimensional optical element 38 array with reflective surface structure of the type illustrated in FIG. 2 and aligned micro-LED array. Features of the arrangement of FIG. 31 not discussed in further detail may be assumed to correspond to the features with equivalent reference numerals as discussed above, including any potential variations in the features.

In a case that each optical element has mirror symmetry about an optical axis in a single cross-sectional plane, then the optical elements may have the same configuration perpendicular to that cross-sectional plane. In this case, the optical elements may be arranged in a one dimensional array.

In comparison to the arrangement of FIG. 16A, the optical element 38 is extended in the y-direction. Such an arrangement provides control of cone angle in the x-z plane and substantially Lambertian output in the y-z plane.

In use in a display, the optical output may be observed with substantially the same luminance for rotation about the x-axis and with reduced luminance for rotation about the y-axis. Advantageously comfortable viewing freedom may be achieved for a head-on user for various display orientations. Further, manufacture of such components may also be conveniently achieved.

Further arrangements of reflective surface 64 will now be described.

Figure 32A:
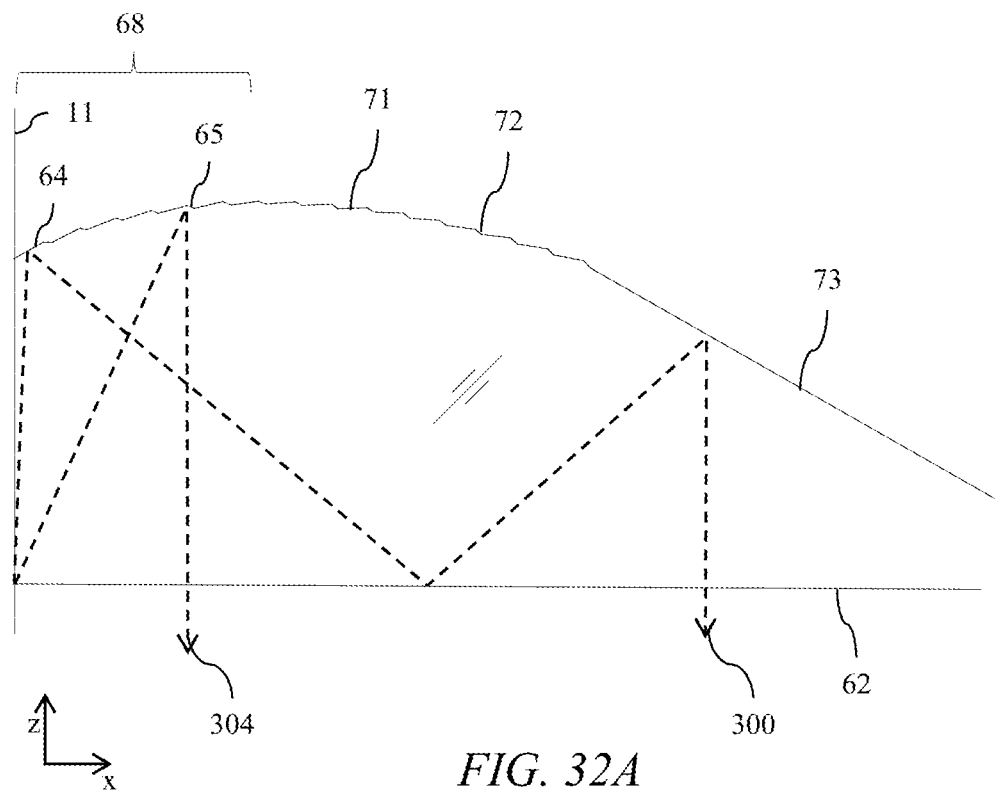
FIG. 32A is a schematic diagram illustrating in side view a reflective surface structure for a catadioptric optical element 38 array.
Figure 32B:
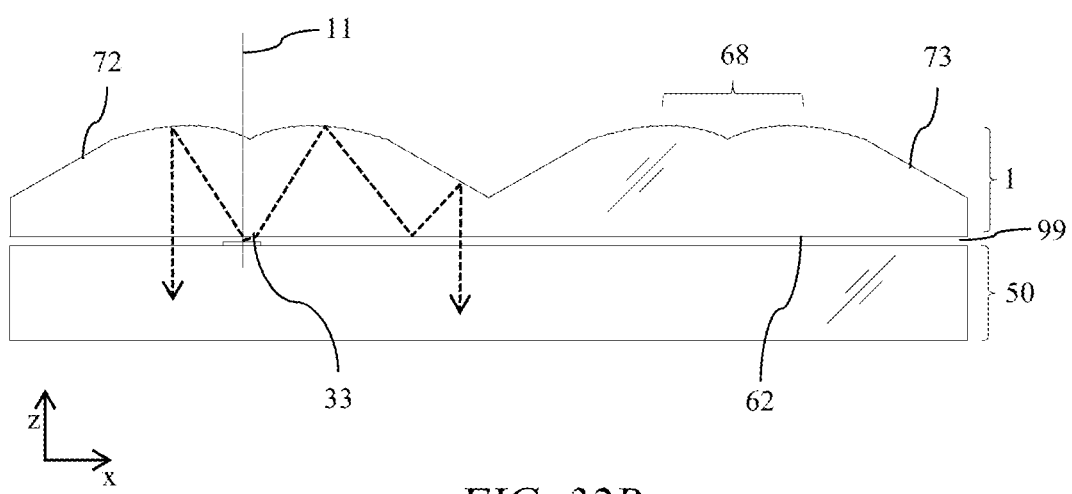
FIG. 32B is a schematic diagram illustrating in side view a catadioptric optical element 38 array comprising the structure of FIG. 32A.
Figure 32C:
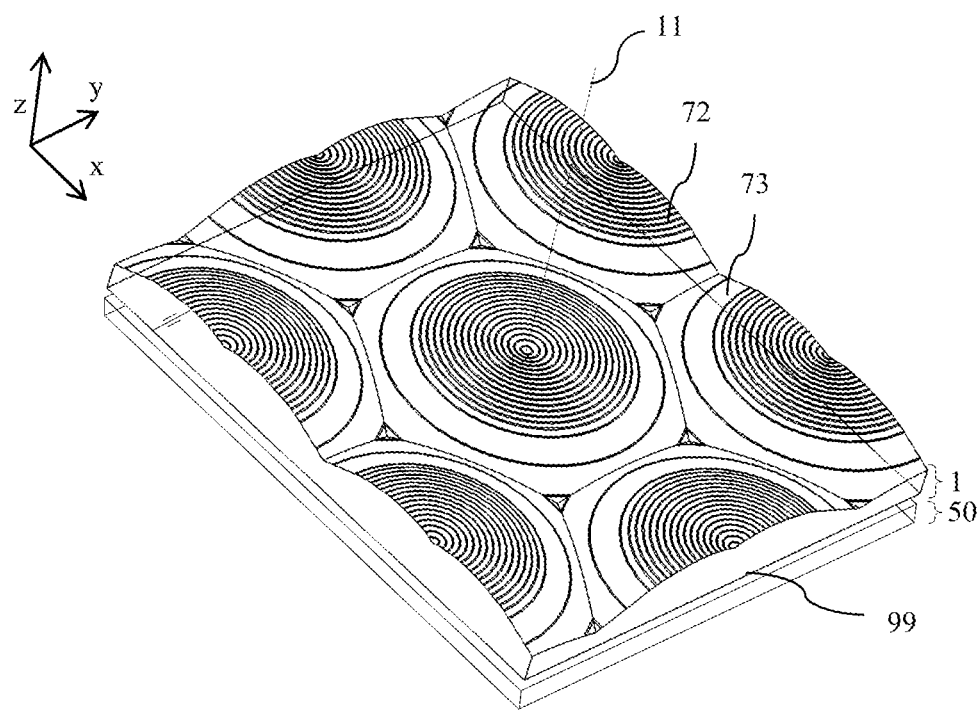
FIG. 32C is a schematic diagram illustrating in perspective side view a two dimensional catadioptric optical element 38 array with reflective surface structure of the type illustrated in FIGS. 31D-E and aligned micro-LED array.

FIG. 32A is a schematic diagram illustrating in side view a reflective surface structure for an optical element 38 array; FIG. 32B is a schematic diagram illustrating in side view an optical element 38 array comprising the structure of FIG. 32A; and FIG. 32C is a schematic diagram illustrating in perspective side view a two dimensional optical element 38 array with reflective surface structure of the type illustrated in FIGS. 31D-E and aligned micro-LED array. Features of the arrangements of FIGS. 32A-C not discussed in further detail may be assumed to correspond to the features with equivalent reference numerals as discussed above, including any potential variations in the features.

In comparison to the arrangement of FIGS. 1-2 for example, the facets 72 may have different tilt angles and the outer region 73 may be linear. Such a structure may be tooled with reduce cost and complexity.

Further arrangements for reflective light input structure 68 and refractive light output structure 56 will now be described.

Figure 33:
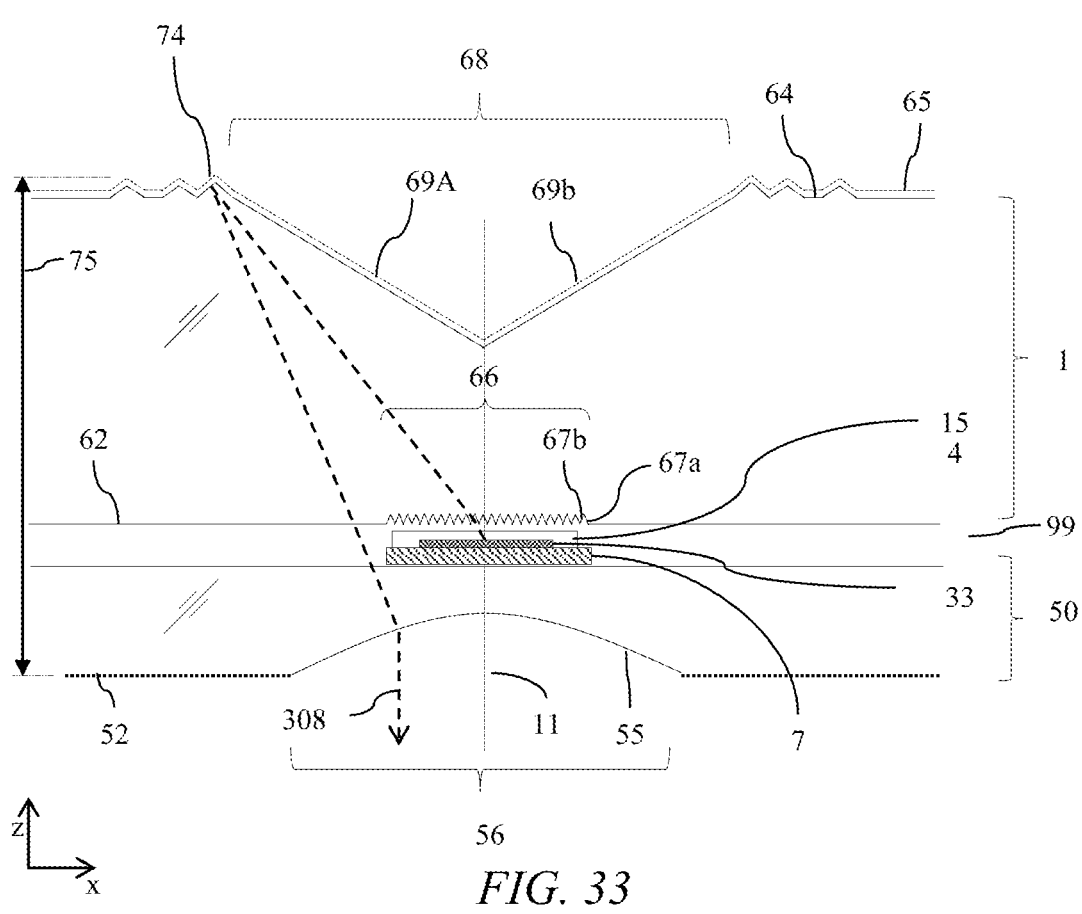
FIG. 33 is a schematic diagram illustrating in top view the input region of an optical element and aligned micro-LED.

FIG. 33 is a schematic diagram illustrating in top view the input region of an optical element 38 and aligned sub-array 33 in at least one cross-sectional plane through its optical axis 11. Features of the arrangement of FIG. 33 not discussed in further detail may be assumed to correspond to the features with equivalent reference numerals as discussed above, including any potential variations in the features.

The operation of the refractive light output structure 56 arranged on the transmissive output surface 52 will now be described. In the embodiment of FIG. 33, the refractive light output structure 56 comprises a concave refractive surface 55 arranged to provide negative optical power. Light rays 308 from reflective facets 74 are redirected by concave surface 55 to reduce the angle of the rays to the optical axis 11, thus improving the collimation of the output in the region that is otherwise shadowed by the mask 7. Features of the arrangement of FIG. 33 not discussed in further detail may be assumed to correspond to the features with equivalent reference numerals as discussed above, including any potential variations in the features.

FIG. 33 further illustrates reflective light input structure 68 may comprise linear inner surfaces 69a, 69b. Advantageously the surfaces 69a, 69b may be more conveniently tooled than the curved inner surfaces of FIG. 2 for example.

It would be desirable to provide an illumination apparatus 100 with increased robustness and reduced sensitivity to thermal variations.

Figure 34A:
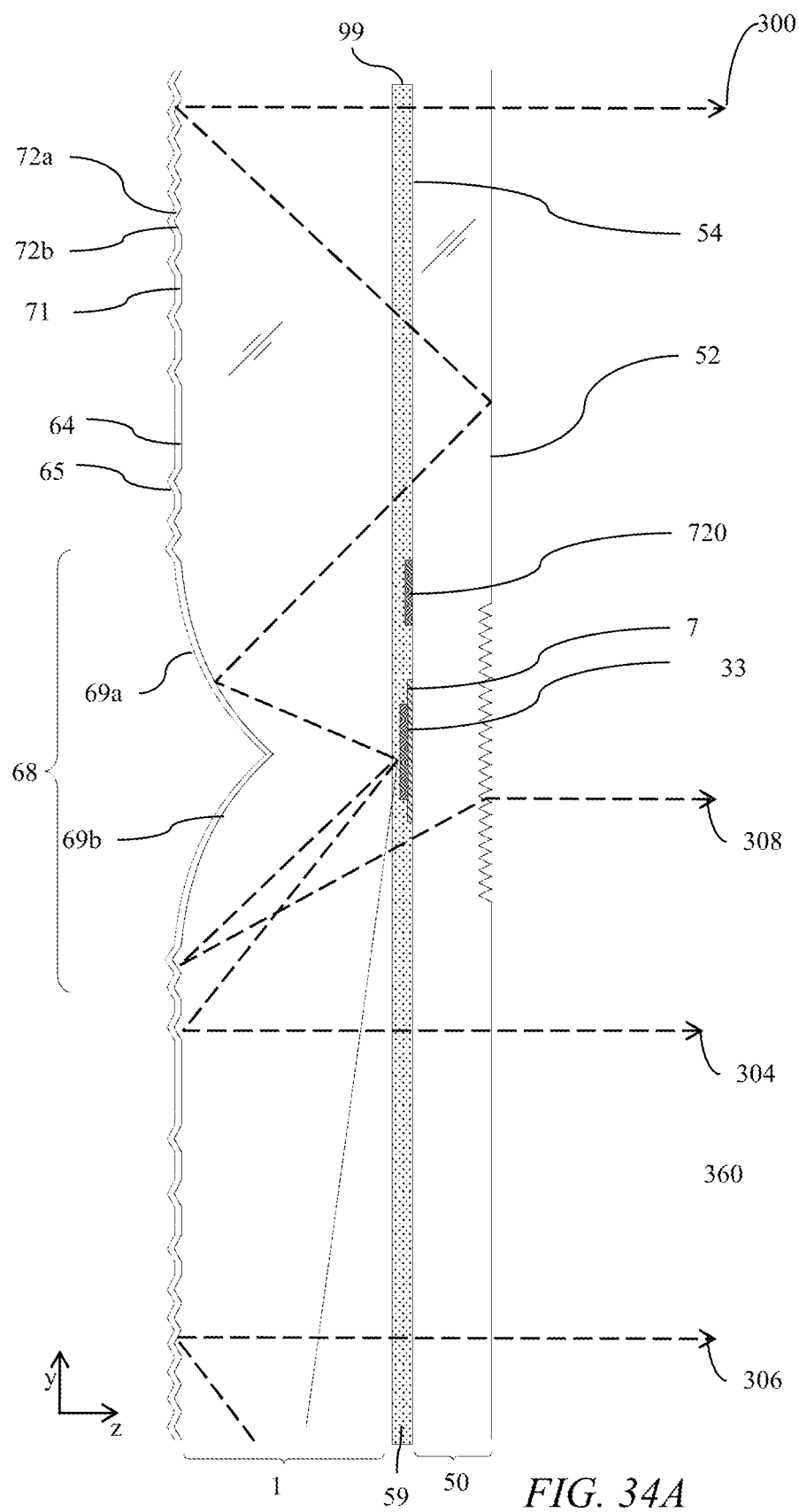
FIG. 34A is a schematic diagram illustrating in top view light rays from a micro-LED and optical element comprising an LED support substrate that is attached to the catadioptric substrate.

FIG. 34A is a schematic diagram illustrating in top view light rays from a micro-LED and optical element 38 comprising a LED support substrate that is attached to the substrate. Transmissive material 59 is provided between the first surface 54 of the transmissive LED support substrate 50 and the transmissive input surface 62. Features of the arrangement of FIG. 34A not discussed in further detail may be assumed to correspond to the features with equivalent reference numerals as discussed above, including any potential variations in the features.

An illumination apparatus 100 for providing illumination over a predetermined area, the illumination apparatus 100 comprises: a transmissive support substrate 50; an array of sub-arrays 33 of light emitting diodes 3A, 3B supported by the transmissive support substrate 50 on the rear side thereof and arrayed across the predetermined area, the light emitting diodes 3A, 3B of each sub-array 33 being formed on a respective monolithic layer 400 of semiconductor material and arranged to output light rearwardly; an array of optical elements 38 arrayed across the predetermined area, rearwardly of the light emitting diodes 3A, 3B, each optical element 38 being aligned with a respective sub-array 33 of light emitting diodes 3A, 3B, and each optical element 38 comprising a rear layer having a transmissive surface 62 and a reflective surface 64 that is arranged rearwardly of the transmissive surface 62 to receive light from the respective sub-array 33 of light emitting diodes 3A, 3B through the transmissive surface 62; and a transmissive material 59 arranged between the transmissive support substrate 50 and the transmissive surfaces 64 of the optical elements 38, wherein the rear layers 62, the transmissive material and the transmissive support substrate 50 have matched refractive indices, and the reflective surface 64 of each optical element 38 comprises: a reflective light input structure 68 arranged to reflect light received from the respective sub-array of light emitting diodes 3A, 3B in directions in which the light reflected thereby is guided within a waveguide 1 formed by the rear layer 64, the transmissive material and the transmissive support substrate 50 by total internal reflection at the front surface of the transmissive support substrate 52; and reflective light extraction facets 72 arranged to reflect light 300 that is guided within the waveguide 1 in directions in which the light reflected thereby is output from the waveguide 1 through the transmissive surface 52.

Light rays from the plurality of light emitting diodes 3A, 3B is guided within the optical array between the reflective surface 64 and the second surface 52 of the transmissive LED support substrate 50. Advantageously such an illumination apparatus 100 may achieve increased robustness to thermal variations and mechanical deformations. Substrate 50 may have desirable chemical, thermal and mechanical properties for manufacture of the array of sub-arrays 33 whereas the waveguide 1 layer may have suitable properties for fabrication of the optical element 38 reflective surface 64.

Figure 34B:
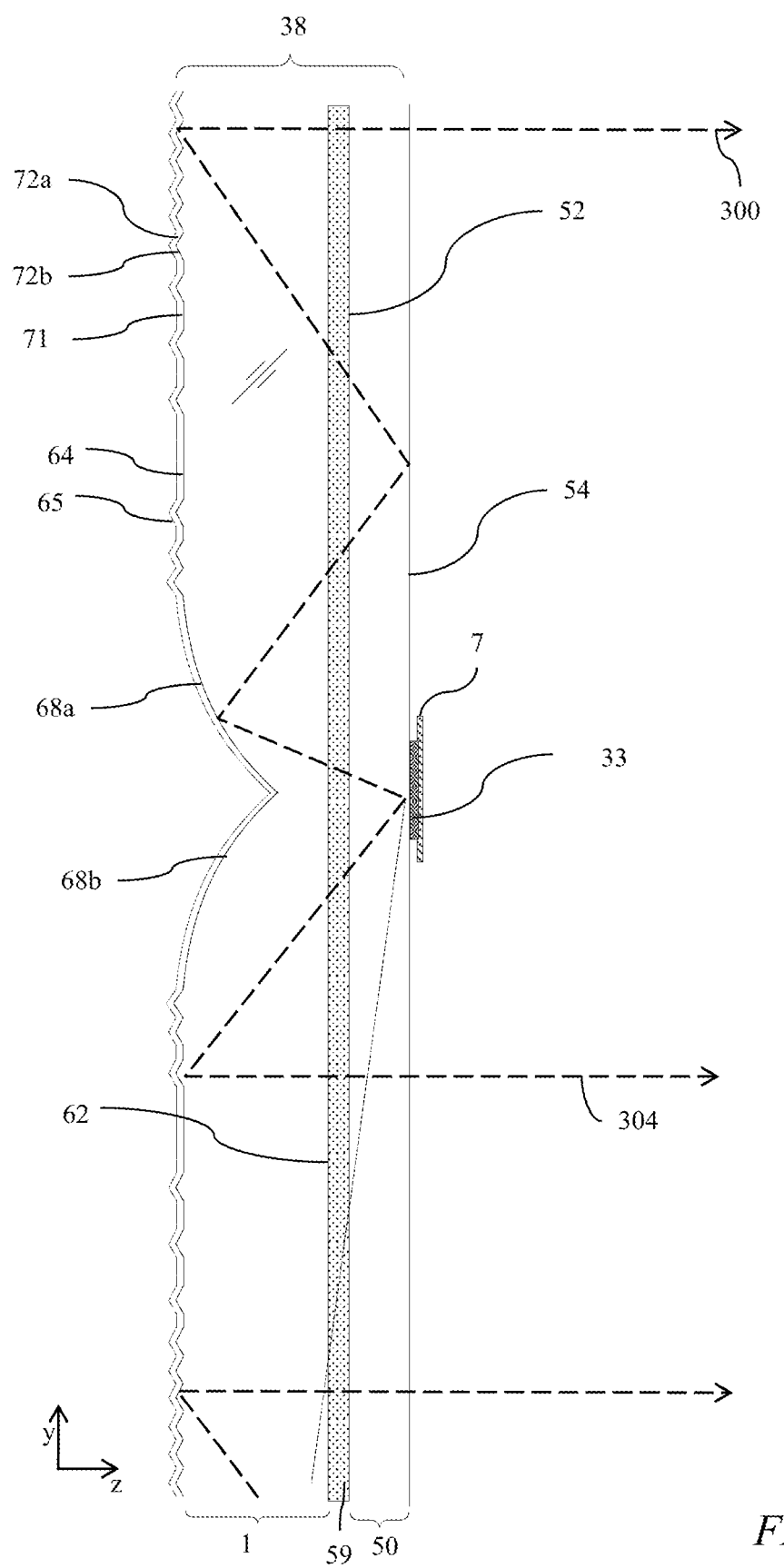
FIG. 34B is a schematic diagram illustrating in top view light rays from a micro-LED and optical element comprising a transmissive LED support substrate wherein the second side of the transmissive substrate is attached to the catadioptric substrate.

FIG. 34B is a schematic diagram illustrating in top view light rays from a sub-array 33 of LEDs 3A, 3B and optical element 38 wherein the rear side 54 of the transmissive support substrate 50 is bonded to the front side 62 of the optical element 38. Features of the arrangement of FIG. 34B not discussed in further detail may be assumed to correspond to the features with equivalent reference numerals as discussed above, including any potential variations in the features.

The LED support substrate 50 is arranged between the sub-array 33 and the reflective surface 64. In comparison to FIG. 34A, the sub-array 33 is arranged to illuminate through transmissive LED support substrate 50 which is bonded to the waveguide 1. Advantageously device thickness may be reduced while achieving guiding rays 300 to increase spatial uniformity. Substrate 50 may have desirable chemical, thermal and mechanical properties for manufacture of the array of sub-arrays 33 whereas the waveguide 1 layer may have suitable properties for fabrication of the optical element 38 reflective surface 64.

It would be desirable to provide a flexible illumination apparatus 100.

Figure 35A:
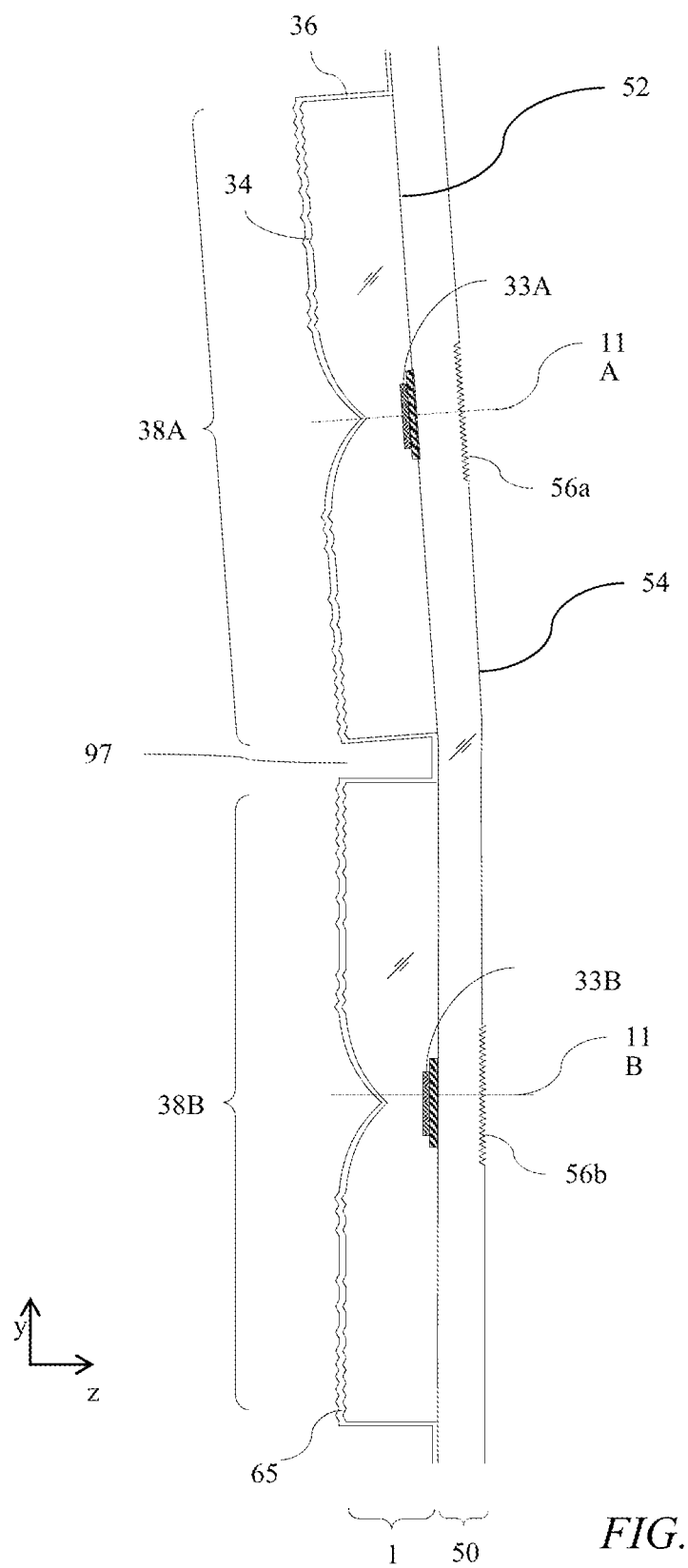
FIG. 35A is a schematic diagram illustrating in top view a catadioptric optical array and plurality of sub-arrays wherein the reflective input structures do not comprise an integrated body.

FIG. 35A is a schematic diagram illustrating in top view an optical element 38 and plurality of sub-arrays 33 wherein the waveguides 1 do not comprise an integrated body. Features of the arrangement of FIG. 35A not discussed in further detail may be assumed to correspond to the features with equivalent reference numerals as discussed above, including any potential variations in the features.

Sub-array 33A is arranged with a first optical element 38A and sub-array 33B is arranged with a second optical element 38B. Each optical element 38A, 38B is separated from adjacent element 38B by gap 97 that is arranged to provide some mechanical deformation region during flexing of the substrates. Reflective coating 65 is arranged to extend over the outer surface of each element 38 including the reflective sides 36 of each optical element 38. In operation, light that is guided within the optical array is reflected from the sides 36. Advantageously increased deformation of the optical elements may be provided to enable the optical array to confirm to a curved shape in at least one dimension.

Further in the embodiment of FIG. 35A, the optical array is illustrated as comprising waveguide 1 formed on the transmissive LED support substrate 50. Advantageously robustness of alignment may be increased.

Figure 35B:
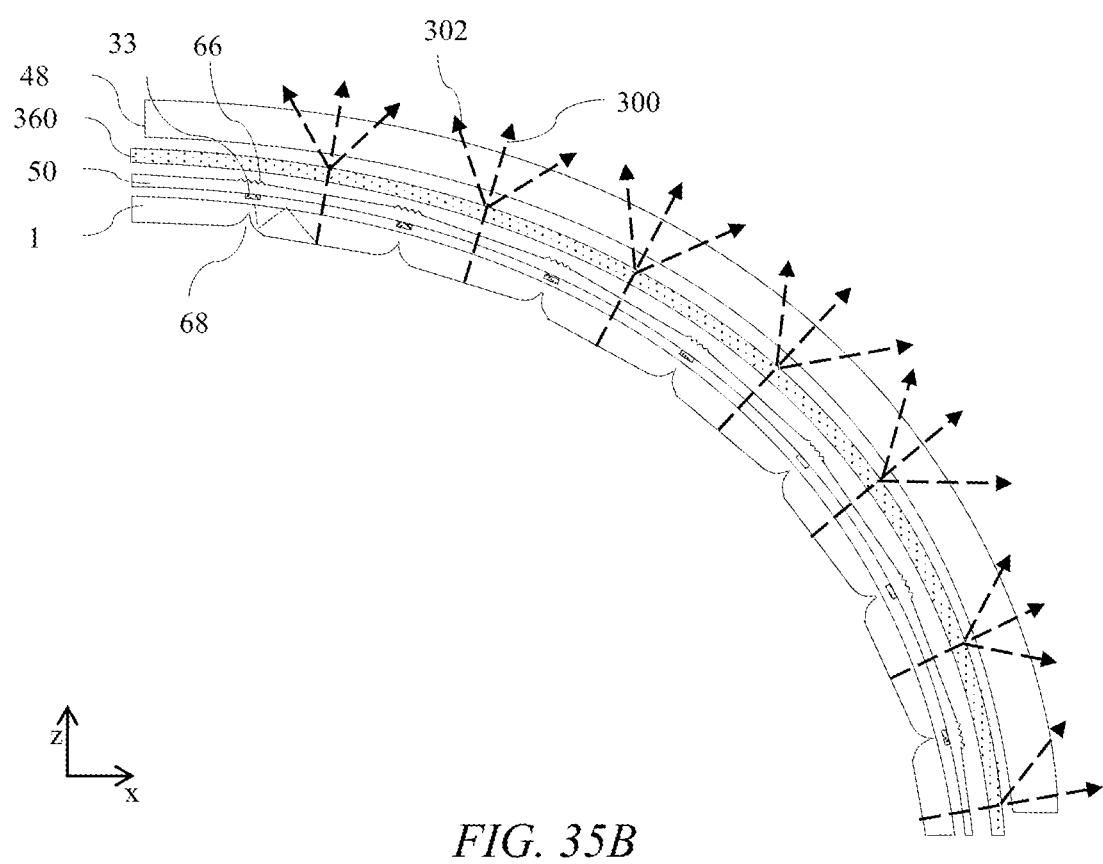
FIG. 35B is a schematic diagram illustrating in top view a curved display comprising a catadioptric backlight and LCD.

FIG. 35B is a schematic diagram illustrating in top view a curved illumination apparatus 100 for a curved spatial light modulator 48 such as an LCD comprising flexible substrates. Features of the arrangement of FIG. 35B not discussed in further detail may be assumed to correspond to the features with equivalent reference numerals as discussed above, including any potential variations in the features.

Light rays 300, 302 that are output from the curved display may have an increased cone angle in comparison to that illustrated elsewhere herein, such that the roll-off of display brightness across the curved display for an observer in a fixed viewing position is reduced. Increased diffusion may be provided by diffuser 360 and diffusing elements in and on substrate 50.

It may be desirable to reduce the complexity of the reflective surface 64.

Figure 36A:
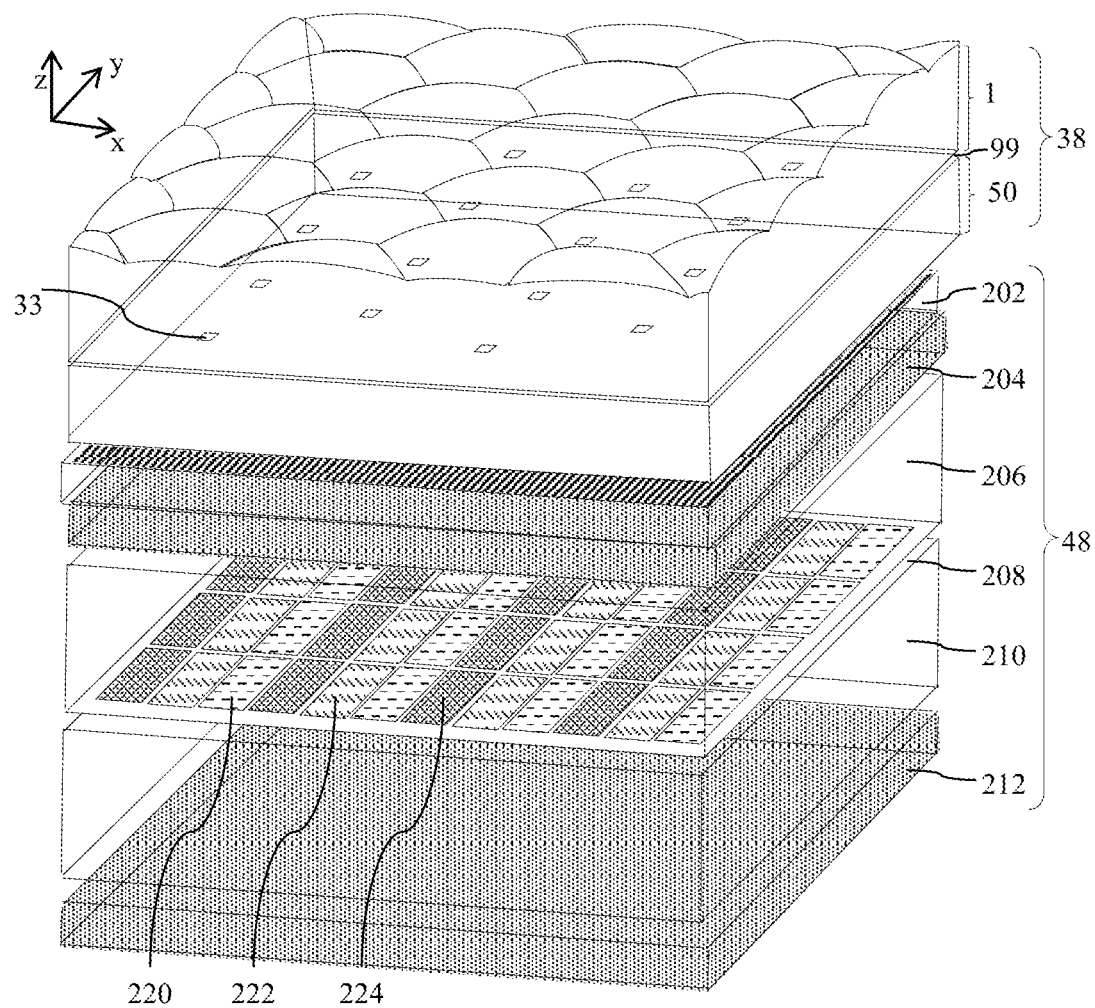
FIG. 36A is a schematic diagram illustrating in side perspective view a display apparatus comprising a backlight comprising a micro-LED and a catadioptric optical element arranged to illuminate an LCD wherein the catadioptric optical element does not comprise regions arranged to provide guiding with the catadioptric optical element.
Figure 36B:
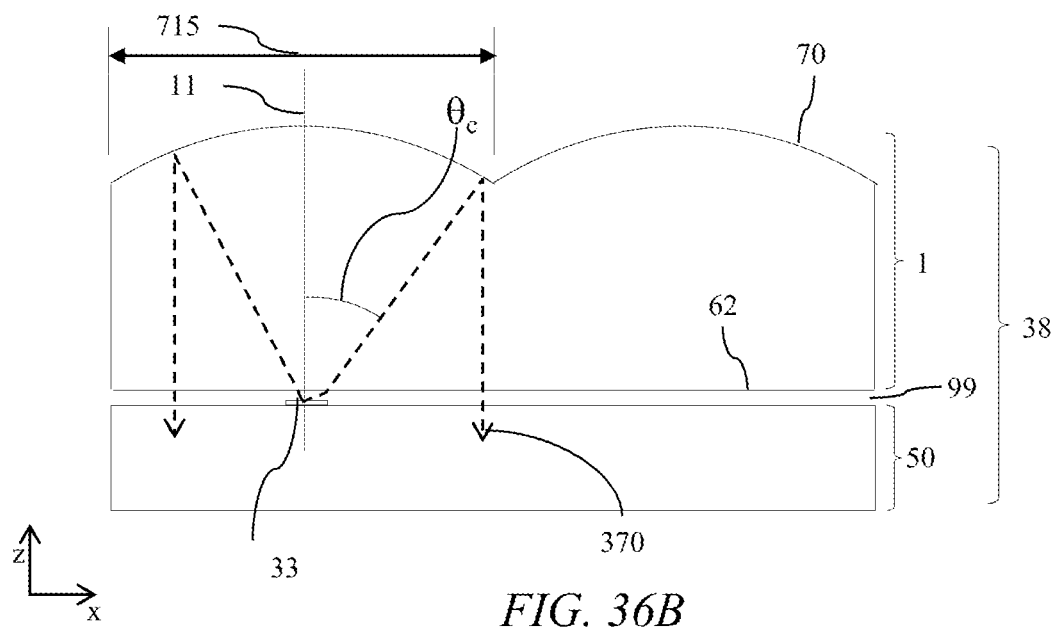
FIG. 36B is a schematic diagram illustrating in side view a catadioptric optical element arranged wherein the catadioptric optical element does not comprise regions arranged to provide guiding with the catadioptric optical element and the sub-arrays are arranged in alignment with the optical axes.
Figure 36C:
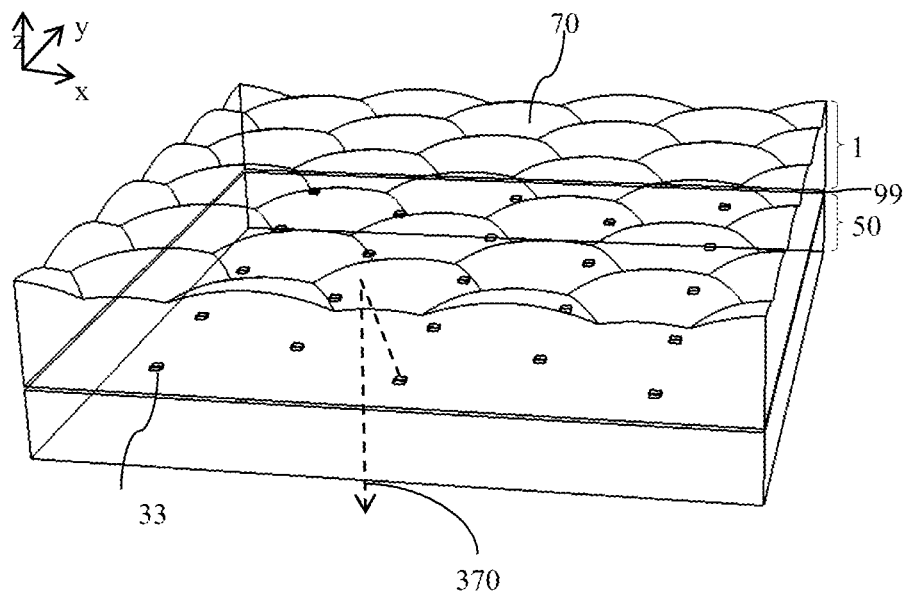
FIG. 36C is a schematic diagram illustrating in side perspective view a two dimensional catadioptric optical element and aligned array of sub-arrays.

FIG. 36A is a schematic diagram illustrating in side perspective view a display apparatus comprising a illumination apparatus 100 comprising a sub-array 33 and an optical element 38 arranged to illuminate an spatial light modulator 48 wherein the reflective surface 64 of the optical element 38 does not comprise regions 71 arranged to provide guiding with the optical element 38; FIG. 36B is a schematic diagram illustrating in side view the optical element 38 of FIG. 36A and the light emitting diodes 3A, 3B are arranged in alignment with the optical axes 11 of the respective aligned optical elements 38; and FIG. 36C is a schematic diagram illustrating in side perspective view a two dimensional optical element and aligned array of sub-arrays 33. Features of the arrangement of FIGS. 36A-C not discussed in further detail may be assumed to correspond to the features with equivalent reference numerals as discussed above, including any potential variations in the features.

In comparison to the arrangement of FIG. 2, the reflective surface 64 has a simpler non-faceted shape so that advantageously light scatter and tooling complexity and cost may be reduced. Further, the aperture width 715 may be arranged to match the luminance output profile of the light injected at the transmissive input surface 62, that is defined by the critical angle $\theta_c$ in the case of the input refractive surface being planar. As illustrated in FIG. 16B, the luminous intensity roll-off at the edge of the reflective aperture is 70% of the peak luminous intensity and desirably a relatively spatially uniform output may be achieved that can be further corrected by means of diffusion in the illumination apparatus 100 apparatus including on diffusers attached to the LCD as illustrated elsewhere herein.

Figure 36D:
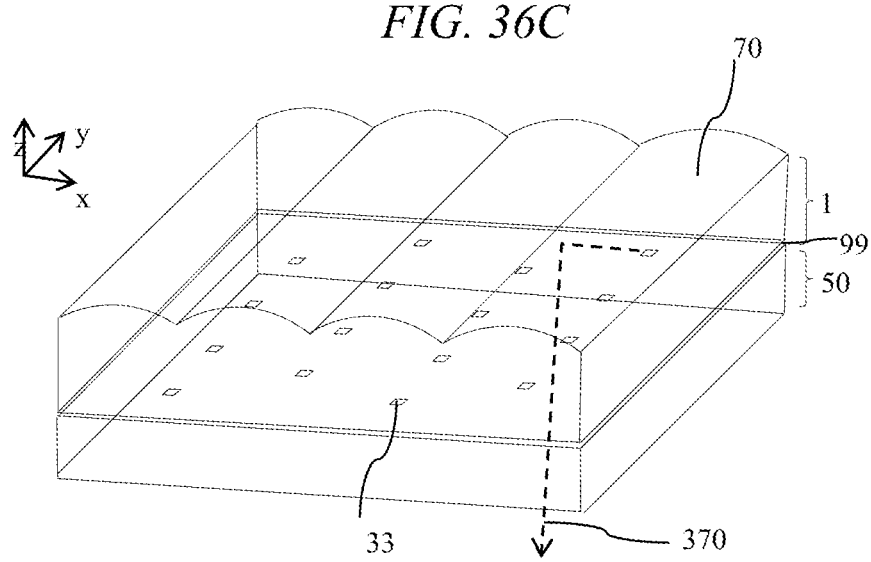
FIG. 36D is a schematic diagram illustrating in side perspective view a one dimensional catadioptric optical element and aligned array of sub-arrays.

FIG. 36D is a schematic diagram illustrating in side perspective view a one dimensional optical element and aligned array of sub-arrays 33. In comparison to the arrangement of FIG. 36C, a one dimensional luminance roll-off may be achieved, advantageously increasing uniformity and viewing freedom for display rotations about the x-axis. Further the complexity of tooling may be further reduced.

Figure 36E:
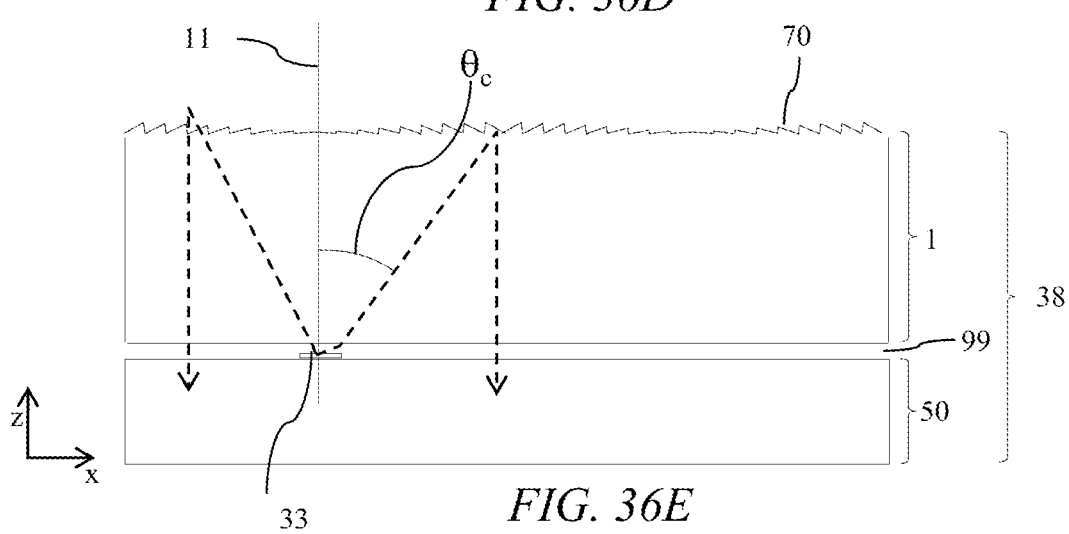
FIG. 36E is a schematic diagram illustrating in side view a catadioptric optical element similar to FIG. 36B wherein the reflective surface is provided by a Fresnel reflector.

FIG. 36E is a schematic diagram illustrating in side view an optical element 38 similar to FIG. 36B wherein the reflective surface 64 is provided by a Fresnel reflector. Advantageously thickness is reduced.

It would be desirable to provide a large size display with precise and uniform alignment of light emitting diodes 3A, 3B to the optical axes of optical elements 38 to achieve uniform output spatial and directional luminous intensity directional distribution. Illustrative methods to manufacture the illumination apparatus of the present embodiments will now be described.

In a first step a monolithic semiconductor wafer 2 may be provided as shown in FIG. 37A which is a schematic diagram illustrating in side perspective view a monolithic LED wafer 2. For example, the monolithic wafer 2 may comprise multiple doped GaN layers and may be formed on a substrate 4 that may be sapphire, silicon carbide or silicon for example.

In a second step a non-monolithic array of sub-arrays 33A, 33B may be extracted from the monolithic wafer 2 as shown in FIG. 37B which is a schematic diagram illustrating in side perspective view extraction of a sparse array of sub-arrays 33 from a monolithic LED wafer 2 to provide LEDs 3A, 3B with separation s1 in the at least first direction.

Figure 38:
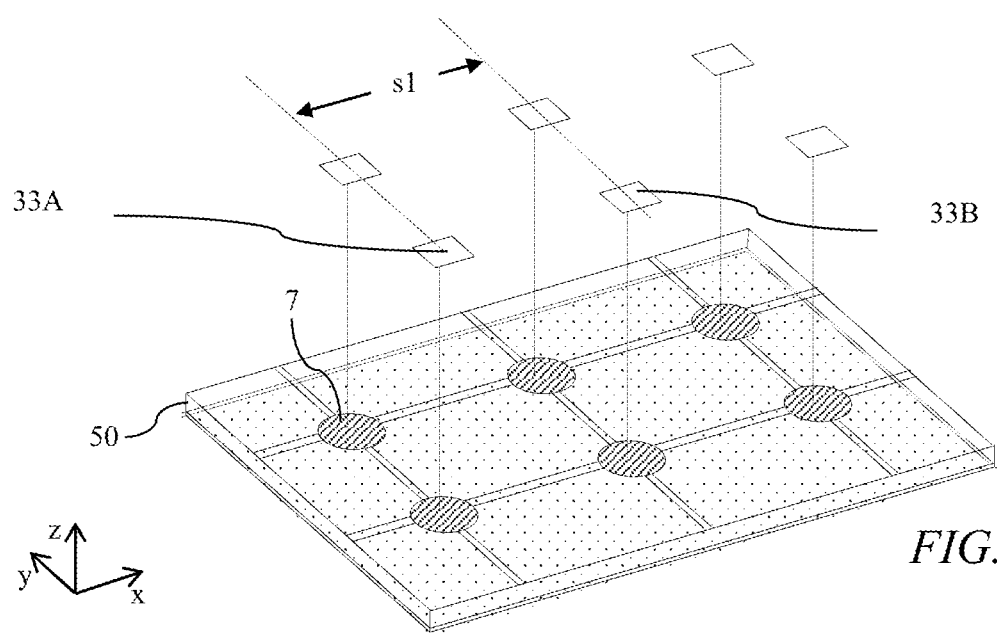
FIG. 38 is a schematic diagram illustrating in side perspective view placement of the sparse array of sub-arrays from a monolithic LED wafer of FIG. 37A onto the LED support substrate.

In a third step the non-monolithic array of sub-arrays 33A, 33B may be transferred onto the transmissive LED support substrate 50 as shown in FIG. 38 which is a schematic diagram illustrating in side perspective view placement of the sparse array of sub-arrays 33A, 33B from a monolithic LED wafer 2 of FIG. 37A onto the LED support substrate 50 comprising electrodes 8 and mask regions 7. Mask regions 7 have the same pitch s1.

Features of the arrangements of FIGS. 37A-B and FIG. 38 not discussed in further detail may be assumed to correspond to the features with equivalent reference numerals as discussed above, including any potential variations in the features.

Sub-arrays 33A, 33B may be arranged on substrate 52 in alignment with electrodes 8. The LED support substrate 50 may already be provided with drive circuit 517 comprising for example TFTs and/or integrated circuits (not shown).

The LEDs of the plurality of LEDs 33A, 33B are thus from a monolithic wafer 2 arranged in an array with their original monolithic wafer positions and orientations relative to each other preserved; and wherein in at least one direction, for at least one pair of the plurality of sub-arrays 33 in the at least one direction, for each respective pair there was at least one respective sub-array 33 in the monolithic wafer 2 that was positioned in the monolithic wafer 2 between the pair of sub-arrays 33 in the at least one direction and that is not positioned between them in the array of sub-arrays 33.

In a fourth step, further layers (not shown) including addressing electrodes, wavelength conversion layers and optical bonding layers may be provided on the sub-arrays 33 and the rear surface 54 of the transmissive LED support substrate 50.

Figure 39:
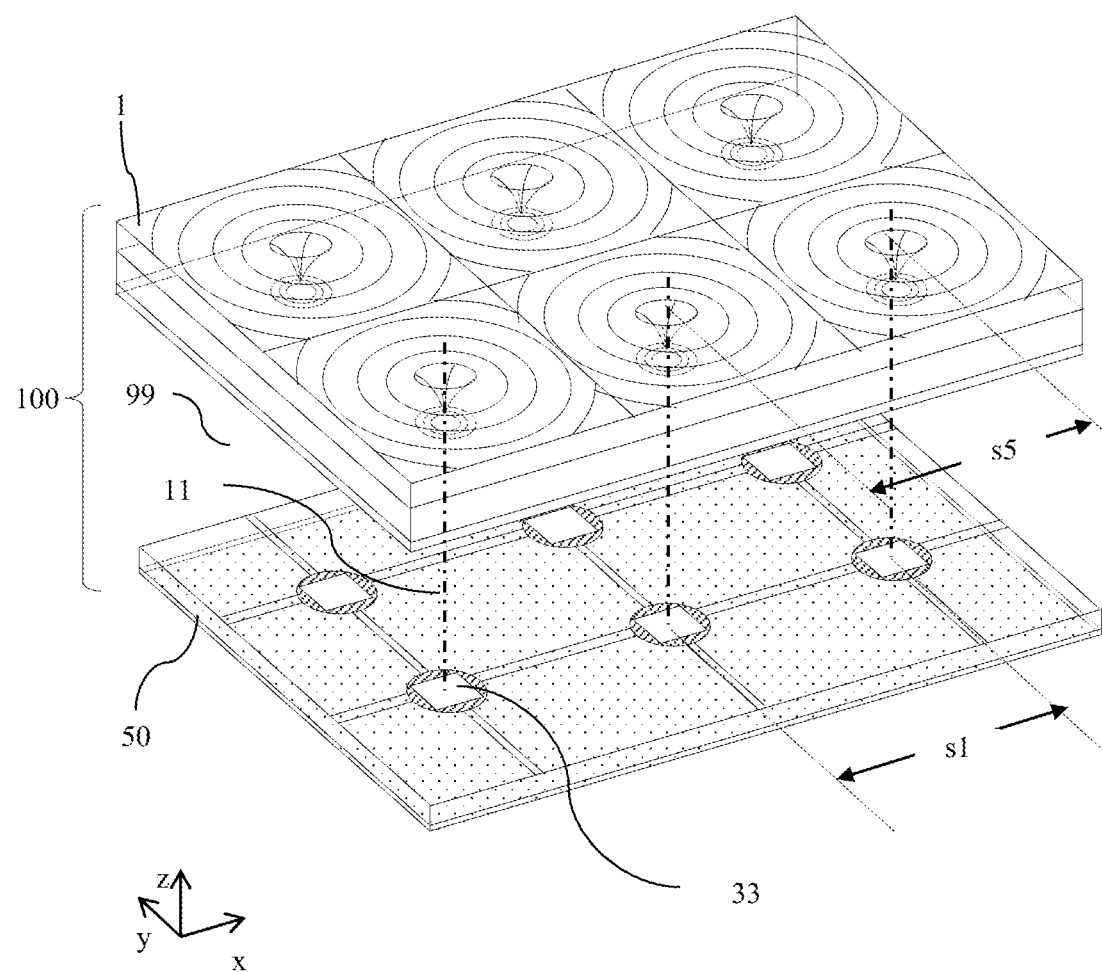
FIG. 39 is a schematic diagram illustrating in side perspective view assembly of a backlight comprising an input substrate and LED support substrate.

In a fifth step an illumination apparatus may be provided as shown in FIG. 39 which is a schematic diagram illustrating in side perspective view assembly of an illumination apparatus 100 comprising a waveguide 1 with optical axis 11 separation s5 and transmissive LED support substrate 50. Features of the arrangement of FIG. 39 not discussed in further detail may be assumed to correspond to the features with equivalent reference numerals as discussed above, including any potential variations in the features.

The substrate 50 may be aligned with the plurality of optical elements 38 with separations s5 to provide an illumination apparatus, such that separation s5 may be the same as separation s1. optical bonding such as optically clear adhesives may be used to provide attachment between the two substrates 50, 60 to advantageously provide increased robustness of alignment, such as in regions 80 as illustrated in FIG. 2. Advantageously large numbers of elements may be formed over large areas using small numbers of extraction steps, while preserving alignment to a respective array of optical elements. Alignment of sub-arrays 33 to catadioptric optical elements is described further in WIPO International Publ. No. WO/2010/038025, which is herein incorporated by reference in its entirety.

Further for the present disclosure, micro-LEDs are unpackaged LED die chips, and are not packaged LEDs. Advantageously individual wire bonding to LEDs is not used and the number of pick and place processes is significantly reduced.

It may be desirable to provide a switchable privacy display.

Figure 40:
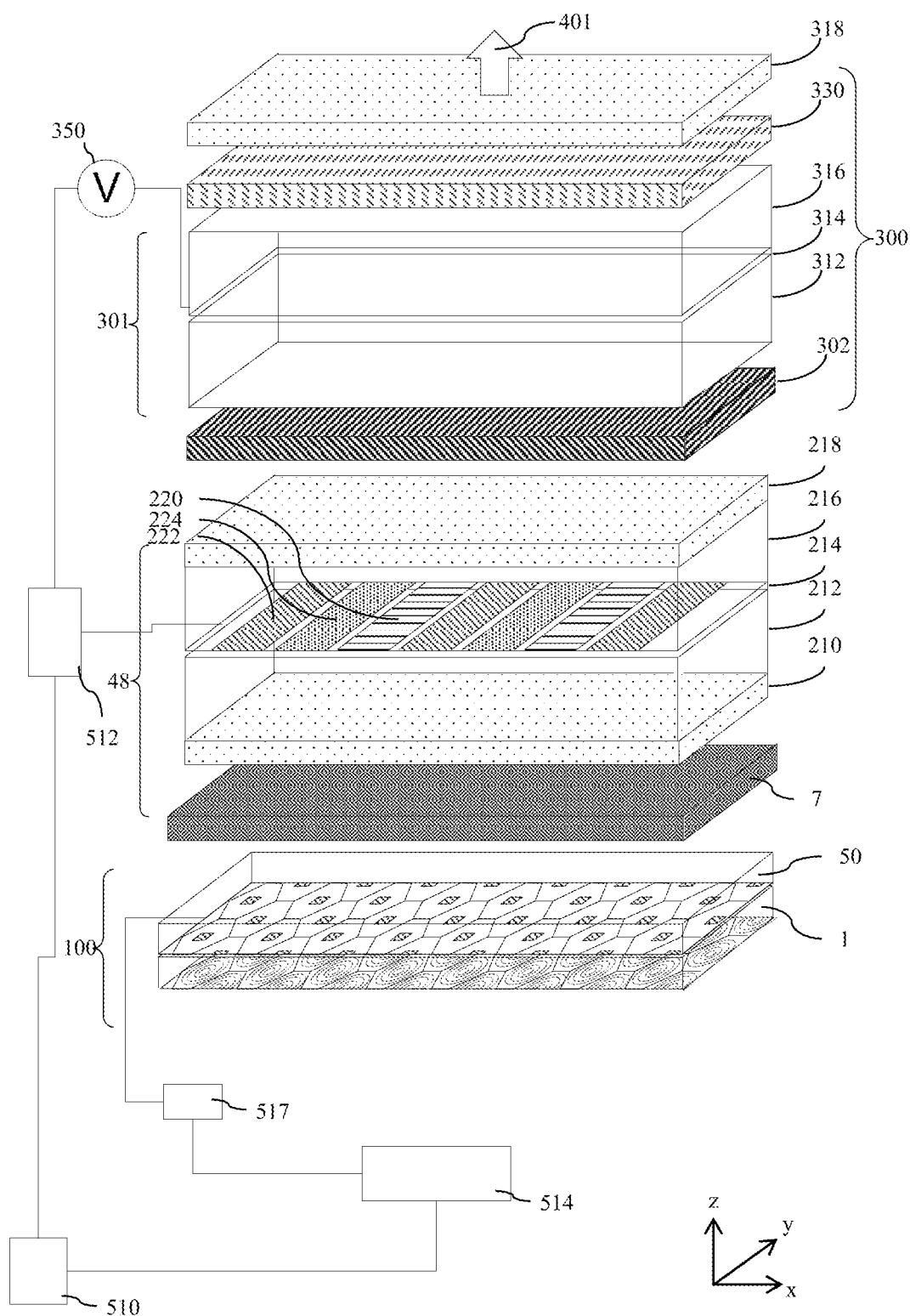
FIG. 40 is a schematic diagram illustrating in side perspective view an optical stack of a high efficiency and high dynamic range privacy display apparatus comprising an array backlight arranged to illuminate a spatial light modulator, a reflective polariser and a polar control retarder arrangement.

FIG. 40 is a schematic diagram illustrating in side perspective view a high efficiency and high dynamic range privacy display comprising an illumination apparatus 100 arranged to illuminate a spatial light modulator 48, a reflective polariser 302 and a polar control retarder arrangement 300. Features of the arrangement of FIG. 40 not discussed in further detail may be assumed to correspond to the features with equivalent reference numerals as discussed above, including any potential variations in the features.

Switchable liquid crystal retarder stack 300 is arranged in series with the illumination apparatus 100 and spatial light modulator 48. Stack 300 comprises a switchable liquid crystal retarder 301 that comprises substrates 312, 316 with transmissive electrodes and alignment layers to provide controllable alignment of a liquid crystal layer 314. Stack 300 further comprises an additional polariser 332 and compensation retarder 330. Various embodiments are described in U.S. Pat. No. 10,126,575, in U.S. Pat. No. 10,303,030, and in U.S. Patent Publ. No. 2020-0159055, all of which are herein incorporated by reference in their entireties.

Switchable liquid crystal retarder stack 300 and spatial light modulator 48 are arranged to receive light transmitted by the light turning element 5. Diffuser 334 may be arranged to provide modification of output cone angle and further to minimise Moiré and mura artefacts.

The control system may further comprise switchable liquid crystal retarder stack 300 controller 312 and liquid crystal cell driver 315 to control the voltage across the liquid crystal retarder 301. Controller 312 is arranged to address voltage driver 350 such that the switchable liquid crystal retarder 301 is driven in a first alignment state when the display operates in a wide angle mode, and in a second alignment state when the display operates in a narrow angle privacy mode.

An illustrative embodiment for polarisation control retarder 300 is given in TABLE 2.

TABLE 2

|  | Passive polar control retarder(s) | | Active LC retarder | | | | |
| --- | --- | --- | --- | --- | --- | --- | --- |
| Mode | Type | Δn.d/nm | Alignment layers | Pretilt/deg | Δn · d/nm | Δε | Voltage/V |
| Public | Crossed A | +500 @ 45° | Homogeneous | 2 | 750 | 13.2 | 10 |
| Privacy |  | +500 @ 135° | Homogeneous | 2 |  |  | 2.3 |

Figure 41A:
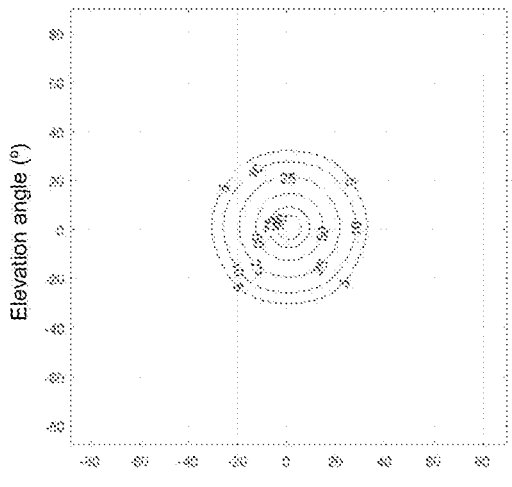
FIG. 41A is a schematic graph of the polar output distribution of luminance for the arrangement of FIG. 1 with illumination from light emitting diodes for a privacy mode of operation.
Figure 41B:
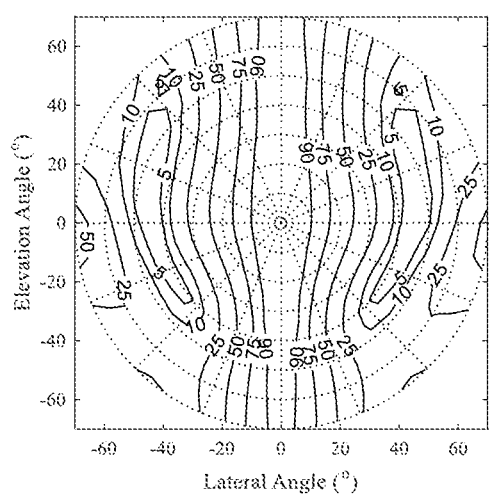
FIG. 41B is a schematic graph of the polar output distribution of transmission for a retarder stack arrangement of FIG. 40 with illustrative retarder stack arrangement of TABLE 2 and with illumination from light emitting diodes.
Figure 41C:
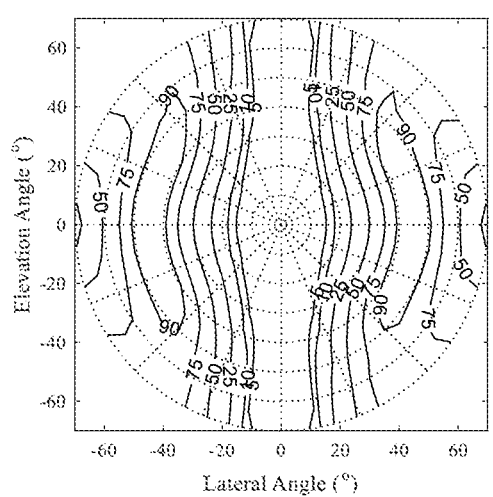
FIG. 41C is a schematic graph of the polar output distribution of reflectivity for a retarder stack arrangement of FIG. 40 with illustrative retarder stack arrangement of TABLE 2 and with illumination from light emitting diodes.

FIG. 41A is a schematic graph of the polar output distribution of luminance for the arrangement of FIG. 1 with illumination from light emitting diodes 3A for a privacy mode of operation; FIG. 41B is a schematic graph of the polar output distribution of transmission for a retarder stack arrangement of FIG. 40 with illustrative retarder stack arrangement of TABLE 2 and with illumination from light emitting diodes 3A; and FIG. 41C is a schematic graph of the polar output distribution of reflectivity for a retarder stack arrangement of FIG. 40 with illustrative retarder stack arrangement of TABLE 2 and with illumination from light emitting diodes 3A.

Figure 42A:
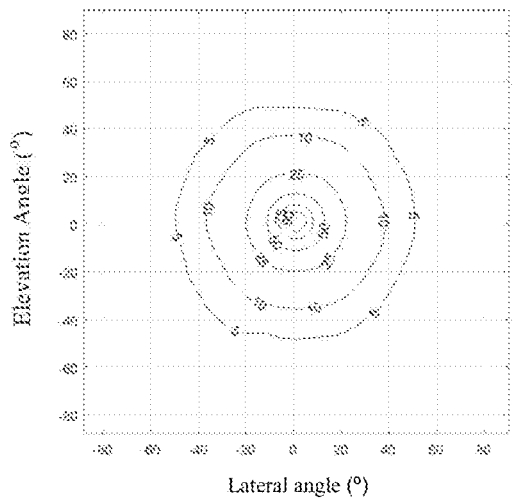
FIG. 42A is a schematic graph of the polar output distribution of luminance for the arrangement of FIG. 1 in series with two 30 degree FWHM output diffusers with illumination from light emitting diodes for a public mode of operation.
Figure 42B:
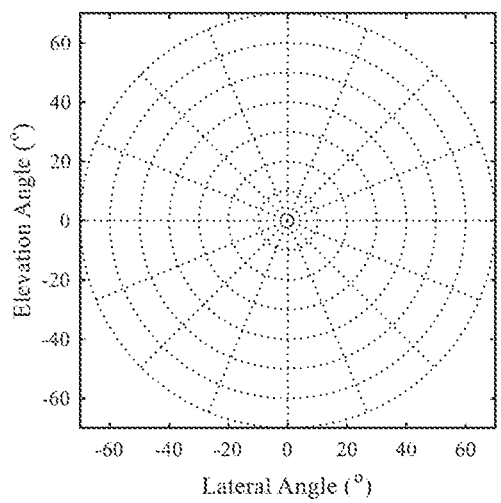
FIG. 42B is a schematic graph of the polar output distribution of transmission for a retarder stack arrangement of FIG. 40 with illustrative retarder stack arrangement of TABLE 2 and with illumination from light emitting diodes.
Figure 42C:
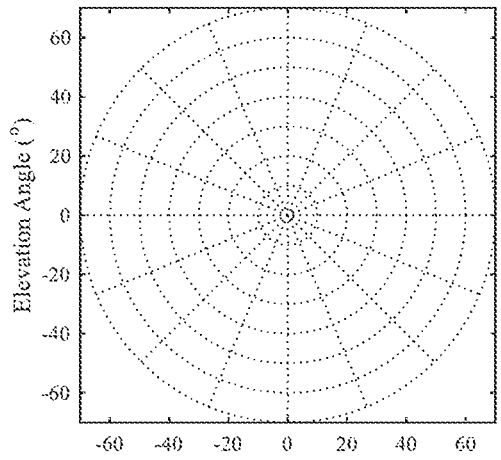
FIG. 42C is a schematic graph of the polar output distribution of reflectivity for a retarder stack arrangement of FIG. 40 with illustrative retarder stack arrangement of TABLE 2 and with illumination from light emitting diodes.

FIG. 42A is a schematic graph of the polar output distribution of luminance for the arrangement of FIG. 1 in series with two 30 degree FWHM output diffusers with illumination from light emitting diodes 3A and 3B for a public mode of operation; FIG. 42B is a schematic graph of the polar output distribution of transmission for a retarder stack arrangement of FIG. 40 with illustrative retarder stack arrangement of TABLE 2 and with illumination from light emitting diodes 3A and 3B; and FIG. 42C is a schematic graph of the polar output distribution of reflectivity for a retarder stack arrangement of FIG. 40 with illustrative retarder stack arrangement of TABLE 2 and with illumination from light emitting diodes 3A and 3B. The polar output distributions shown in FIGS. 42B and 42C are uniform in comparison with the polar output distributions shown in FIGS. 41B and 41C.

Figure 43A:
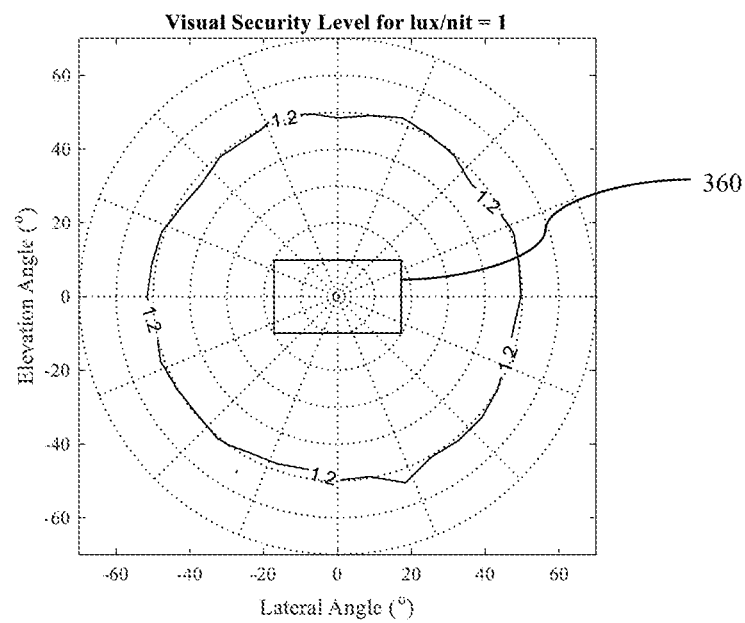
FIG. 43A is a schematic graph of the polar output distribution of Visual Security Level for a retarder stack arrangement of FIG. 40 with illustrative retarder stack arrangement of TABLE 2 and a lux/nit ratio of 1.0 in a public mode of operation.
Figure 43B:
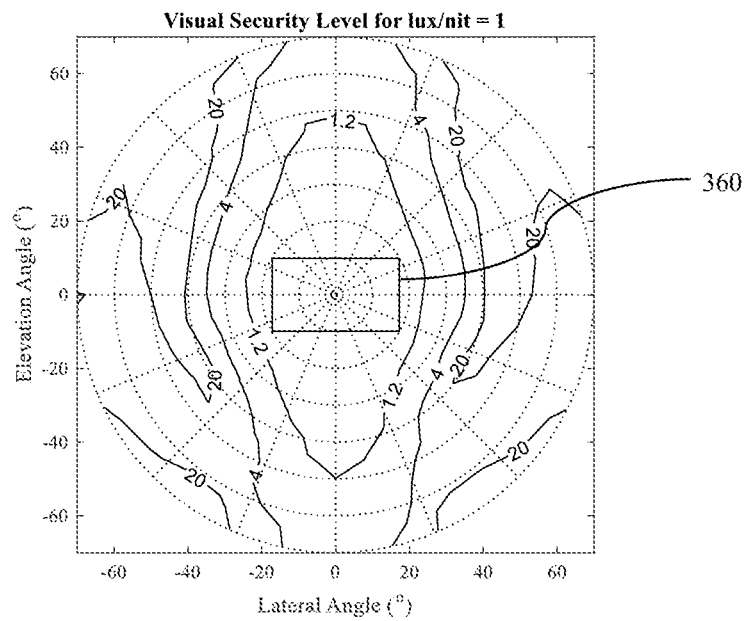
FIG. 43B is a schematic graph of the polar output distribution of Visual Security Level for a retarder stack arrangement of FIG. 40 with illustrative retarder stack arrangement of TABLE 2 and a lux/nit ratio of 1.0 in a privacy mode of operation.

FIG. 43A is a schematic graph of an illustrative polar output distribution of Visual Security Level for a retarder stack arrangement of FIG. 40 with illustrative retarder stack arrangement of TABLE 2 and a lux/nit ratio of 1.0 in a public mode of operation; and FIG. 43B is a schematic graph of an illustrative polar output distribution of Visual Security Level for a retarder stack arrangement of FIG. 40 with illustrative retarder stack arrangement of TABLE 2 and a lux/nit ratio of 1.0 in a privacy mode of operation. Region 360 represents the polar angles seen by a typical head-on user of a 14 inch diagonal 16:9 aspect ratio display viewed from 500 mm. All regions of the image have a VSL of less than 1.2, advantageously achieving high image visibility across the display area for the display user.

FIG. 43A further shows that the display has high image visibility in public mode of operation over a wide polar region while FIG. 43B illustrates high visual security level (VSL>4) over a wide polar region for snoopers.

Advantageously a switchable privacy display with high image visibility to display users and high visual security level to snoopers is provided.

Further, in comparison to arrangements in which the illumination profile incident on to the plural retarders is fixed, the public mode has higher visibility for off-axis users in public mode and/or higher visual security level for off-axis snoopers in privacy mode.

The sub-arrays 33 of the present embodiments achieve enhanced performance of a switchable privacy display with reduced cost, complexity and increased uniformity.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. An illumination apparatus for providing illumination over a predetermined area, the illumination apparatus comprising:

an array of sub-arrays of light emitting diodes arrayed across the predetermined area, the light emitting diodes of each sub-array being formed on a respective monolithic layer of semiconductor material and arranged to output light rearwardly; and an array of optical elements arrayed across the predetermined area, rearwardly of the light emitting diodes, each optical element being aligned with a respective sub-array of light emitting diodes, and each optical element comprising a waveguide having a transmissive surface and a reflective surface that is arranged rearwardly of the transmissive surface to receive light from the respective sub-array of light emitting diodes through the transmissive surface, the reflective surface of each optical element comprising:

a reflective light input structure arranged to reflect light received from the respective sub-array of light emitting diodes in directions in which the light reflected thereby is guided within the waveguide by total internal reflection at the transmissive surface; and reflective light extraction facets arranged to reflect light that is guided within the waveguide in directions in which the light reflected thereby is output from the waveguide through the transmissive surface.

2. An illumination apparatus according to claim 1, wherein the light emitting diodes output light in respective first light output distributions, and the optical elements output light from the waveguide originating from each light emitting diode of the respective sub-array in a respective second light output distribution that has a luminous intensity half maximum solid angle that is smaller than the luminous intensity half maximum solid angle of the respective first light output distribution of the light emitting diode from which the light originates.

3. An illumination apparatus according to claim 2, wherein the ratio of luminous intensity half maximum solid angle of the second light output distribution to the luminous intensity half maximum solid angle of a Lambertian light distribution is less than 1, preferably less than 0.5, more preferably less than 0.25 and most preferably less than 0.1.

4. An illumination apparatus according to claim 1, wherein each sub-array of light emitting diodes comprises electrodes arranged to provide independent addressing of at least two of the light emitting diodes of the sub-array.

5. An illumination apparatus according to claim 1, wherein each optical element has mirror symmetry about an optical axis in at least one cross-sectional plane.

6. An illumination apparatus according to claim 5, wherein the reflective surface of each optical element has mirror symmetry about an optical axis in all cross-sectional planes around the optical axis.

7. An illumination apparatus according to claim 5, wherein the light emitting diodes of each sub-array include a first light emitting diode on the optical axis of the optical element that is aligned thereto and at least one further light emitting diode offset from the optical axis of the optical element that is aligned thereto.

8. An illumination apparatus according to claim 5, wherein in said at least one cross-sectional plane the reflective light input structure comprises a first and second inclined reflective surface facing outwardly of the optical axis.

9. An illumination apparatus according to claim 8, wherein the first and second inclined reflective surfaces are curved.

10. An illumination apparatus according to claim 5, wherein in the at least one cross-sectional plane the reflective light extraction facets comprise plural pairs of inclined facets facing the optical axis.

11. An illumination apparatus according to claim 9, wherein the reflective planar regions and the reflective light extraction facets have a stepped structure.

12. An illumination apparatus according to claim 5, wherein the reflective surface comprises reflective planar regions between the reflective light extraction facets.

13. An illumination apparatus according to claim 5, wherein in the at least one cross-sectional plane the reflective light extraction facets have a separation that decreases with distance from the optical axis of the optical element.

14. An illumination apparatus according to claim 5, wherein the reflective light extraction facets have lengths that increase with distance from the optical axis of the respective optical element.

15. An illumination apparatus according to claim 5, wherein the reflective light extraction facets have total areas that increase with the distance from the optical axis of the respective optical element.

16. An illumination apparatus according to claim 15, wherein the reflective light extraction facets have total areas that increase in proportion with the distance from the optical axis of the respective optical element.

17. An illumination apparatus according to claim 1, wherein some of the reflective light extraction facets are arranged to direct light that has not guided within the optical element.

18. An illumination apparatus according to claim 1, wherein the transmissive surface of each optical element is planar.

19. An illumination apparatus according to claim 1, wherein the transmissive surface of each optical element further comprises a refractive light input structure formed in the transmissive surface of the waveguide and aligned with the respective sub-array of light emitting diodes so that the light emitted thereby passes through the refractive light input structure.

20. An illumination apparatus according to claim 19, wherein each optical element has mirror symmetry about an optical axis in at least one cross-sectional plane.

21. An illumination apparatus according to claim 20, wherein in the at least one cross-sectional plane the refractive light input structure comprises a plurality of pairs of oppositely inclined refractive input facets.

22. An illumination apparatus according to claim 19, wherein the transmissive surface of the input substrate comprises planar regions between the refractive light input structures.

23. An illumination apparatus according to claim 1, further comprising a transmissive support substrate, the light emitting diodes being supported by the transmissive support substrate on the rear side thereof.

24. An illumination apparatus according to claim 23, wherein a transmissive material with a lower refractive index than a material of the waveguide is arranged between the transmissive support substrate and the transmissive surfaces of the optical elements.

25. An illumination apparatus according to claim 24, wherein the transmissive material is air.

26. An illumination apparatus according to claim 23, wherein each optical element further comprises a refractive light output structure formed in a front surface of the transmissive support substrate in front of the respective sub-array of light emitting diodes.

27. An illumination apparatus according to claim 26, wherein some of the reflective light extraction facets of each optical element are arranged to direct light to the refractive light output structure of the optical element.

28. An illumination apparatus according to claim 26, wherein each optical element has mirror symmetry about an optical axis in at least one cross-sectional plane.

29. An illumination apparatus according to claim 28, wherein in the at least one cross-sectional plane the refractive light output structure comprises a concave refractive surface arranged to provide negative optical power.

30. An illumination apparatus according to claim 1, wherein in the at least one cross-sectional plane the refractive light output structure comprises a plurality of pairs of oppositely inclined transmissive light deflecting facets.

31. An illumination apparatus according to claim 1, further comprising diffuser structures arranged on at least one surface of the transmissive support substrate.

32. An illumination apparatus according to claim 26, wherein the angular light output distribution of light passing through the refractive light output structure is substantially the same as the angular light output distribution of light passing through regions of the transmissive support substrate that do not comprise a refractive light output structure.

33. An illumination apparatus according to claim 23, further comprising mask regions provided between each sub-array of light emitting diodes and the transmissive support substrate.

34. An illumination apparatus according to claim 33, wherein each mask region comprises electrodes connected to the light emitting diodes of the sub-array.

35. An illumination apparatus according to claim 1, wherein the reflective surface of the optical element has a reflective layer formed thereon.

36. An illumination apparatus according to claim 35, wherein the reflective layer comprises a metal material.

37. An illumination apparatus according to claim 1, wherein the waveguides of each optical element are formed as an integrated body.

38. An illumination apparatus according to claim 1, wherein the light emitting diodes have a maximum width of at most 300 micrometres, preferably at most 200 micrometres and more preferably at most 100 micrometres.

39. An illumination apparatus according to claim 1, wherein in the at least one cross-sectional plane the distance between the transmissive output surface and reflective surface is less than 1000 micrometres, preferably less than 500 micrometres and more preferably less than 250 micrometres.

40. An illumination apparatus according to claim 1, wherein the semiconductor material of the monolithic layers of the sub-arrays of light emitting diodes is n-type.

41. An illumination apparatus according to claim 40, wherein each sub-array further comprises a patterned layer of semiconductor material of opposite type from the monolithic layer.

42. An illumination apparatus according to claim 41, wherein each sub-array further comprises patterned electrodes formed on the patterned layer.

43. An illumination apparatus according to claim 1, further comprising a control system arranged to control the output of light from the light emitting diodes.

44. A display apparatus comprising:
an illumination apparatus according to claim 1; and
a transmissive spatial light modulator illuminated by the illumination apparatus.

45. An illumination apparatus for providing illumination over a predetermined area, the illumination apparatus comprising:
a transmissive support substrate;
an array of sub-arrays of light emitting diodes supported by the transmissive support substrate on the rear side thereof and arrayed across the predetermined area, the light emitting diodes of each sub-array being formed on a respective monolithic layer of semiconductor material and arranged to output light rearwardly;
an array of optical elements arrayed across the predetermined area, rearwardly of the light emitting diodes, each optical element being aligned with a respective sub-array of light emitting diodes, and each optical element comprising a rear layer having a transmissive surface and a reflective surface that is arranged rearwardly of the transmissive surface to receive light from the respective sub-array of light emitting diodes through the transmissive surface; and
a transmissive material arranged between the transmissive support substrate and the transmissive surfaces of the optical elements,
wherein
the rear layers, the transmissive material and the transmissive support substrate have matched refractive indices, and
the reflective surface of each optical element comprises:
a reflective light input structure arranged to reflect light received from the respective sub-array of light emitting diodes in directions in which the light reflected thereby is guided within a waveguide formed by the rear layer, the transmissive material and the transmissive support substrate by total internal reflection at the front surface of the transmissive support substrate; and
reflective light extraction facets arranged to reflect light that is guided within the waveguide in directions in which the light reflected thereby is output from the waveguide through the transmissive surface.

* * * * *